(12) United States Patent
Lu

(10) Patent No.: US 11,855,218 B2
(45) Date of Patent: Dec. 26, 2023

(54) TRANSISTOR STRUCTURE WITH METAL INTERCONNECTION DIRECTLY CONNECTING GATE AND DRAIN/SOURCE REGIONS

(71) Applicants: Etron Technology, Inc., Hsinchu (TW); Invention And Collaboration Laboratory Pte. Ltd., Singapore (SG)

(72) Inventor: Chao-Chun Lu, Taipei (TW)

(73) Assignees: Etron Technology, Inc., Hsinchu (TW); Invention And Collaboration Laboratory Pte. Ltd., Singapore (SG)

( * ) Notice: Subject to any disclaimer, the term of this patent is extended or adjusted under 35 U.S.C. 154(b) by 0 days.

(21) Appl. No.: 17/468,683

(22) Filed: Sep. 8, 2021

(65) Prior Publication Data

US 2022/0077315 A1    Mar. 10, 2022

Related U.S. Application Data

(60) Provisional application No. 63/075,841, filed on Sep. 9, 2020.

(51) Int. Cl.
*H01L 29/76* (2006.01)
*H01L 29/94* (2006.01)
(Continued)

(52) U.S. Cl.
CPC ...... *H01L 29/7851* (2013.01); *H01L 27/0886* (2013.01); *H01L 29/0649* (2013.01); *H01L 29/1033* (2013.01)

(58) Field of Classification Search
CPC ............. H01L 29/7851; H01L 27/0886; H01L 29/0649; H01L 29/1033; H01L 21/823475; H01L 27/0207; H01L 21/823431; H01L 21/823481; H01L 29/41791; H01L 29/66795; H01L 29/785; H01L 23/481; H01L 21/31144; H01L 21/76802; H01L 21/76877; H01L 21/823437; H10B 10/12
(Continued)

(56) References Cited

U.S. PATENT DOCUMENTS 6,187,619 B1   2/2001  Wu
2001/0050395 A1  12/2001  Esaki
(Continued)

FOREIGN PATENT DOCUMENTS

EP    1 296 366 A2   3/2003
EP    1 296 366 A3   12/2004
(Continued)

*Primary Examiner* — Theresa T Doan
(74) *Attorney, Agent, or Firm* — Winston Hsu

(57) ABSTRACT

A transistor structure includes a semiconductor substrate, a gate structure, a channel region, and a first conductive region. The semiconductor substrate has a semiconductor surface. The gate structure is above the semiconductor surface, and a first concave is formed to reveal the gate structure. The channel region is under the semiconductor surface. The first conductive region is electrically coupled to the channel region, and a second concave is formed to reveal the first conductive region. A mask pattern in a photolithography process is used to define the first concave, and the mask pattern only defines one dimension length of the first concave.

10 Claims, 64 Drawing Sheets

(51) Int. Cl.
  *H01L 29/78*   (2006.01)
  *H01L 27/088*  (2006.01)
  *H01L 29/06*   (2006.01)
  *H01L 29/10*   (2006.01)

(58) Field of Classification Search
  USPC .................................................. 257/288
  See application file for complete search history.

(56) References Cited

U.S. PATENT DOCUMENTS

| | | |
|---|---|---|
| 2007/0228457 A1 | 10/2007 | Mori |
| 2009/0302392 A1 | 12/2009 | Slesazeck |
| 2011/0159654 A1 | 6/2011 | Kronholz |
| 2014/0077300 A1 | 3/2014 | Noel |
| 2015/0108651 A1 | 4/2015 | Chen |
| 2016/0181399 A1 | 6/2016 | Jun |
| 2016/0268392 A1 | 9/2016 | Zhu |
| 2017/0162574 A1 | 6/2017 | Kim |
| 2018/0061824 A1 | 3/2018 | Li |
| 2018/0277542 A1 | 9/2018 | Liaw |
| 2018/0350809 A1* | 12/2018 | Cheng ................ H01L 29/0847 |
| 2018/0366329 A1 | 12/2018 | Kim |
| 2019/0123162 A1 | 4/2019 | Xie |
| 2019/0172752 A1 | 6/2019 | Hsu |
| 2019/0304976 A1 | 10/2019 | Zhu |
| 2019/0371724 A1 | 12/2019 | Jun |
| 2019/0371933 A1 | 12/2019 | Chen |
| 2020/0126983 A1 | 4/2020 | Cheng |
| 2020/0266271 A1 | 8/2020 | Lin |
| 2020/0312980 A1 | 10/2020 | Frougier |
| 2021/0036121 A1 | 2/2021 | Lim |
| 2022/0301939 A1 | 9/2022 | Kim |
| 2022/0336268 A1 | 10/2022 | Wang |

FOREIGN PATENT DOCUMENTS

| | | |
|---|---|---|
| JP | 9-55479 A | 2/1997 |
| JP | 2000-294776 A | 10/2000 |
| JP | 2001-102443 A | 4/2001 |
| JP | 2003-297951 A | 10/2003 |
| JP | 2009-4800 A | 1/2009 |
| KR | 10-2016-0074122 A | 6/2016 |
| KR | 10-2016-0133706 A | 11/2016 |
| KR | 10-2017-0121667 A | 11/2017 |
| KR | 10-2018-0060952 A | 6/2018 |
| KR | 10-2018-0137861 A | 12/2018 |
| KR | 10-2019-0064376 A | 6/2019 |
| KR | 10-2019-0138012 A | 12/2019 |
| TW | 202117877 A | 5/2021 |

* cited by examiner (a)

(b)

Along X direction (a)

Top view (b)

TRANSISTOR STRUCTURE WITH METAL INTERCONNECTION DIRECTLY CONNECTING GATE AND DRAIN/SOURCE REGIONS

CROSS REFERENCE TO RELATED APPLICATIONS

This application claims the benefit of U.S. Provisional Application No. 63/075,841, filed on Sep. 9, 2020 and entitled "MOSFET Structure with First Metal Interconnections Directly Connecting Gate and Drain/Source Regions through Self-Aligned Miniaturized Contacts without Using A Conventional Contact-Hole Mask", the contents of which are incorporated herein by reference.

BACKGROUND OF THE INVENTION

1. Field of the Invention

The present invention relates to a transistor structure, and particularly to a transistor structure which can have precisely controlled lengths of source/drain regions and contact-opening to effectively shrink a size of the transistor structure.

2. Description of the Prior Art

Since design guidelines of scaling down all dimensions of a metal-oxide-semiconductor field-effect transistor (MOSFET) have been disclosed in the paper published by R. Dennard, et al. in 1974, how to shrink a size of a transistor is a major technology demand which has reduced the minimum physical feature size on a linear dimension of a silicon wafer.

Please refer to FIG. 1A~FIG. 1C regarding the conventional FinFET transistor structure. FIG. 1A shows the conventional FinFET top view structure. FIG. 1B shows the cross section view based on cutline 1 in FIG. 1A, and FIG. 1C shows the cross section view based on cutline 2 in FIG. 1A. As shown in FIG. 1B, the source and drain of conventional FinFET transistor are connected to the Metal-0 Active Area (M0_AA) layer. On the top of the Metal-0 Active Area (M0_AA) layer there are contact-holes (CT) which are fully filled with conductive material, such as metal. In FIG. 1C, the gate of FinFET is connected to the Metal-0 gate (M0_gate) layer. Those Metal-0 gate (M0_gate) layer will be connected to other contact-holes.

Nowadays, the silicon technology especially the MOSFET is being scaled down fast from 28 nm to 3 nm (in research and design), but how to scale down the MOSFET needs to depend on sophisticated technologies such as using very expensive lithography equipments (e.g. extreme ultraviolet lithography (EUV), deep ultraviolet lithography (DUV), etc.), multiple expensive masks, complicated etching technologies, exhausted contact-hole opening, metallization technologies, etc. Especially, for conventional contact hole mask used in the semiconductor manufacture process, there are lots of contact mask patterns each of which is rectangle-like or square-like shape, and those contact mask patterns will be reproduced based on photolithographic process to define the two dimension lengths of the contact hole openings for connecting to the gate/drain/source of the transistor. As the shrink of the minimum feature size or technology process node to some nanometer scale, those expensive EUV equipment, complicated etching technologies, exhausted contact-hole openings of the contact mask and extreme tight design rules are required to avoid or to accommodate the misalignments between those contact holes and the gate/drain/source of the transistor. Therefore, the manufacture cost of those transistors are dramatically increased and the area size of those transistors could not be shrunk proportionally when the minimum feature size or the technology process node is shrunk.

Therefore, how to effectively scale down a size of the MOSFET to integrate more MOSFETs within a planar area of the silicon wafer has become an important issue for a designer of the MOSFET.

SUMMARY OF THE INVENTION

An embodiment of the present invention provides a transistor structure. It provides a new method to form the contact holes corresponding to the gate, source or drain of the MOSFET transistor. The present invention can reduce the photolithography process sensitivity and the misalignment issue between the contact hole and the gate/source/drain regions. Furthermore, the present invention provides one dimensional mask pattern (such as, stripe shape) to reduce the misalignment issue derived from two dimensional mask patterns for small contact hole openings, and also reduce both the light diffraction effect and less photons into small contact-hole problem of the traditional process flow. The transistor structure includes a semiconductor substrate, agate structure, a channel region, and a first conductive region. The semiconductor substrate has a semiconductor surface. The gate structure is above the semiconductor surface, and a first concave is formed to reveal the gate structure. The channel region is under the semiconductor surface. The first conductive region is electrically coupled to the channel region, and a second concave is formed to reveal the first conductive region. Moreover, a mask pattern in a photolithography process is used to define the first concave, and the mask pattern only defines one dimension length of the first concave.

According to one aspect of the present invention, the first concave is surrounded by a first dielectric layer and the second concave is surrounded by a second dielectric layer.

According to another aspect of the present invention, the first dielectric layer and the second dielectric layer are simultaneously formed by an oxide deposition process.

According to another aspect of the present invention, a length of the first concave or the second concave is smaller than a minimum feature size.

According to another aspect of the present invention, a vertical length of the first concave is the same or substantially the same as a horizontal length of the second concave.

According to another aspect of the present invention, the transistor structure further includes a first isolation region next to the first conductive region; wherein a length of the first conductive region between the gate structure and the first isolation is controlled by a single photolithography process which is originally configured to define the length of the gate structure.

Another embodiment of the present invention provides a transistor structure. The transistor structure includes a semiconductor substrate, a gate structure, a channel region, and a first conductive region. The semiconductor substrate has a semiconductor surface. The gate structure has a length, and a first concave is positioned above the gate structure. The channel region is under the semiconductor surface. The first conductive region is electrically coupled to the channel region, and a second concave is positioned above the first conductive region. Moreover, a mask pattern in a photolithography process is used to define the first concave, and a shape of the mask pattern is different from a shape of the first concave.

According to another aspect of the present invention, the shape of the mask pattern is a stripe-like shape, and the shape of the first concave is a rectangle-like or square-like shape.

According to another aspect of the present invention, the first conductive region includes a highly doped region abutting to the semiconductor substrate and a core metal column abutting to the highly doped region.

According to another aspect of the present invention, the core metal column abuts to the semiconductor substrate, and the highly doped region is electrically coupled to a voltage source through the semiconductor substrate.

Another embodiment of the present invention provides a semiconductor substrate, a plurality of fin structures, and a gate structure. The plurality of fin structures is formed from the semiconductor substrate, wherein each fin structure includes a channel region and a first conductive region coupled to the channel region. The gate structure is across each fin structure of the plurality of fin structures; wherein a first concave is formed to reveal the gate structure, and a second concave is formed to reveal the first conductive region of one fin structure. Moreover, the first conductive region of each fin structure is physically separated from each other.

According to another aspect of the present invention, a vertical length of the first concave is the same or substantially the same as a horizontal length of the second concave.

According to another aspect of the present invention, the transistor structure further includes a metal connection layer formed to fill the first concave and to fill in the second concave.

According to another aspect of the present invention, a third concave is formed to reveal the first conductive region of another fin structure, the metal connection layer fills in the third concave and at least extends from the second concave to the third concave.

According to another aspect of the present invention, a horizontal length of the first conductive region is the same or substantially the same as a horizontal length of the metal connection layer.

According to another aspect of the present invention, the horizontal length of the first conductive region is the same or substantially the same as a minimum feature size.

Another embodiment of the present invention provides a semiconductor substrate, a gate structure, a channel region, a first conductive region, and a metal connection layer. The semiconductor substrate has a semiconductor surface. The gate structure is above the semiconductor surface, and a first concave formed to reveal the gate structure. The channel region is under the semiconductor surface. The first conductive region is electrically coupled to the channel region, and a second concave is formed to reveal the first conductive region. The metal connection layer is formed to fill the first concave and to fill in the second concave. Moreover, a vertical length of the first concave is the same or substantially the same as a horizontal length of the second concave.

According to another aspect of the present invention, a horizontal length of the first concave is the same or smaller than two times of a thickness of the metal connection layer.

According to another aspect of the present invention, a horizontal length of the conductive region is the same or substantially the same as a minimum feature size.

According to another aspect of the present invention, the metal connection layer extends from the first concave to the second concave.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
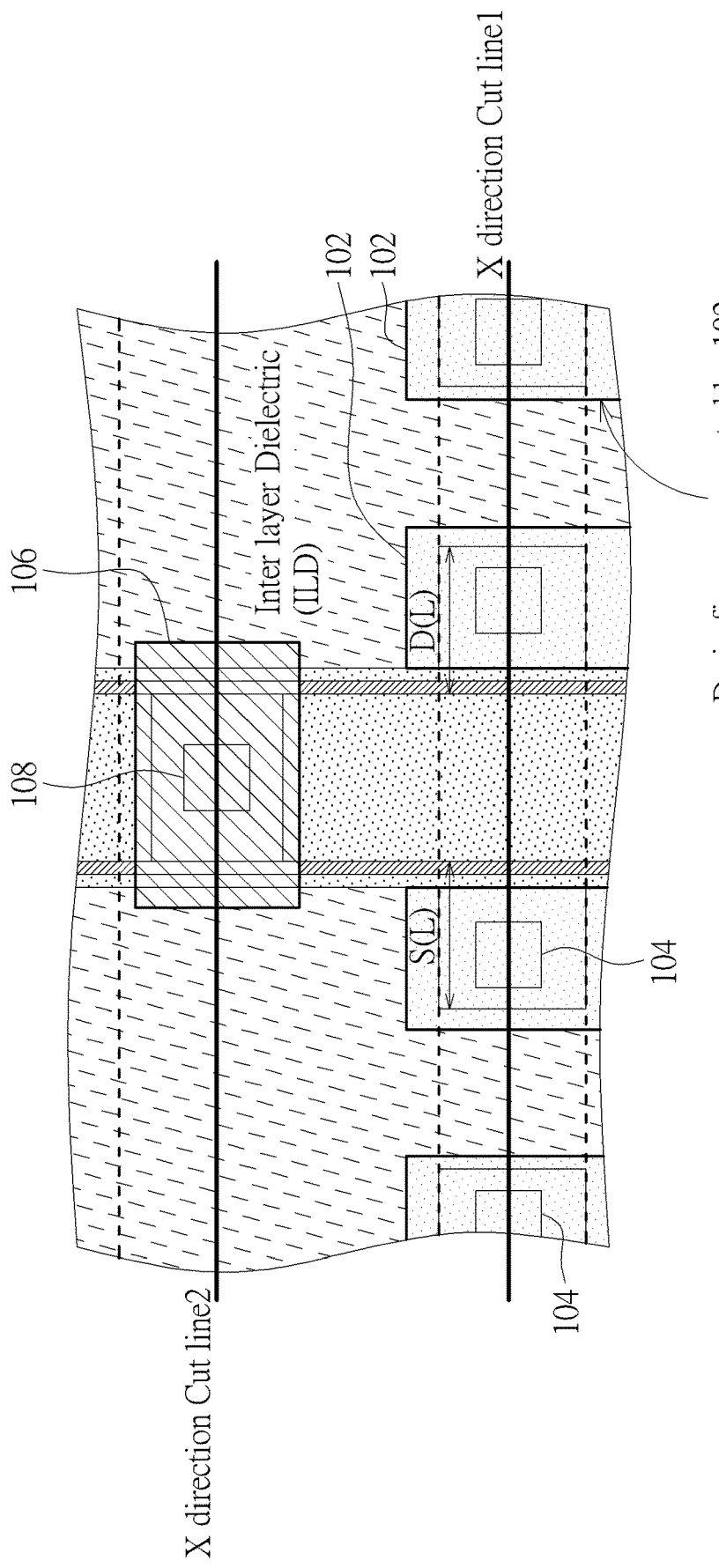
FIG. 1A is a top view structure illustrating the conventional FinFET transistor.
Figure 1B:
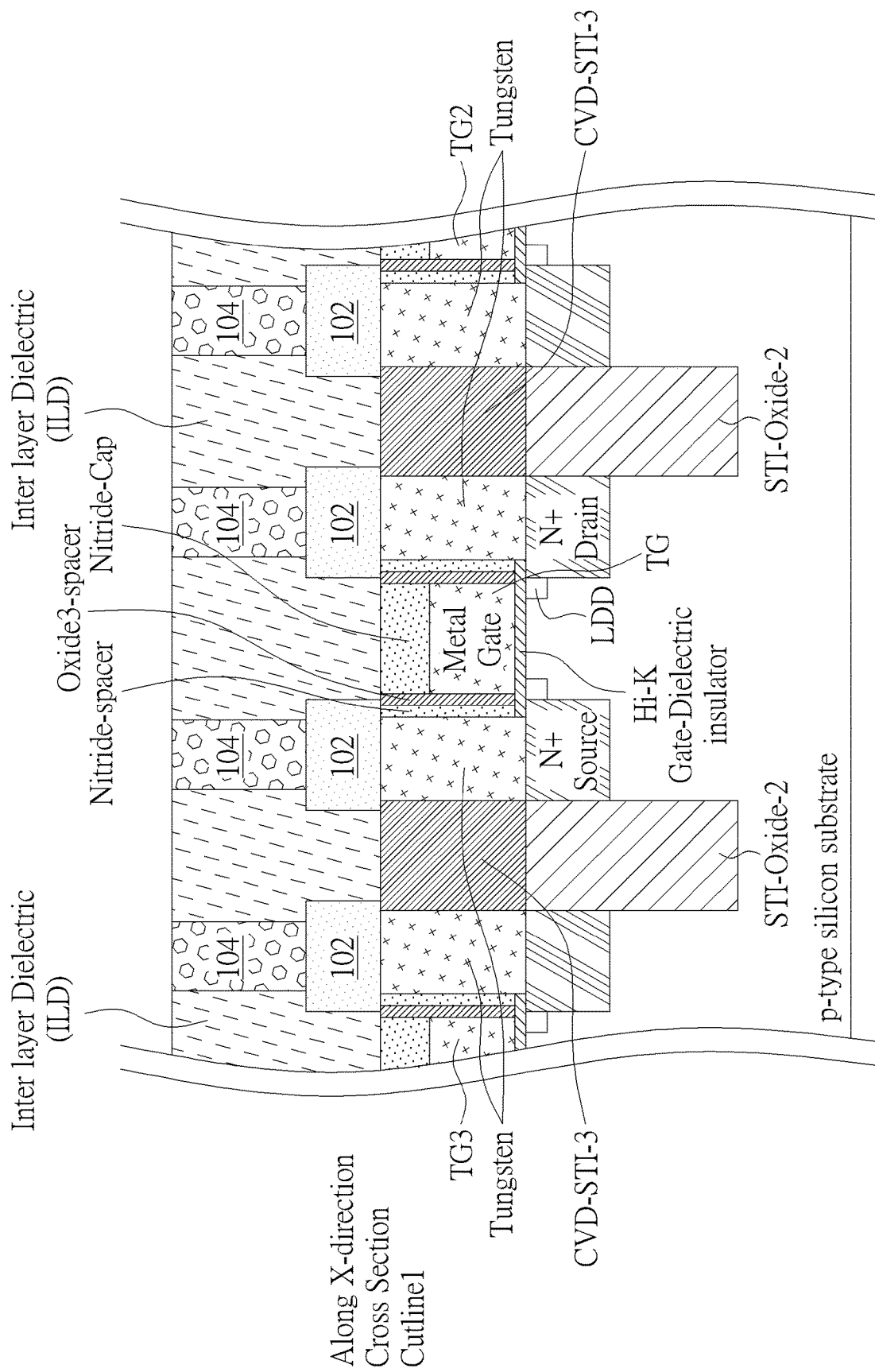
FIG. 1B shows the cross section view based on cutline 1 in FIG. 1A.
Figure 1C:
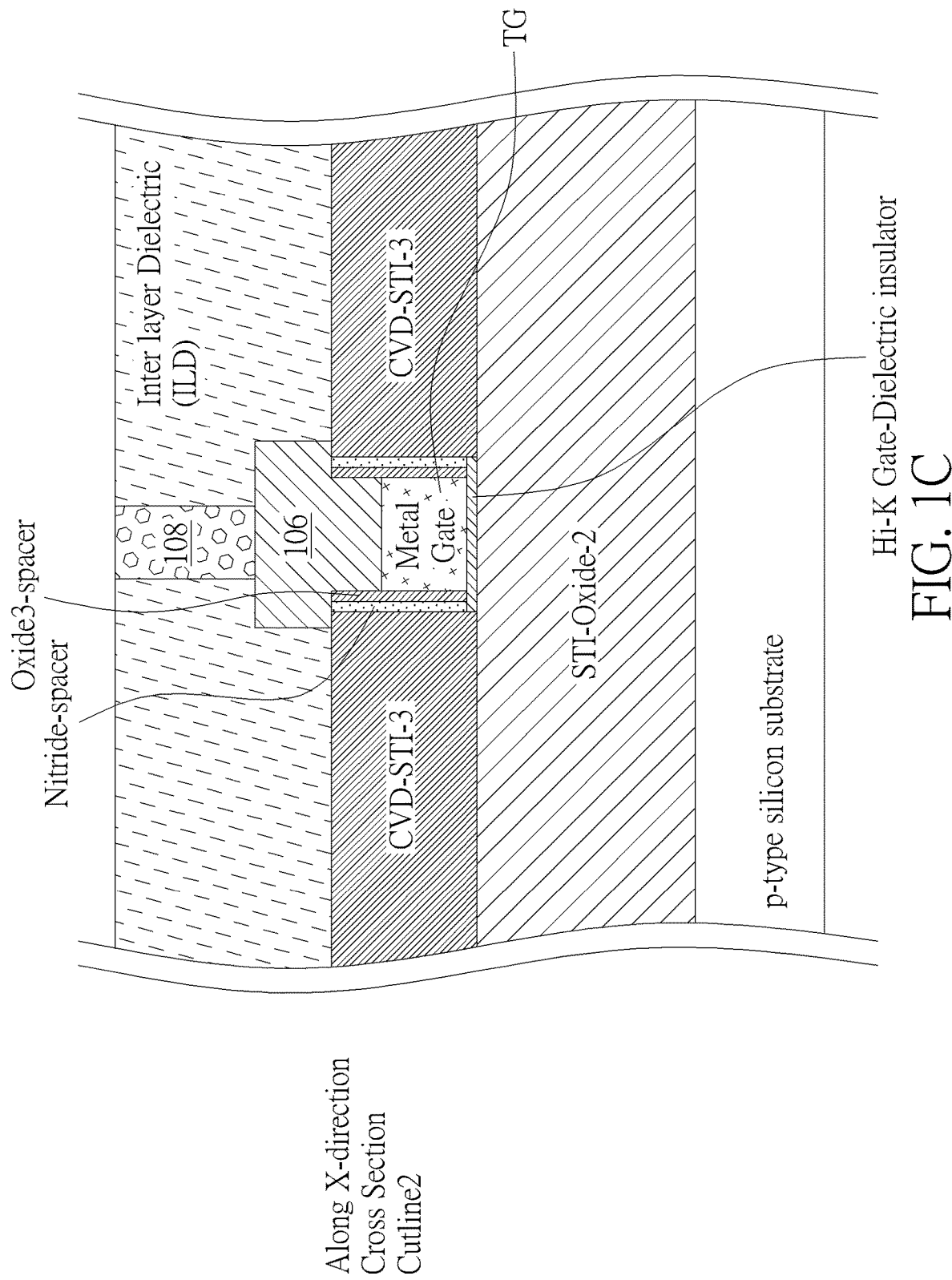
FIG. 1C shows the cross section view based on cutline 2 in FIG. 1A.
Figure 1D:
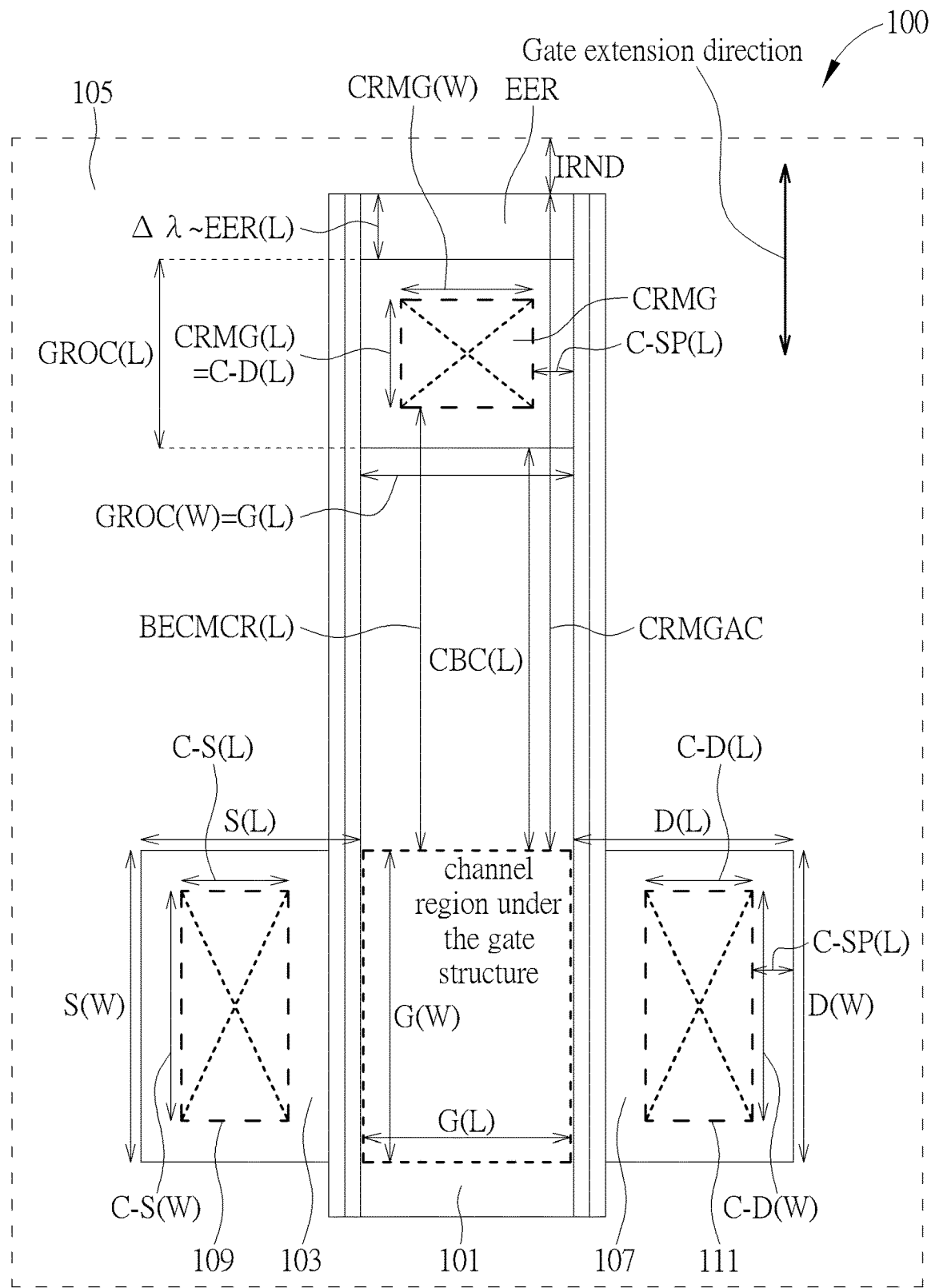
FIG. 1D is a diagram illustrating a top view of a miniaturized metal-oxide-semiconductor field-effect transistor (mMOSFET) according to an embodiment of the present invention.

FIG. 1D is a diagram illustrating a top view of a new MOSFET which is given a name as mMOSFET (miniaturized metal oxide semiconductor field effect transistor) 100 according to an embodiment of the present invention. The mMOSFET 100 especially focuses on a new design to make contact-hole openings on an extension area of a gate structure 101 and on both source region 103 and drain region 107. The gate structure 101 and channel region of the mMOSFET 100 can use either a tri-gate or fin field effect transistor (FinFET) structure or a planar structure, and the source region 103/the drain region 107 of the mMOSFET 100 can use either n-type dopants for an NMOS transistor or p-type dopants for a PMOS transistor, respectively. In the following description, the present invention utilizes an NMOS transistor as an example with a tri-gate design, and the final gate formation can use either the gate-first or the gate-last approach by the prior art design and process without needs to further elaborate descriptions in the following embodiment since these different designs are obvious extensions of the present invention and can be viewed as a straight-forward way of accommodating the suitable ways of forming the mMOSFET 100 accordingly.

Figure 1E:
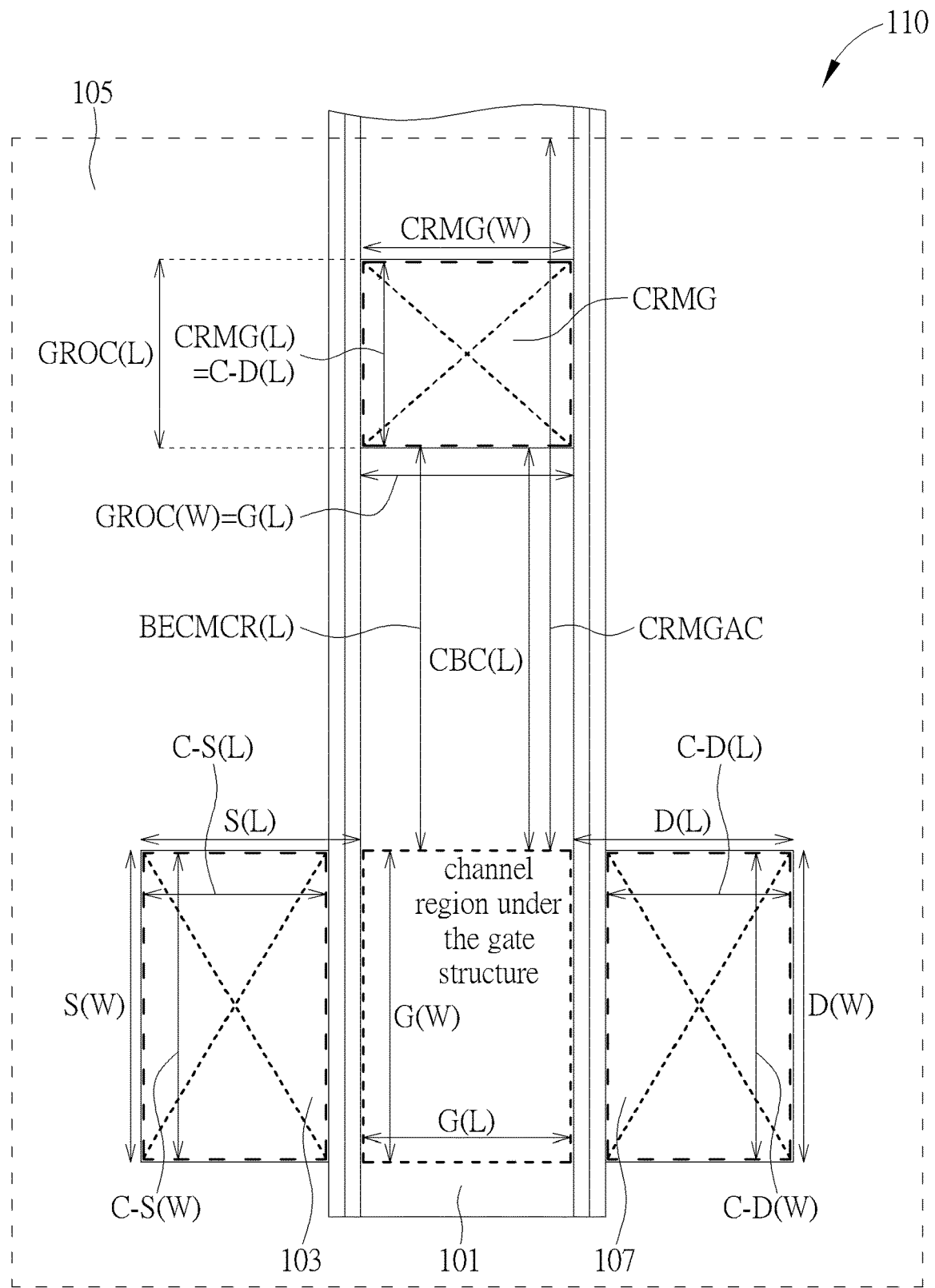
FIG. 1E is a diagram illustrating a top view of an mMOSFET according to another embodiment of the present invention.

As shown in FIG. 1D, a connection region of metal-1 layer to the gate structure 101 (called as CRMG) is designed with a distance somewhat away from the channel region: in such a design the extension area where the CRMG is located adjacent to the channel region is so called as CRMGAC. Outside and surrounding the CRMG there is a larger framed region within the extension area (named as GROC as an abbreviation of the gate structure 101 over the connection-region). The nitride layer over the extension area within the GROC has been removed for allowing the CRMG to be made for a contact-hole opening on the gate structure 101; the GROC has a length along the longitudinal direction labeled as GROC(L) and a width GROC(W) which is usually about a length G (L) of the gate structure 101. A distance from a bottom edge of the GROC to an edge of the channel region (called as CBC(L)) should be larger than the photolithographic misalignment tolerance (PMT), in order to ensure that the CRMG cannot be directly overlaid on top of the channel region (although a special note here: if any technology allows that the CRMG can be overlaid on top of the gate structure 101 with the device channel beneath it, then the present invention can be applied well without the above stated restrictions; that is, CBC(L) can be as small as zero or in a negative value theoretically). That is, a distance from the bottom edge of the CRMG to the edge of the channel region underneath the gate structure 101 (called as BECMCR(L)) is required to be larger than a sum of the PMT and the spacer width within the GROC. In the CRMG, the CRMG has a vertical distance called as a length of CRMG, i.e. CRMG(L) and a horizontal distance called as the width of CRMG, i.e. CRMG(W). An extra extension area of the gate structure 101, which in FIG. 1D is drawn vertically above the GROC in the longitudinal direction, is reserved for the processing step of defining the gate structure 101 by the gate-level mask (GM) in order to maintain the extra extension area (called as EER with its length as EER (L)) to absorb the PMT during the GM step (e.g. EER(L) could be equal to a Delta-Lamda $\Delta\lambda$, wherein $\lambda$ is the minimum feature size). Because the GROC is needed, an isolation region between any neighboring devices (IRND) must be well designed without violating design rules (which are not the focus of the present invention and can be suitably well designed within the targets). In addition, as shown in FIG. 1D, the gate structure 101 has a length G(L) and a width G(W), the source region 103 on a left-hand side of the gate structure 101 has a length S(L) which is a linear dimension from an edge of the gate structure 101 to an edge of an isolation region 105 and a width S(W), the drain 107 on a right-hand side of the gate structure 101 has a length D(L) which is a linear dimension from the edge of the gate structure 101 to the edge of the isolation region 105 and a width D(W). At a center of the source region 103, a contact-hole 109 formed by a self-alignment technology has length and width of an opening labeled as C-S(L) and C-S(W), respectively, and similarly at a center of the drain 107, a contact hole 111 formed by the self-alignment technology has length and width of an opening labeled as C-D(L) and C-D(W), respectively. Moreover, CRMG(L) could be equal to or substantially equal to C-D (L) (or C-S(L)). In addition, FIG. 1E is a diagram illustrating an mMOSFET 110 which is similar to the mMOSFET 100 of FIG. 1D except that the gate extension area of the mMOSFET 110 is a long wire to its neighborhood without need of reserving and labeling as EER and IRND, and that C-SP (L) in FIG. 1D which is a length of an oxide spacer could be omitted in FIG. 1E.

Figure 2A:
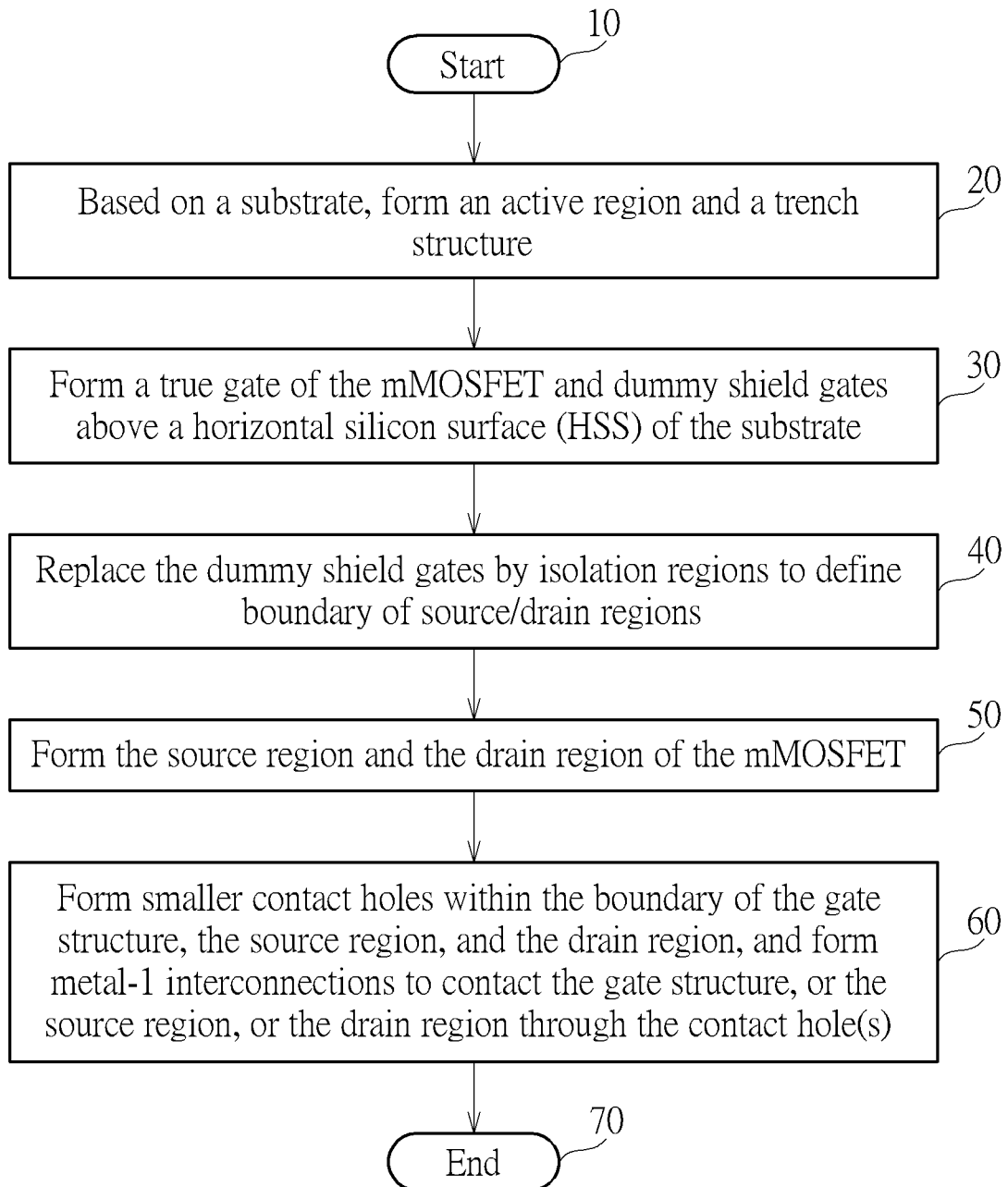
FIG. 2A is a flowchart illustrating a manufacturing method of an mMOSFET according to another embodiment of the present invention.
Figure 2B:
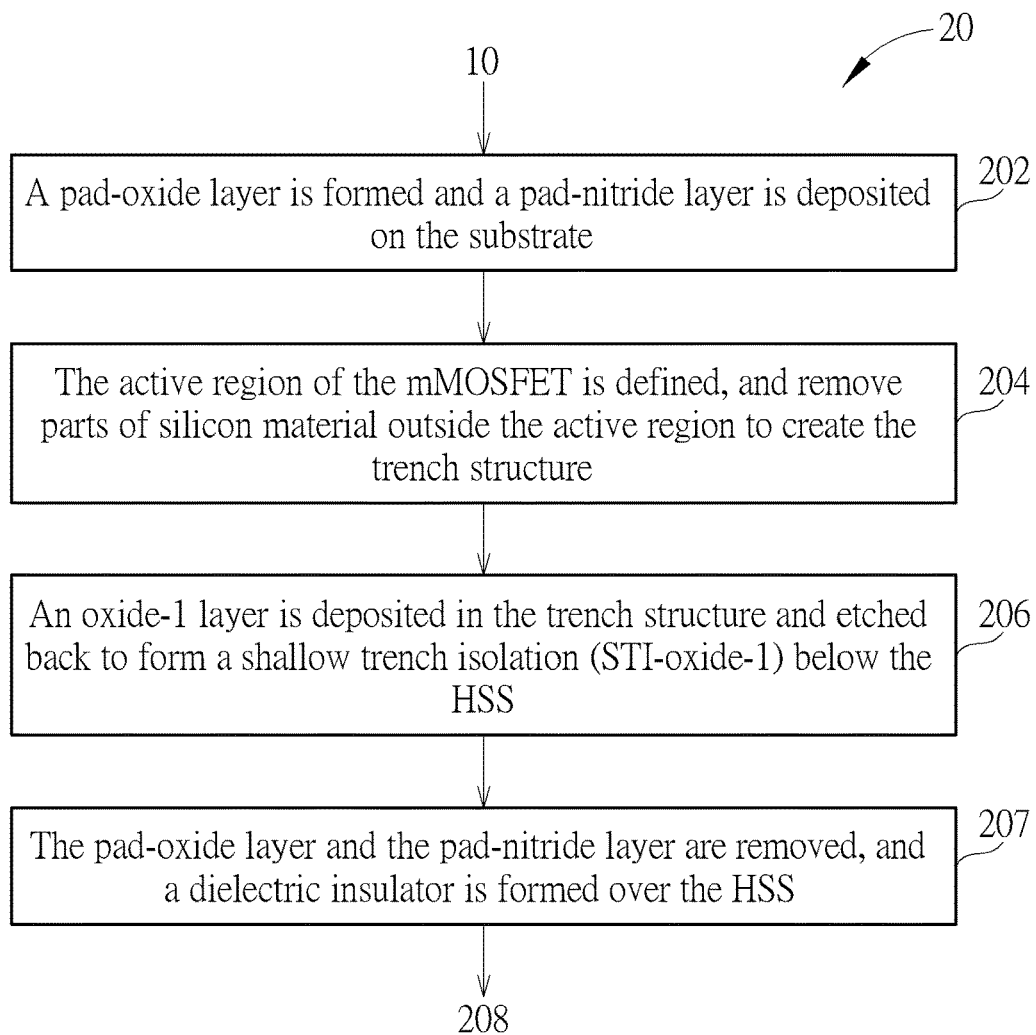
FIGS. 2B-2F are diagrams illustrating FIG. 2A.

FIG. 2A is a flowchart illustrating a manufacturing method of an mMOSFET (e.g. the mMOSFET 100 shown in FIG. 1D or the mMOSFET 110 shown in FIG. 1E) according to one embodiment of the present invention, wherein the manufacturing method of the mMOSFET in FIG. 2A can make the mMOSFET have precisely controllable lengths on both a source region and a drain region of the mMOSFET. Detailed steps are as follows:

Step 10: Start.
Step 20: Based on a substrate 102, form an active region and a trench structure.
Step 30: Form a true gate of the mMOSFET and dummy shield gates above a horizontal silicon surface (HSS) of the substrate 102.
Step 40: Replace the dummy shield gates by isolation regions to define boundary of source/drain regions.
Step 50: Form the source region and the drain region of the mMOSFET.
Step 60: Form smaller contact holes within the boundary of the gate structure, the source region, and the drain region, and form metal-1 interconnections to contact the gate structure, or the source region, or the drain region through the contact hole(s).
Step 70: End.

Please refer to FIG. 2B and FIGS. 3-5. Step 20 could include:
Step 202: A pad-oxide layer 302 is formed and a pad-nitride layer 304 is deposited on the substrate 102.
Step 204: The active region of the mMOSFET is defined, and remove parts of silicon material outside the active region to create the trench structure.
Step 206: An oxide-1 layer is deposited in the trench structure and etched back to form a shallow trench isolation (STI-oxide-1) 306 below the HSS.
Step 207: The pad-oxide layer 302 and the pad-nitride layer 304 are removed, and a dielectric insulator 402 is formed over the HSS.

Figure 2C:
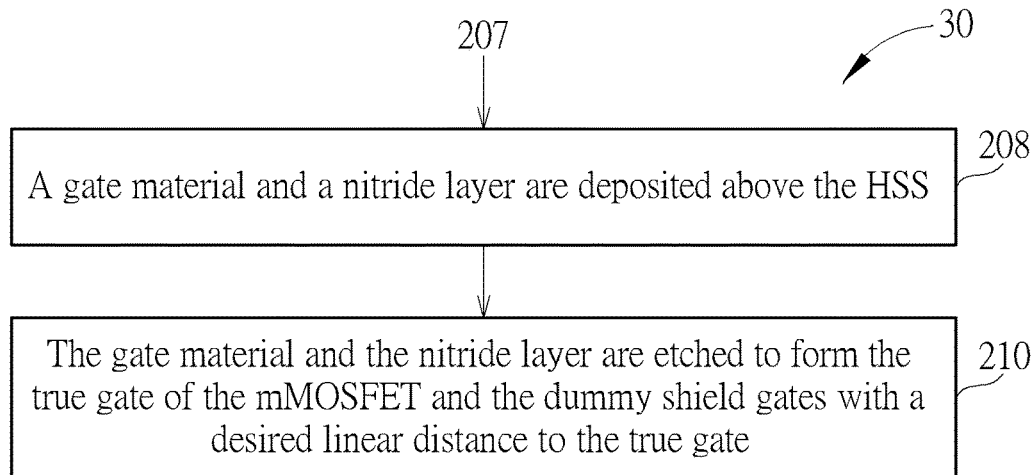
Figure 2D:
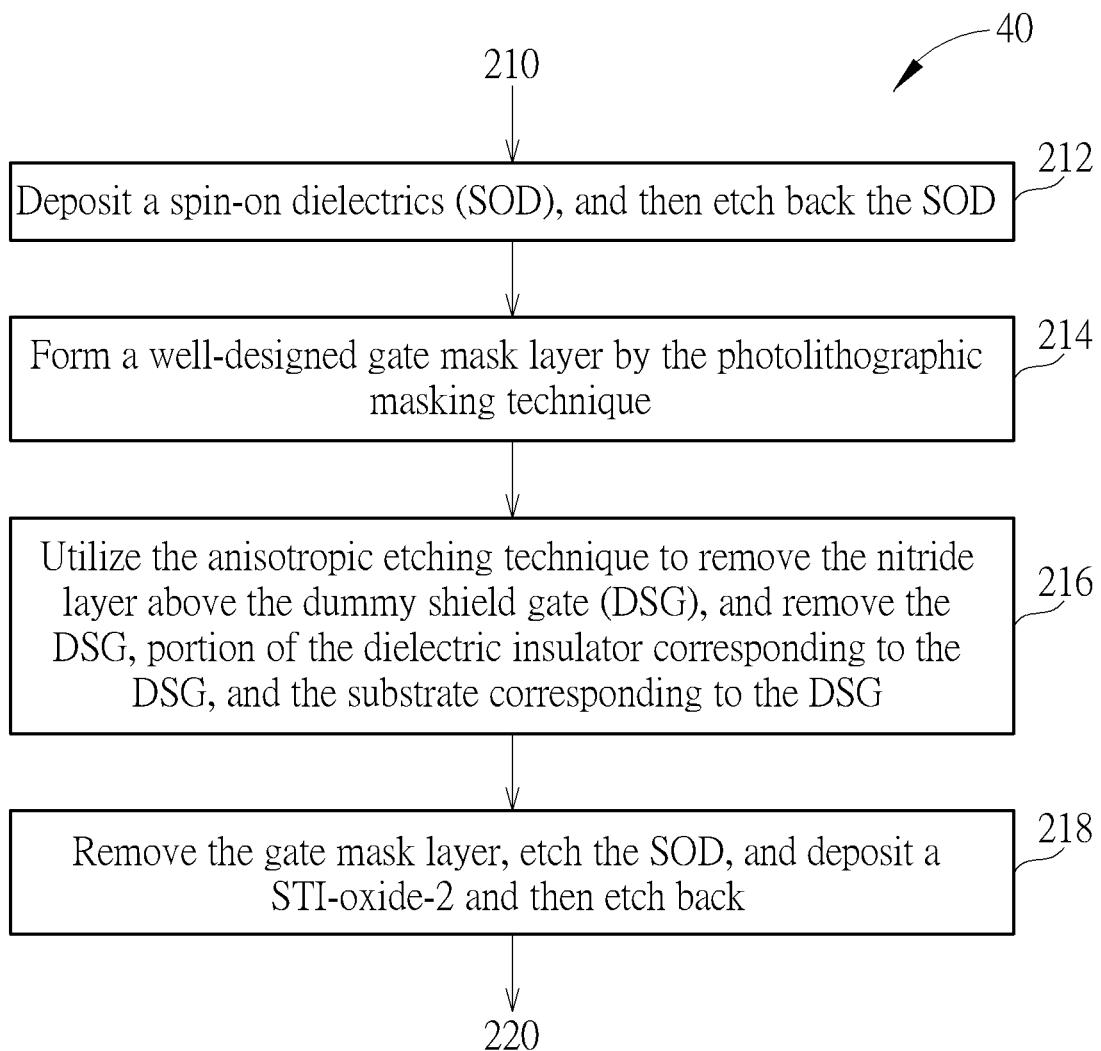
Figure 2E:
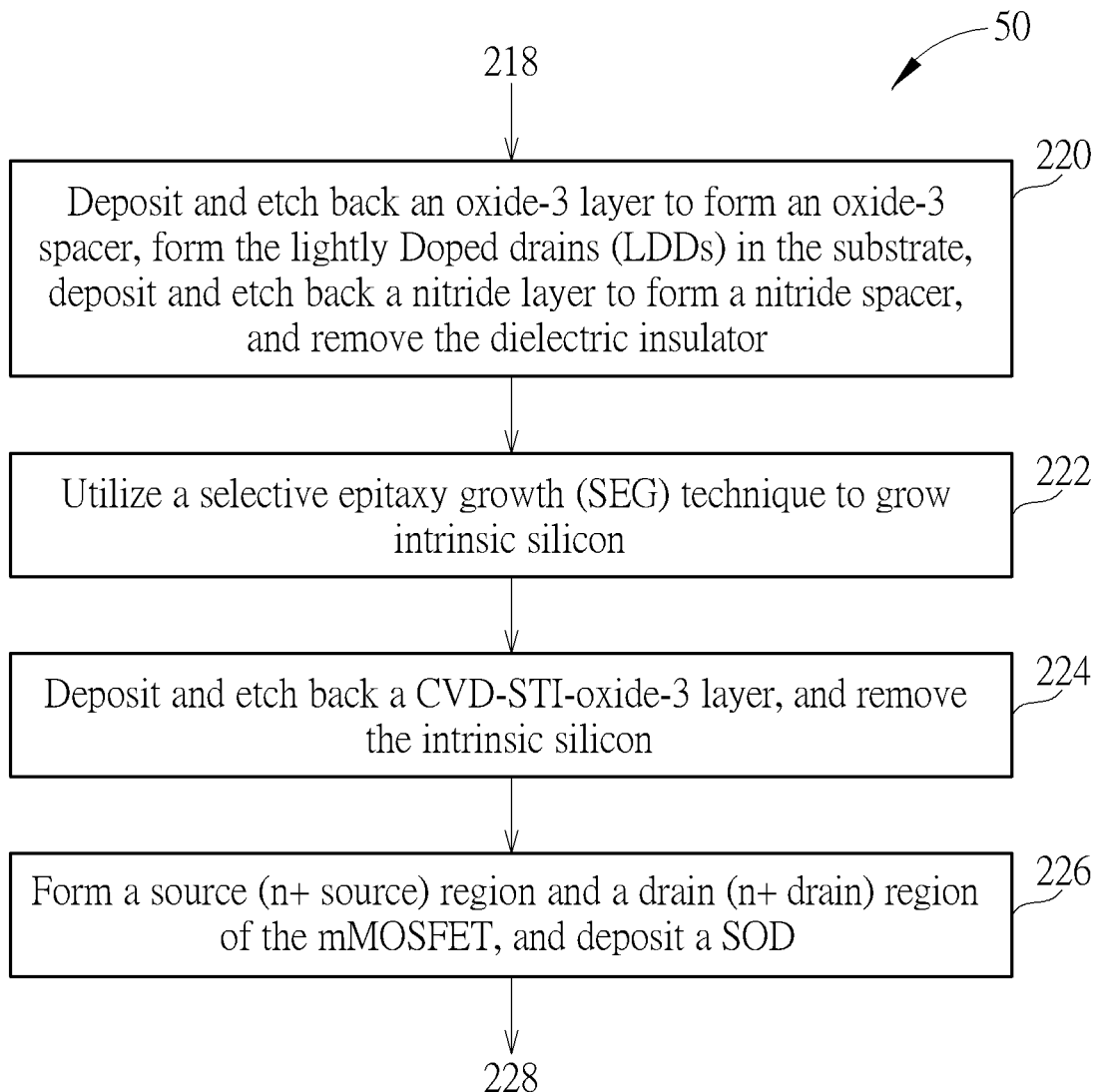
Figure 2F:
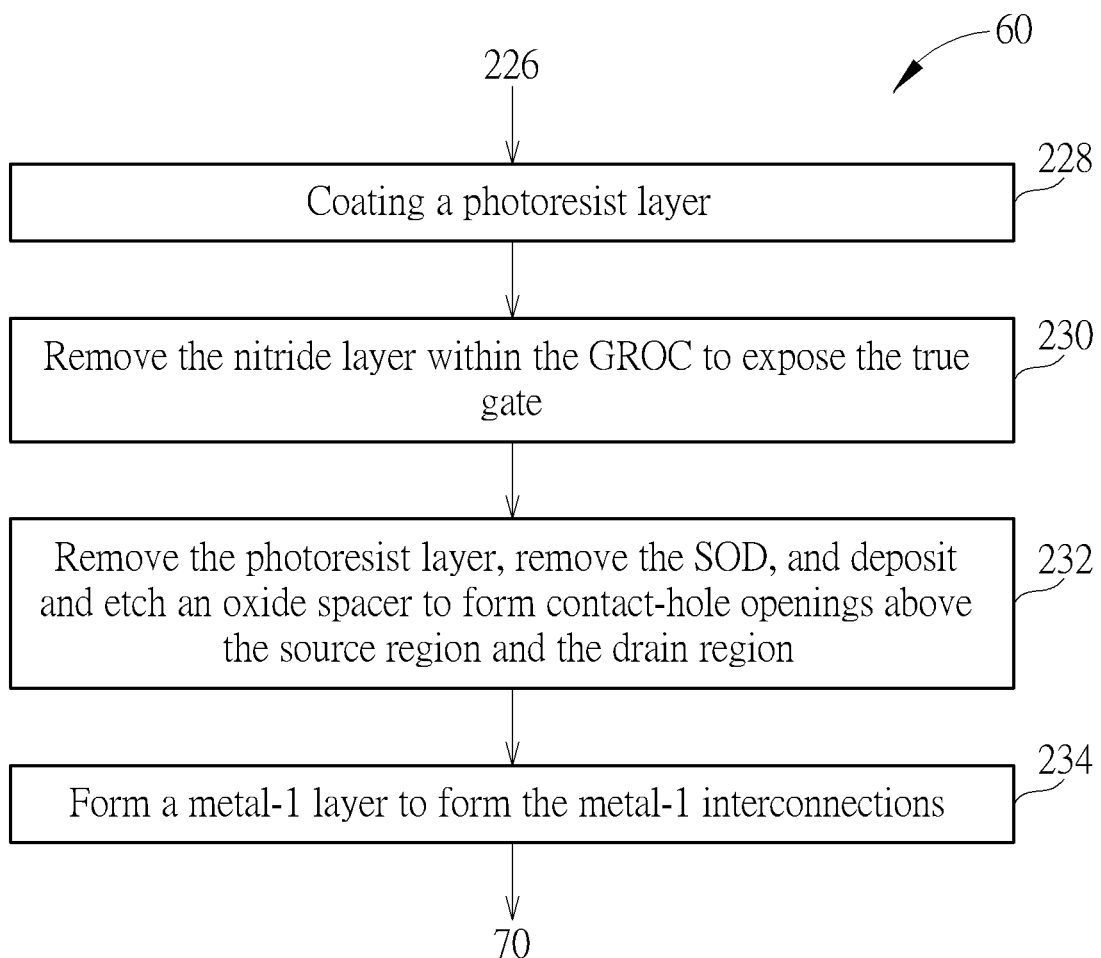
Figure 6A:
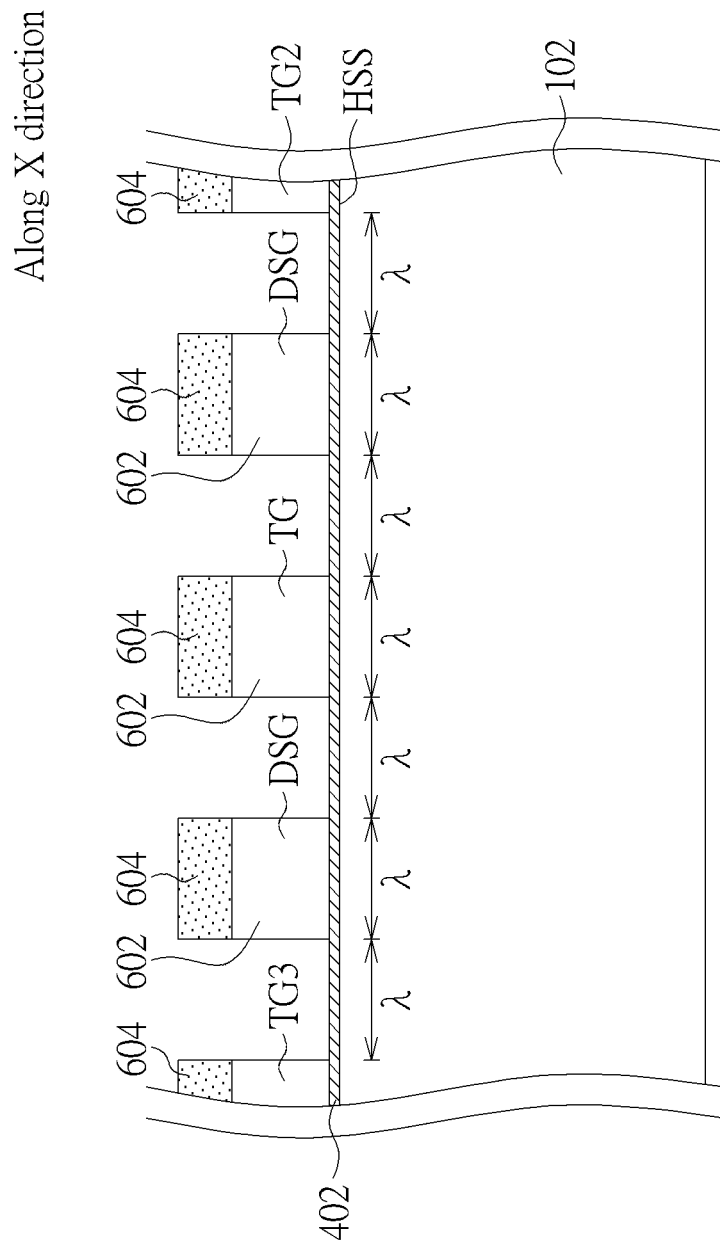
FIG. 6A is a diagram illustrating a new structural which can eliminate the above-mentioned negative effect of the PMT.
Figure 6B:
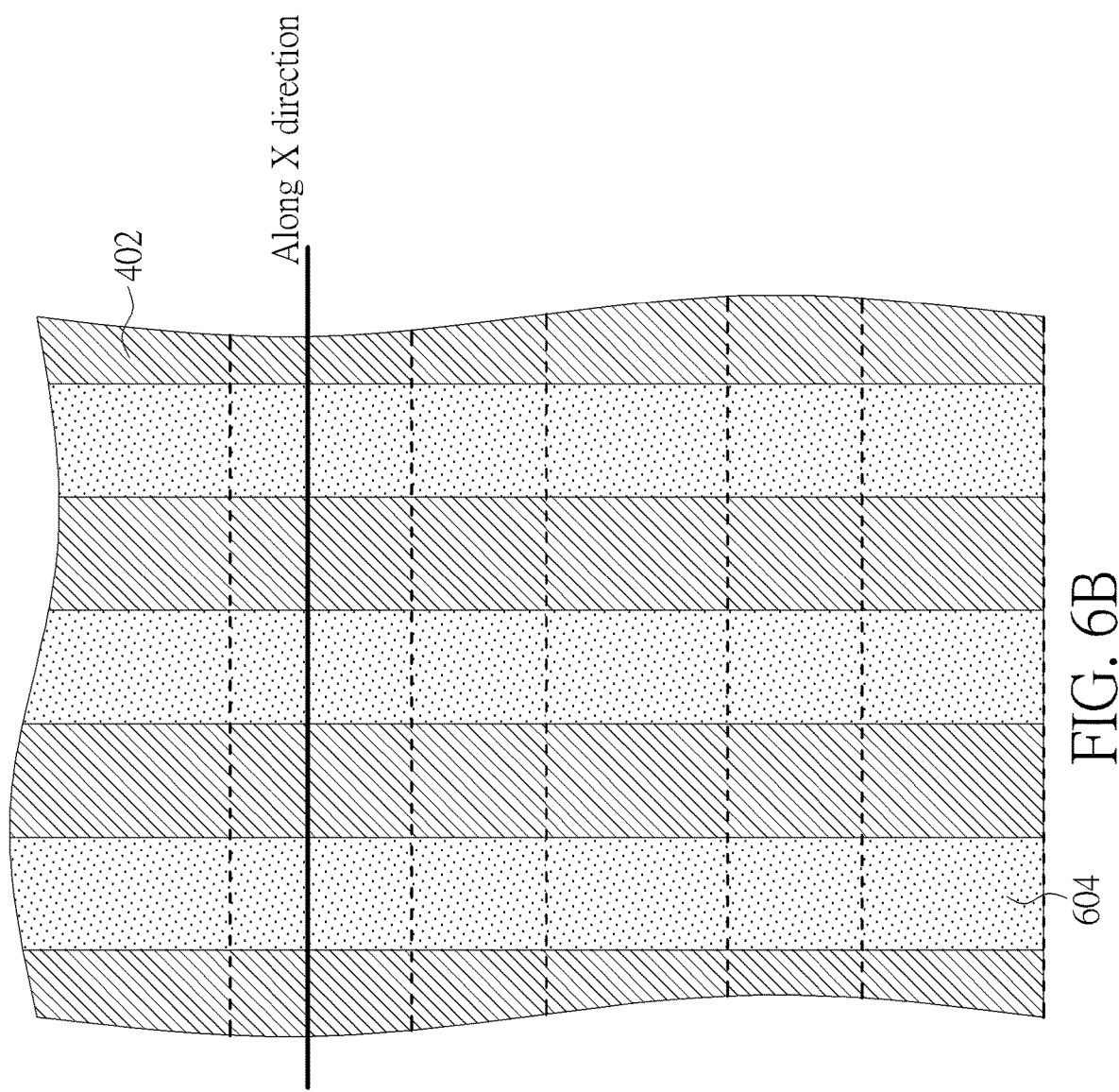
FIG. 6B is a diagram illustrating a top view of FIG. 6A.

Please refer to FIG. 2C and FIGS. 6A, 6B. Step 30 could include:
Step 208: A gate material 602 and a nitride layer 604 are deposited above the HSS.
Step 210: The gate material 602 and the nitride layer 604 are etched to form the true gate (TG) of the mMOSFET and the dummy shield gates (DSG) with a desired linear distance to the true gate (TG).

Please refer to FIG. 2D and FIGS. 7A, 7B, 8A, 8B, 9A, 9B, 10A, 10B. Step 40 could include:
Step 212: Deposit a spin-on dielectrics (SOD) 702, and then etch back the SOD 702.
Step 214: Form a well-designed gate mask layer 802 by a photolithographic masking technique.
Step 216: Utilize the anisotropic etching technique to remove the nitride layer 604 above the dummy shield gate (DSG), and remove the DSG, portion of the dielectric insulator 402 corresponding to the DSG, and the substrate 102 corresponding to the DSG.
Step 218: Remove the gate mask layer 802, etch the SOD 702, and deposit a STI-oxide-2 1002 and then etch back.

Please refer to FIG. 2E and FIGS. 15A, 15B, 16A, 16B, 17A, 17B, 18A, 18B. Step 50 could include:
Step 220: Deposit and etch back an oxide-3 layer to form an oxide-3 spacer 1502, form the lightly Doped drains (LDDs) 1504 in the substrate 102, deposit and etch back a nitride layer to form a nitride spacer 1506, and remove the dielectric insulator 402.
Step 222: Utilize a selective epitaxy growth (SEG) technique to grow intrinsic silicon 1602.
Step 224: Deposit and etch back a CVD-STI-oxide-3 layer 1702, and remove the intrinsic silicon 1602.
Step 226: Form a source (n+ source) region 1704 and a drain (n+ drain) region 1706 of the mMOSFET, and deposit a SOD 1801.

Please refer to FIG. 2F and FIGS. 19, 21, 22A, 22B, 23A, 23B. Step 60 could include:
Step 228: Coating a photoresist layer 1901.
Step 230: Remove the nitride layer 604 within the GROC to expose the true gate (TG).
Step 232: Remove the photoresist layer 1901, remove the SOD 1801, and deposit and etch an oxide spacer 1802 to form contact-hole openings above the source region and the drain region.
Step 234: Form a metal-1 layer 1902 to form the metal-1 interconnections.

The following describes the detailed processes for the manufacture of the mMOSFET in which the gate and source(or drain) could be connected thought a metal 1 layer. Use an n-type MOSFET as an example, the substrate 102 would be a p-type substrate and detailed description of the aforesaid manufacturing method is as follows. Start with Step 20, please refer to FIG. 2B, and FIGS. 3, 4. In Step 202, the pad-oxide layer 302 is formed over the HSS of the substrate 102 and then the pad-nitride layer 304 is deposited above the pad-oxide layer 302.

In Step 204, the active region of the mMOSFET can be defined by the photolithographic masking technique, wherein the HSS outside the active region is exposed accordingly. Because the HSS outside the active region pattern is exposed, the parts of the silicon material outside the active region can be removed by the anisotropic etching technique to create the trench structure.

Figure 3:
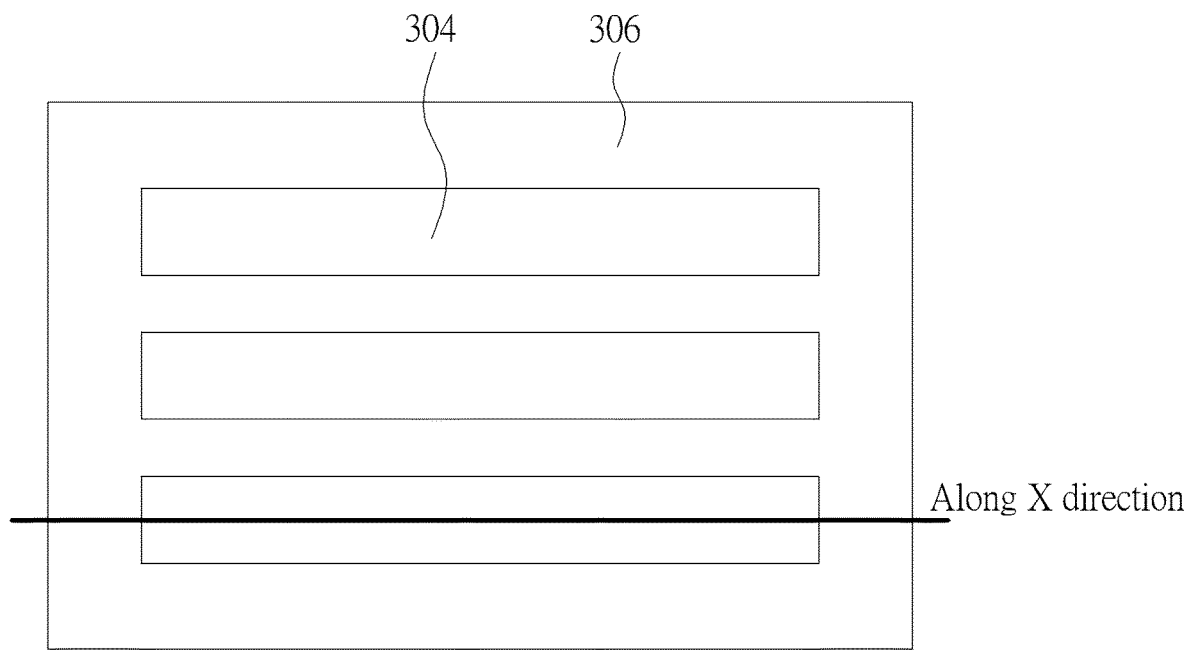
FIG. 3 is a diagram illustrating a top view of the pad-nitride layer and the STI-oxide-1.
Figure 4:
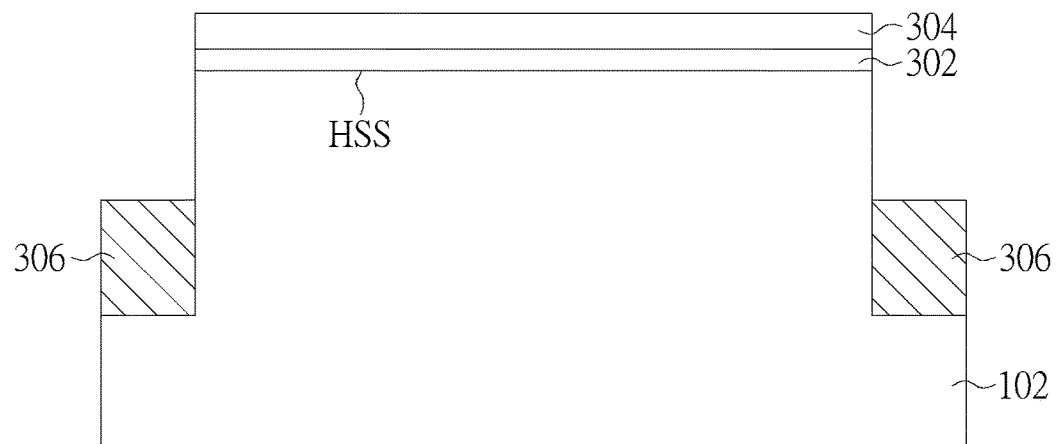
FIG. 4 is a diagram illustrating a cross-section view along an X direction shown in FIG. 3.

In Step 206, as shown in FIG. 4, the oxide-1 layer is deposited to fully fill the trench structures and then the oxide-1 layer is etched back to form the STI-oxide-1 306 below the HSS. FIG. 4 is a cross-section view along an X direction shown in FIG. 3. In addition, because FIG. 3 is a top view, FIG. 3 only shows the pad-nitride layer 304 and the STI-oxide-1 306. Then, in Step 207, the pad-oxide layer 302 and the pad-nitride layer 304 on the active regions are removed, and a dielectric insulator 402 (with high-K) is formed over the HSS.

Figure 5:
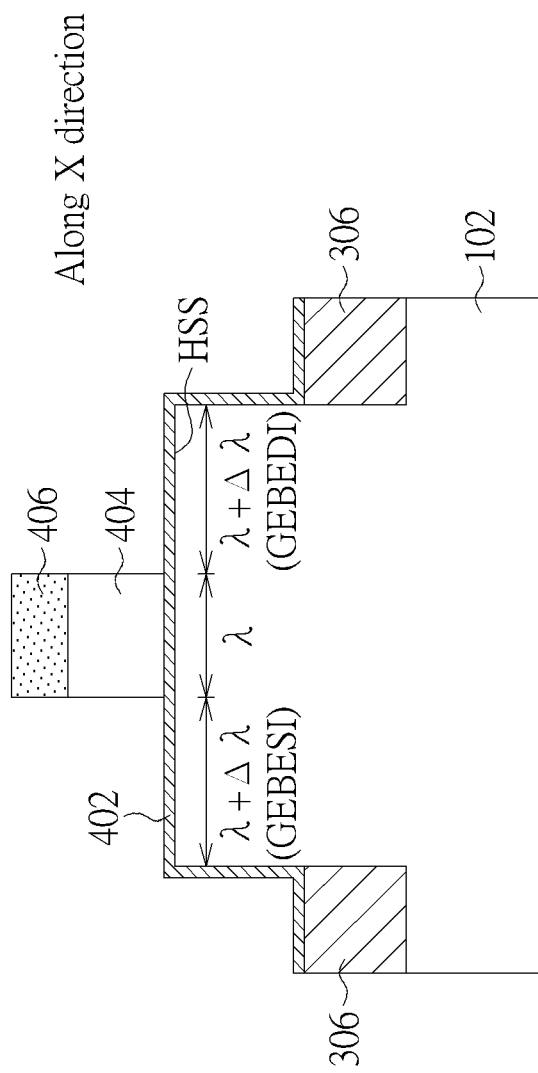
FIG. 5 is a diagram illustrating photolithographic misalignment tolerance (PMT) for an alignment of an edge of the gate structure to an edge of a boundary between a source of the mMOSFET and the STI-oxide-1.

FIG. 5 describes the prior art design and processing method of accomplishing the geometric relationship between the Gate region and the transistor isolation region (STI) with a smaller dimensional size. After the dielectric insulator 402 (with high-K) is formed over the HSS, a gate layer 404 (metal gate) is deposited above the dielectric insulator 402, and then a nitride layer 406 (nitride-cap) with a well-designed thickness is deposited above the gate layer 404. Then, as shown in FIG. 5, the photolithographic masking technique is utilized to define a region for the gate structure 1, wherein the gate structure 1 includes the gate layer 404 and the nitride layer 406 to make the gate structure 1 have suitable metal-gate material which delivers required work-function of MIS (metal insulator to substrate) for achieving a suitable threshold voltage of the mMOSFET. In addition, because the STI-oxide-1 306 is made below the HSS, the Tri-gate or fin field-effect transistor (FinFET) structure has been formed (shown in FIG. 5).

After a first photolithography process utilized to define a pseudo length of the active region and a second photolithography process utilized to define the length G(L) in the active region, a distance from an edge of the gate structure to the edge of the boundary between the source of the mMOSFET (or the drain of the mMOSFET) and a shallow trench isolation, named as GEBESI (or GEBEDI), could be defined as shown in FIG. 5.

However, as shown in FIG. 5, there exists an unavoidable non-ideal factor called as photolithographic misalignment tolerance (PMT) during the photolithographic masking technique for an alignment of an edge of the gate structure 1 to an edge of a boundary between a source of the mMOSFET and the STI-oxide-1 306 (similarly on the other side of a drain of the MMOSFET). If the PMT measured in a linear dimension along the X direction is $\Delta\lambda$, $\Delta\lambda$ should be correlated to the minimal feature size as dictated by the photolithographic resolution of the equipment available for the specified processing node. For example, a 7-nm process node (or called minimum feature size) should have $\lambda$ equal to 7 nm and $\Delta\lambda$ of the PMT could be 3.5 nm or so. Therefore, if the desired actual physical length of the source of the mMOSFET (or the drain of the mMOSFET) is targeted at $\lambda$ (e.g. 7 nm), then a designed length of the source of the mMOSFET (or the drain of the mMOSFET) under the prior art process method must be larger than a sum of $\lambda$ and $\Delta\lambda$ (e.g. >10.5 nm).

Therefore, the present invention utilizes anew structure which can eliminate the above-mentioned negative effect of the PMT. That is, whatever dimension of a distance from an edge of the gate structure to the edge of the boundary between the source of the mMOSFET (or the drain of the mMOSFET) and a shallow trench isolation, named as GEBESI (or GEBEDI), is desired to be achieved, there is no need to reserve extra dimension for the PMT along the length direction (i.e. the X direction shown in FIG. 5) of the mMOSFET 100.

In Step 208, in the present invention as shown in FIG. 6A, after the dielectric insulator 402 (with high-K) is formed over the HSS, the gate material 602 and the nitride layer 604 are deposited. Then in Step 210, the gate material 602 and the nitride layer 604 are etched to form the gate structure (wherein the gate material 602 could be the gate structure of the mMOSFET). A major difference between the new structural shown in FIG. 6A and the structure shown in FIG. 5 is that, when a true gate (TG) of the mMOSFET is defined by the photolithographic masking technique, dummy shield gates (DSG) are also defined in parallel to the TG with a desired, so targeted linear distance (e.g. $\lambda$, such as 7 nm in the 7-nm process node) exists between the DSG and the TG without reserving any extra dimension (i.e. $\Delta\lambda$) for the PMT. Both the DSG and the TG designed on the same mask could be formed simultaneously on a top of the dielectric insulator 402 which covers the active regions. In addition, as shown in FIG. 6A, TG2, TG3 correspond to other mMOSFETs. In addition, FIG. 6B is a top view of FIG. 6A.

Figure 7A:
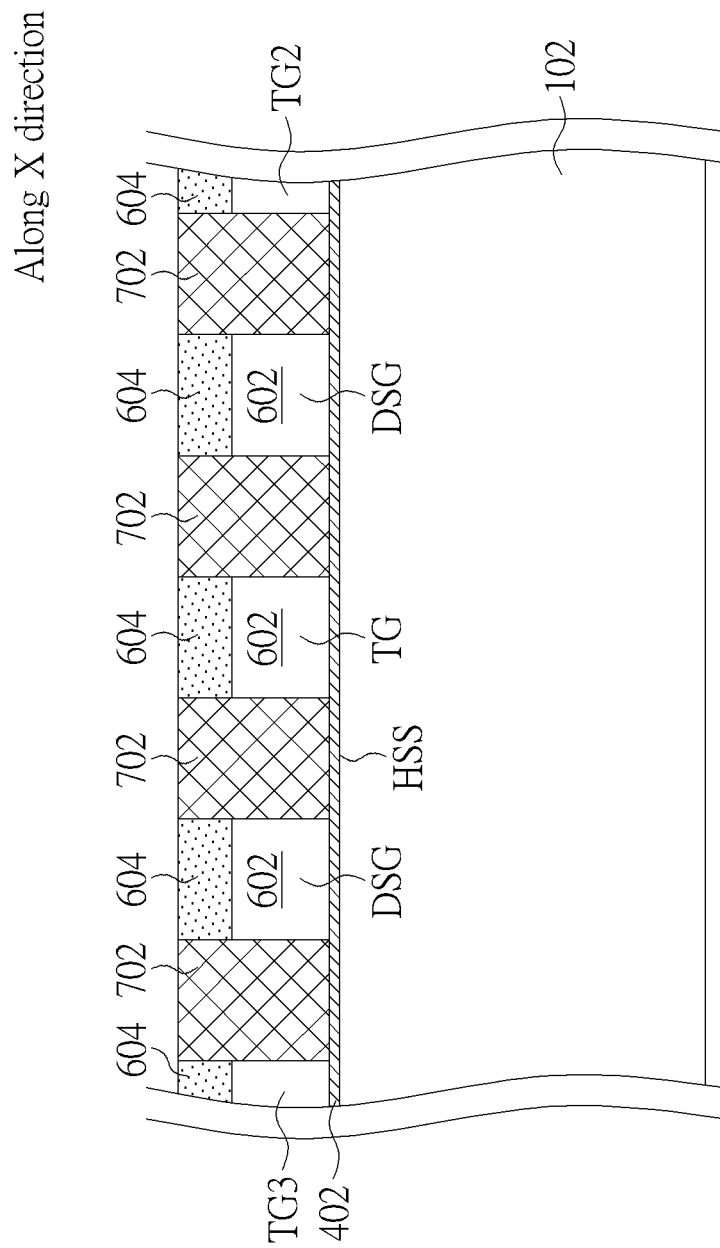
FIG. 7A is a diagram illustrating the spin-on dielectrics (SOD) being deposited.
Figure 7B:
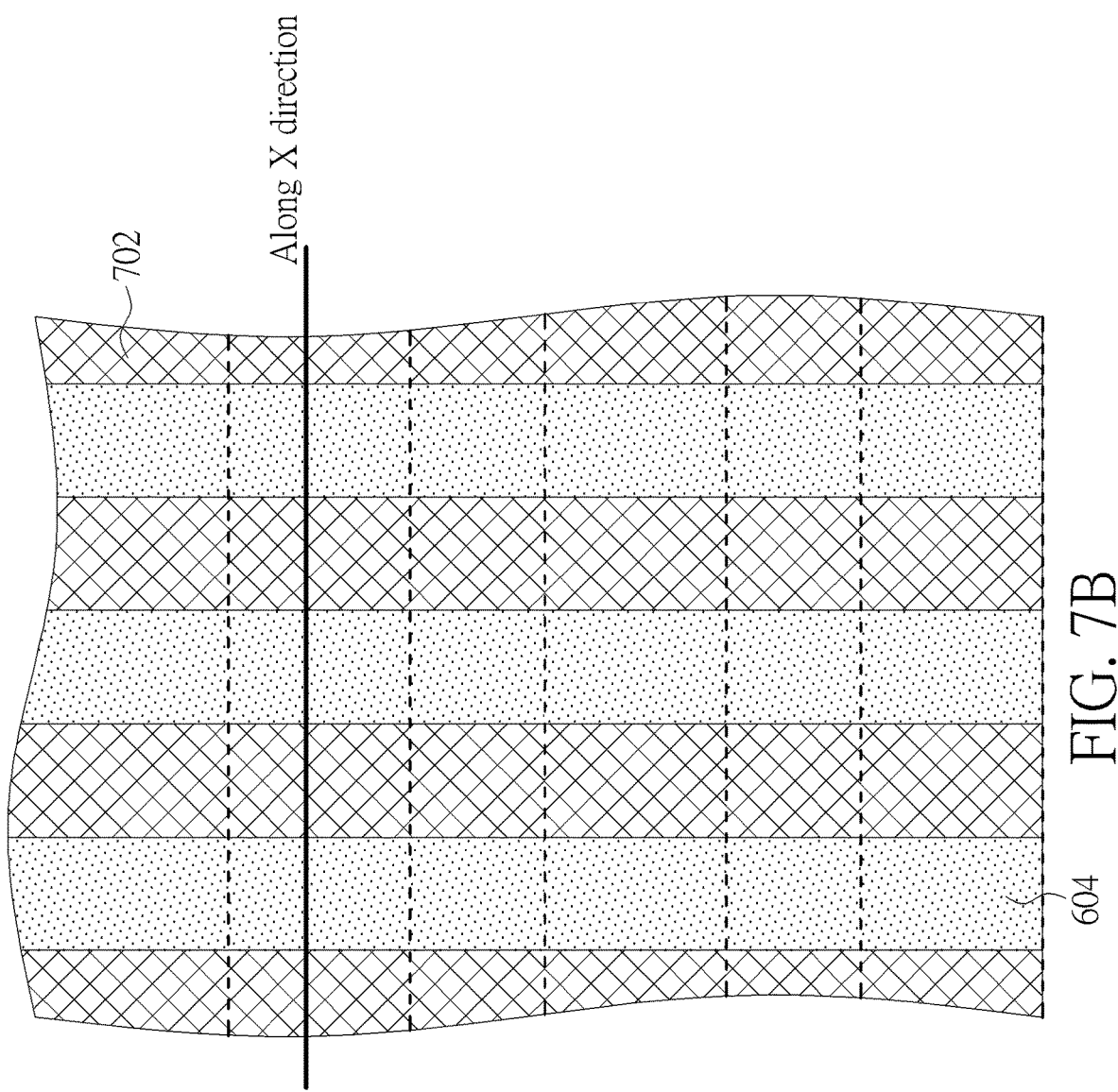
FIG. 7B is a diagram illustrating a top view of FIG. 7A.

The following steps describe how to replace the dummy shield gates by isolation regions which are raised above the HSS. In Step 212, as shown in FIG. 7A, the SOD 702 is deposited and the chemical mechanical polishing (CMP) technique is utilized to etch back the SOD 702, and make a top of the SOD 702 as tall as a top of the nitride layer 604. In addition, FIG. 7B is a top view of FIG. 7A.

Figure 8A:
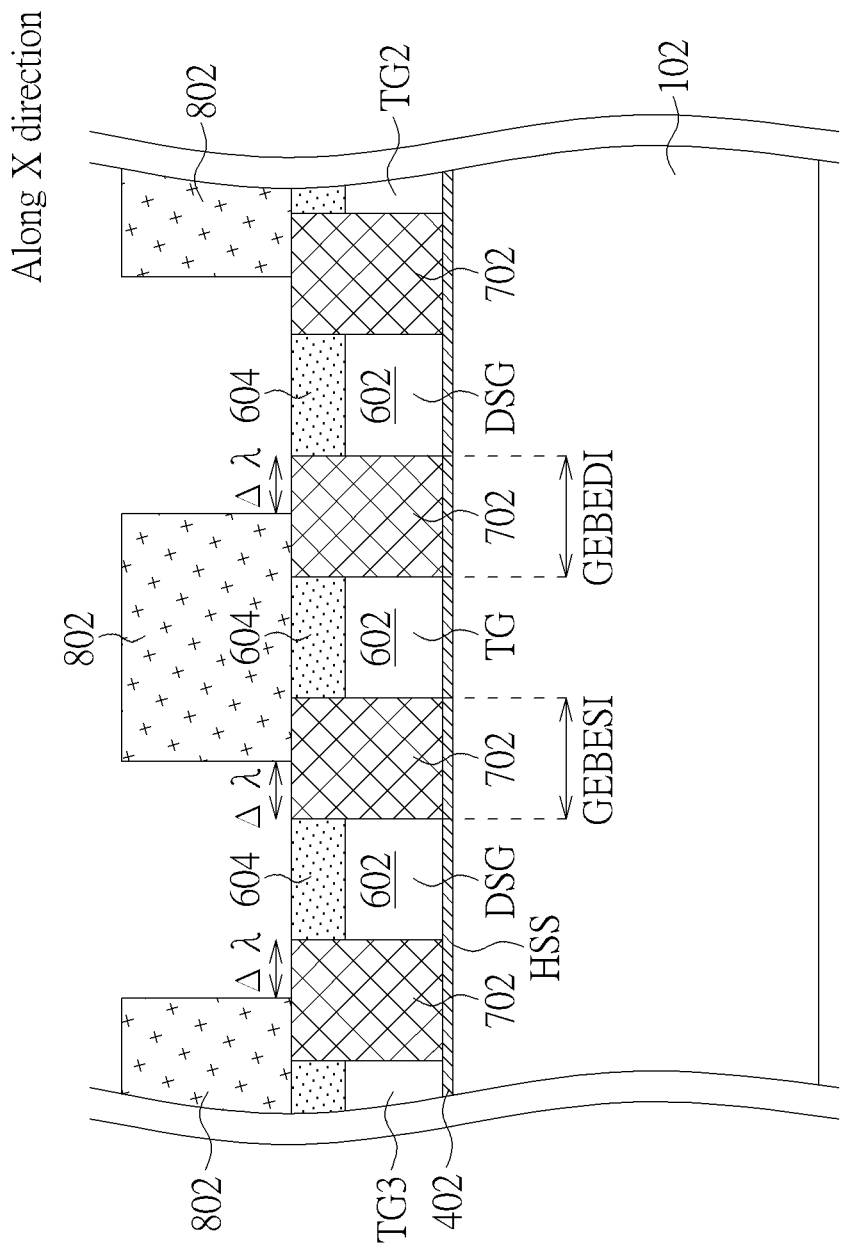
FIG. 8A is a diagram illustrating the well-designed gate mask layer being deposited and patterned.
Figure 8B:
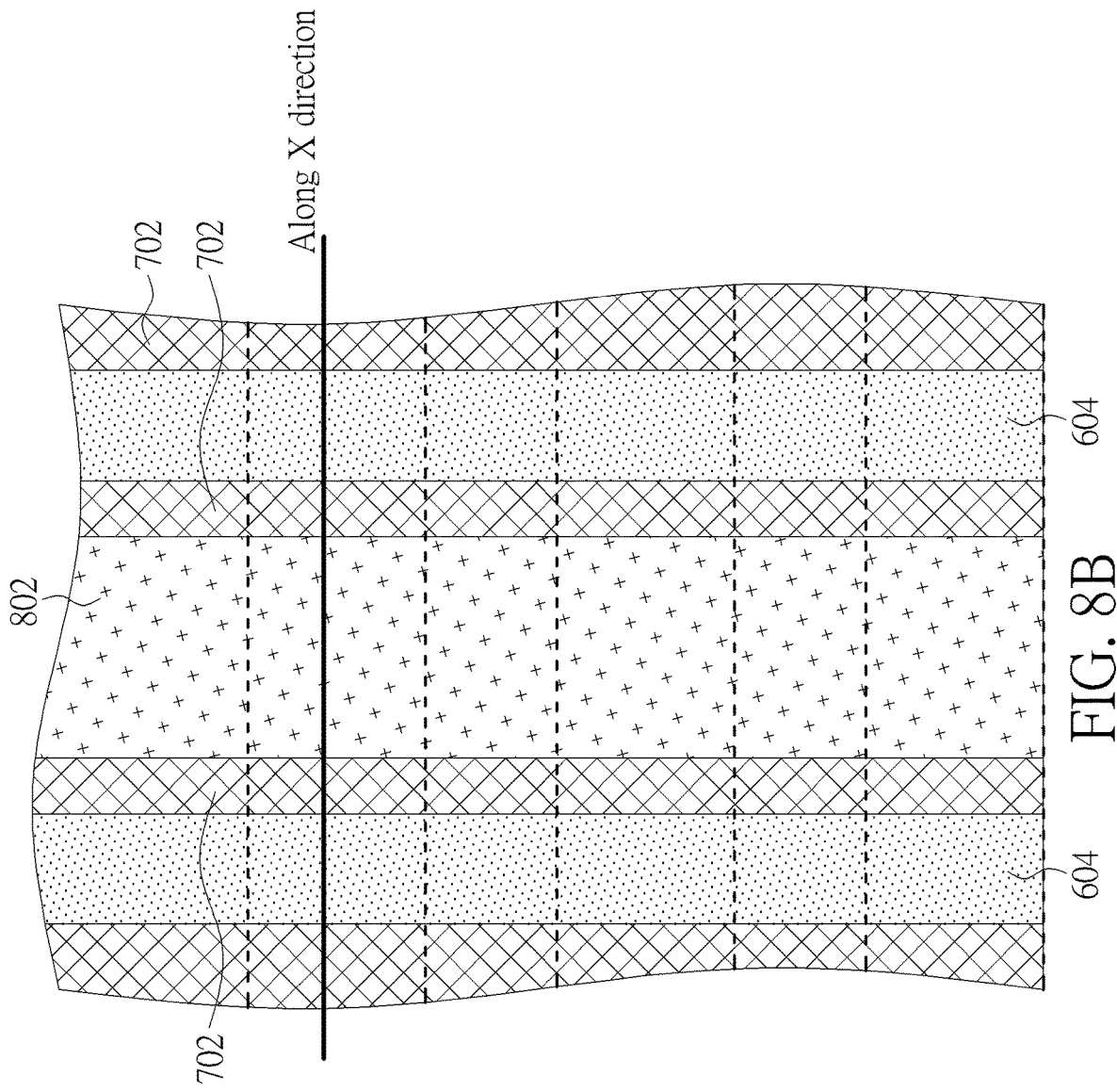
FIG. 8B is a diagram illustrating a top view of FIG. 8A.

In Step 214, as shown in FIG. 8A, the gate mask layer 802 (well-designed) is deposited, and then the gate mask layer 802 is etched by the photolithographic masking technique to accomplish a target of covering the TG, TG2, TG3 but exposing the DSG with a safe PMT margin $\Delta\lambda$ at a middle of such lengths of GEBESI and GEBEDI, respectively. In addition, FIG. 8B is a top view of FIG. 8A.

Figure 9A:
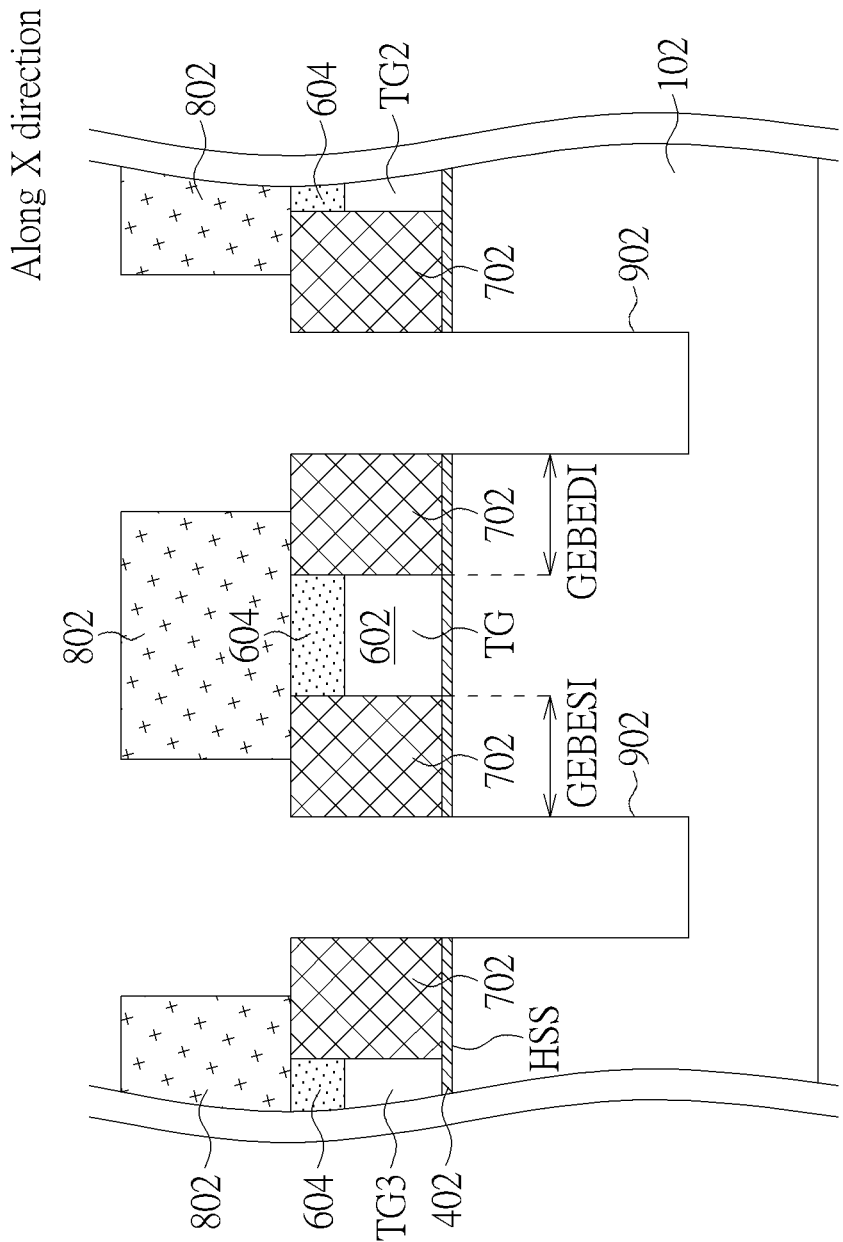
FIG. 9A is a diagram illustrating the dummy shield gate (DSG), the nitride layer, the dielectric insulator, and the p-type substrate corresponding to the DSG being removed by the anisotropic etching technique.
Figure 9B:
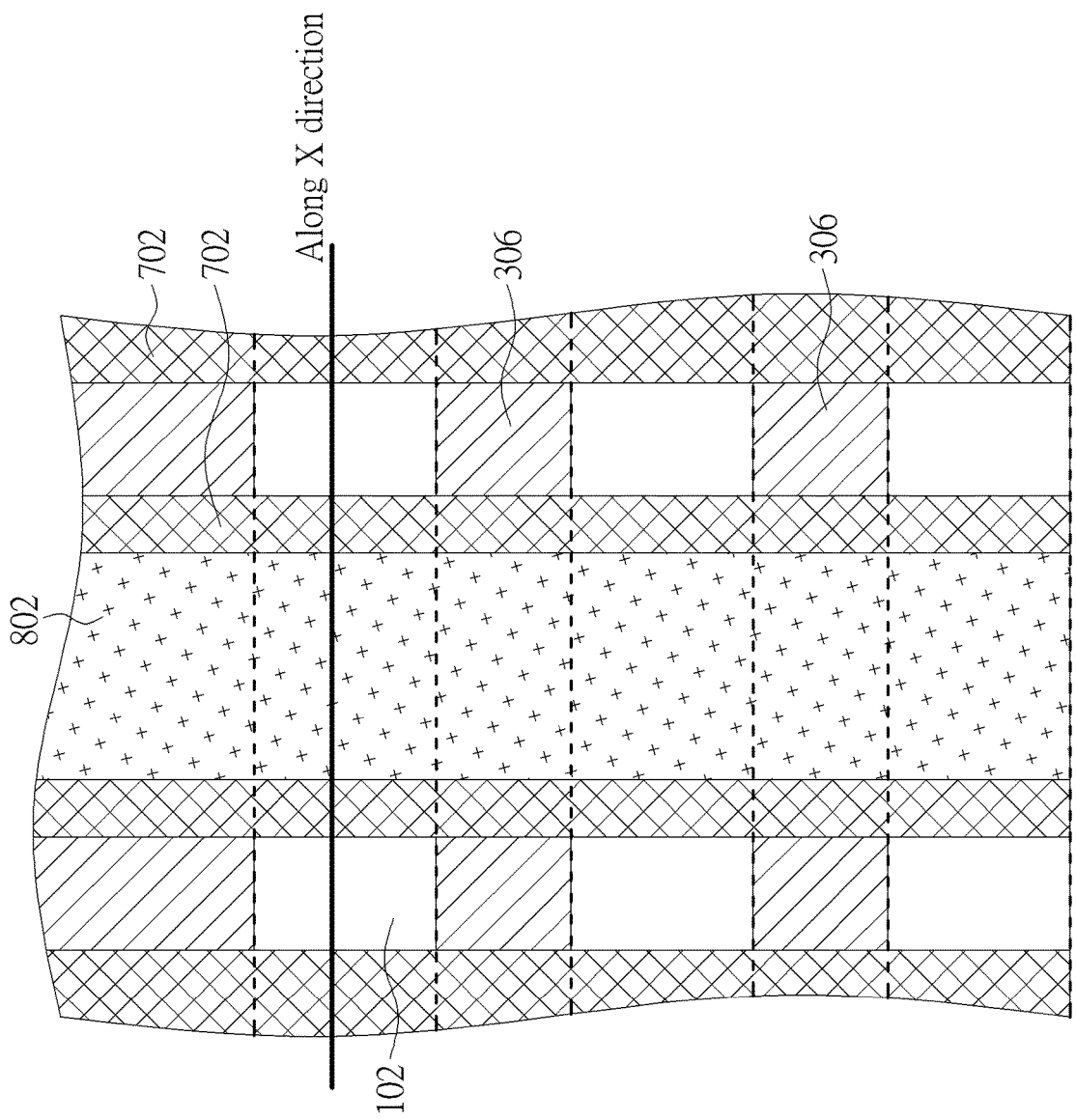
FIG. 9B is a diagram illustrating a top view of FIG. 9A and multiple fingers in horizontal direction.

In Step 216, as shown in FIG. 9A, the anisotropic etching technique is utilized to etch away the DSG and the nitride layer 604 corresponding to the DSG, and further to etch away part of the dielectric insulator 402 corresponding to the DSG so as to reach the HSS, and then the anisotropic etching technique is utilized to remove the silicon material of the substrate 102 below the HSS to form trenches 902 under the HSS, wherein a depth of the trenches 902 could be equal to a depth of a bottom of the STI-oxide-1 306 (mentioned in FIG. 4). Therefore, as shown in FIG. 9A, the PMT is avoided in creation of precisely controlled lengths of GEBESI and GEBEDI, respectively. Since the lengths of GEBESI and GEBEDI are well defined by the TG and the DSG on the same mask, both the length S(L) of the source region and the length D(L) of the drain region shown in FIG. 1D are thus well defined and made. That is, this single photolithographic masking technology is not only used for defining the TG and the DSG, but also for controlling the lengths of the GEBESI and the GEBEDI. Therefore, the dimensions of the length S(L) and the length D(L) can be accurately controlled even for achieving an optimally minimized dimension as small as the minimum feature size λ. Because the length S(L) and the length D(L) can be can be equal to λ, the length S(L) and the length D(L) are substantially equal to the length of the TG (i.e. the gate structure). In addition, FIG. 9B is the top view of FIG. 9B and shows multiple fins or fingers in horizontal direction.

Figure 10A:
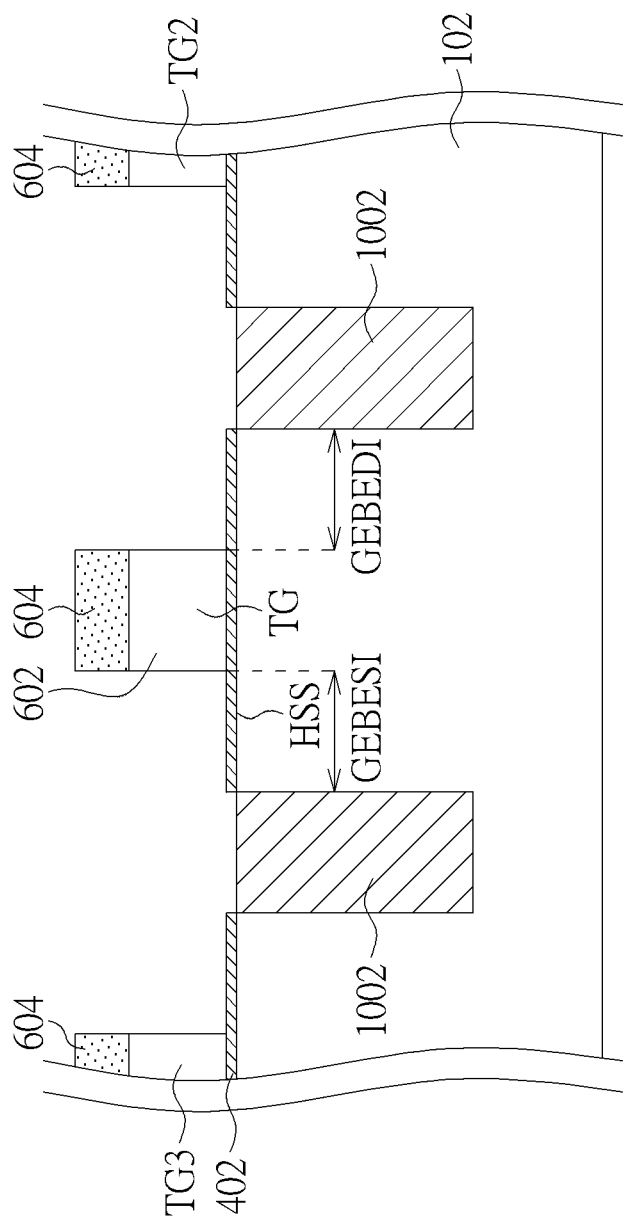
FIG. 10A is a diagram illustrating the gate mask layer being removed, the SOD being etched, and an oxide-2 layer being deposited to form a STI-oxide-2.
Figure 10B:
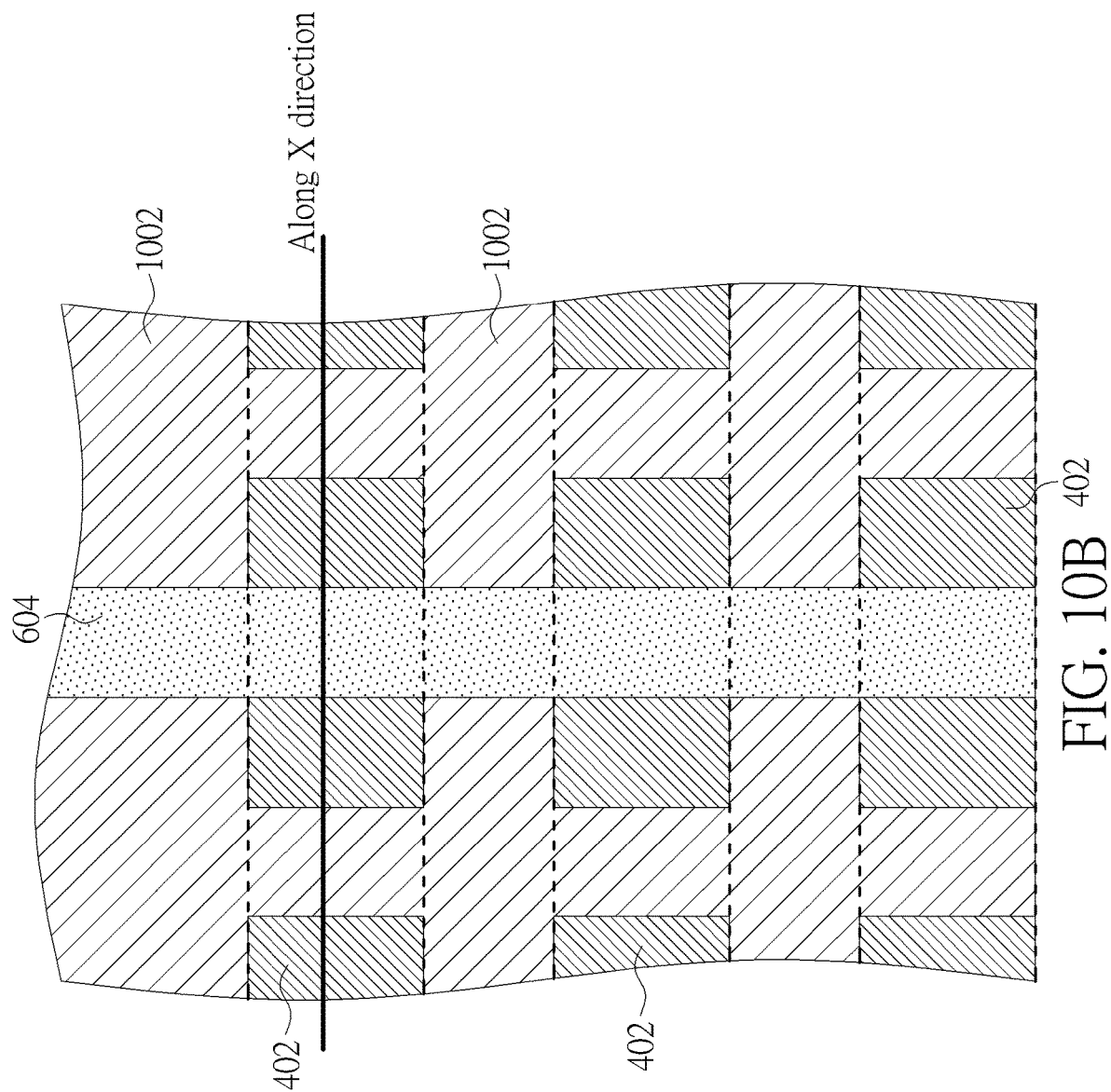
FIG. 10B is a diagram illustrating a top view of FIG. 10A and multiple fingers in horizontal direction.

In Step 218, as shown in FIG. 10A, the gate mask layer 802 and the SOD 702 are removed. Then the STI-oxide-2 layer 1002 is deposited to fill the trenches 902 and other vacancies on the HSS, and the STI-oxide-2 layer 1002 could be etched back to a surface level equal to the HSS. Therefore, the DSG which is temporarily formed is replaced by the STI-oxide-2 layer 1002 to define the boundary of the source/drain regions. Then any existing ways of forming lightly doped drains (LDDs), spacers surrounding the TG, the source region, and the drain region can be used to complete the mMOSFET, wherein the source region and the drain region would be formed respectively according to the precisely controlled GEBESI and the GEBEDI. In addition, FIG. 10B is the top view of FIG. 10A and shows multiple fins or fingers in horizontal direction.

Since a shape of an isolation region of a transistor and a position of the isolation region from the transistor to neighboring transistors could be quite varied (even from the above-mentioned embodiment), another structure invention on how to design an adaptive DSG by extending principles of the above-mentioned embodiment is described in the following.

Figure 11:
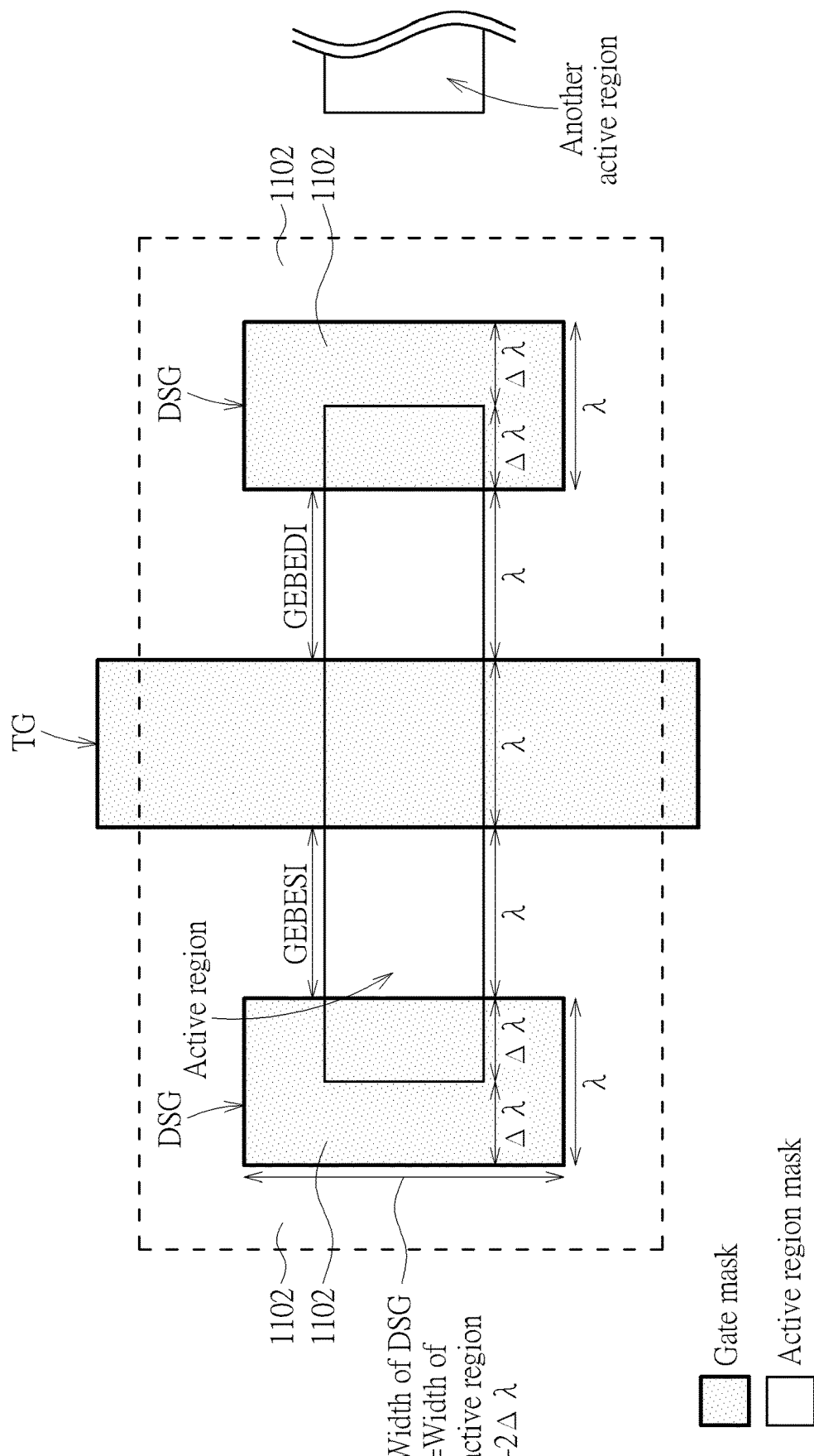
FIGS. 11-14 are diagrams illustrating misalignment behavior between a position of the true gate (TG) and a position of the dummy shield gate (DSG).

FIG. 11 shows a different geometric condition where active regions of neighboring transistors are laid out differently from FIG. 6A. For example, as shown in FIG. 6A, adjacent active regions of the neighboring transistors are made to be connected before the true gate (TG), true gate 2 (TG2), true gate 3 (TG3) and the dummy shield gate (DSG) are deposited, and then the DSG is used for dividing the connected active regions into individual precisely-targeted distance by a length of the DSG. But, as shown in FIG. 11, it is assumed that an active region on a source (or a drain) of a transistor is totally isolated (by isolation region 1102) from any other active regions before and after a TG of the transistor is defined. Therefore, what is proposed here is how to design both the active region on the source side and an adaptive DSG as described below (similarly for the drain). For example, if a final length of the GEBESI is targeted at λ (or any other targeted length L (S)), and then a length of an active region mask ("Δλ mask") corresponding to the GEBESI side should be designed to be equal to a sum of λ and Δλ (or a sum of the length L(S) and Δλ). Then on a gate mask, the DSG could have a shape as shown in FIG. 11, that is, a rectangular shape for the DSG has a length equal to λ and a width equal to a sum of a width of the active region and 2Δλ (each side shares 0.5Δλ, respectively). The designed distance between the TG and the DSG on the source side is still just the length of GEBESI, e.g. λ.

Figure 12:
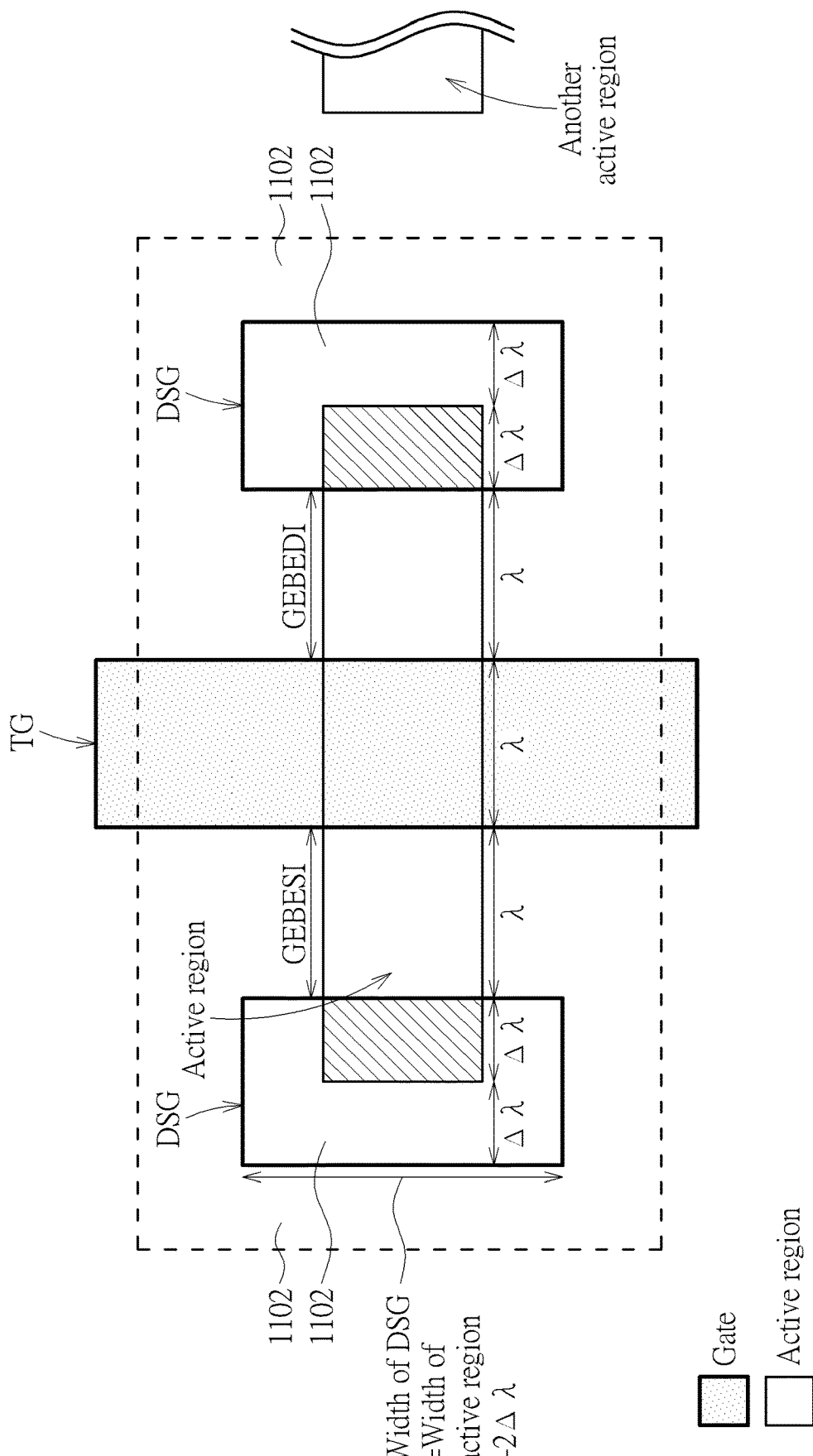

The result derived from mask levels of the active region and the gate of FIG. 11 onto wafer level is portrayed in FIG. 12. As shown in FIG. 12, when the TG is defined by the photolithographic masking technique, the DSG is made in parallel to the TG with a targeted distance (e.g. λ, such as 7 nm in the 7-nm process node) between the DSG and the TG. With a nominal processing result (that is, no significant misalignment is induced by the photolithographic processing), the DSG covers partially the active region (corresponding to the source) by a distance Δλ and both the TG and the DSG are printed on the top of the dielectric insulator 402 which covers the active regions. There are nitride-cap layers on the top of both the TG and the DSG.

Figure 13:
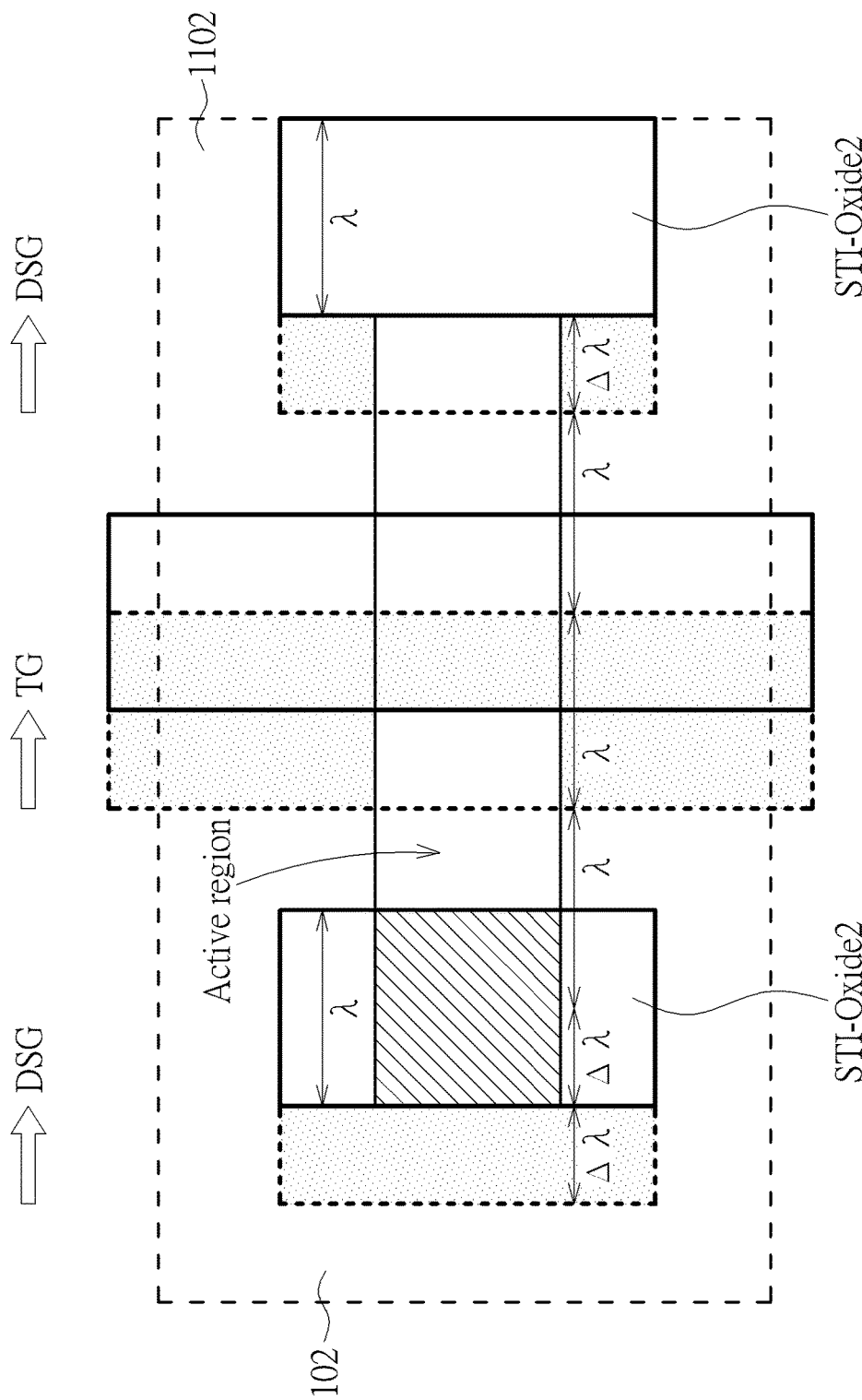
Figure 14:
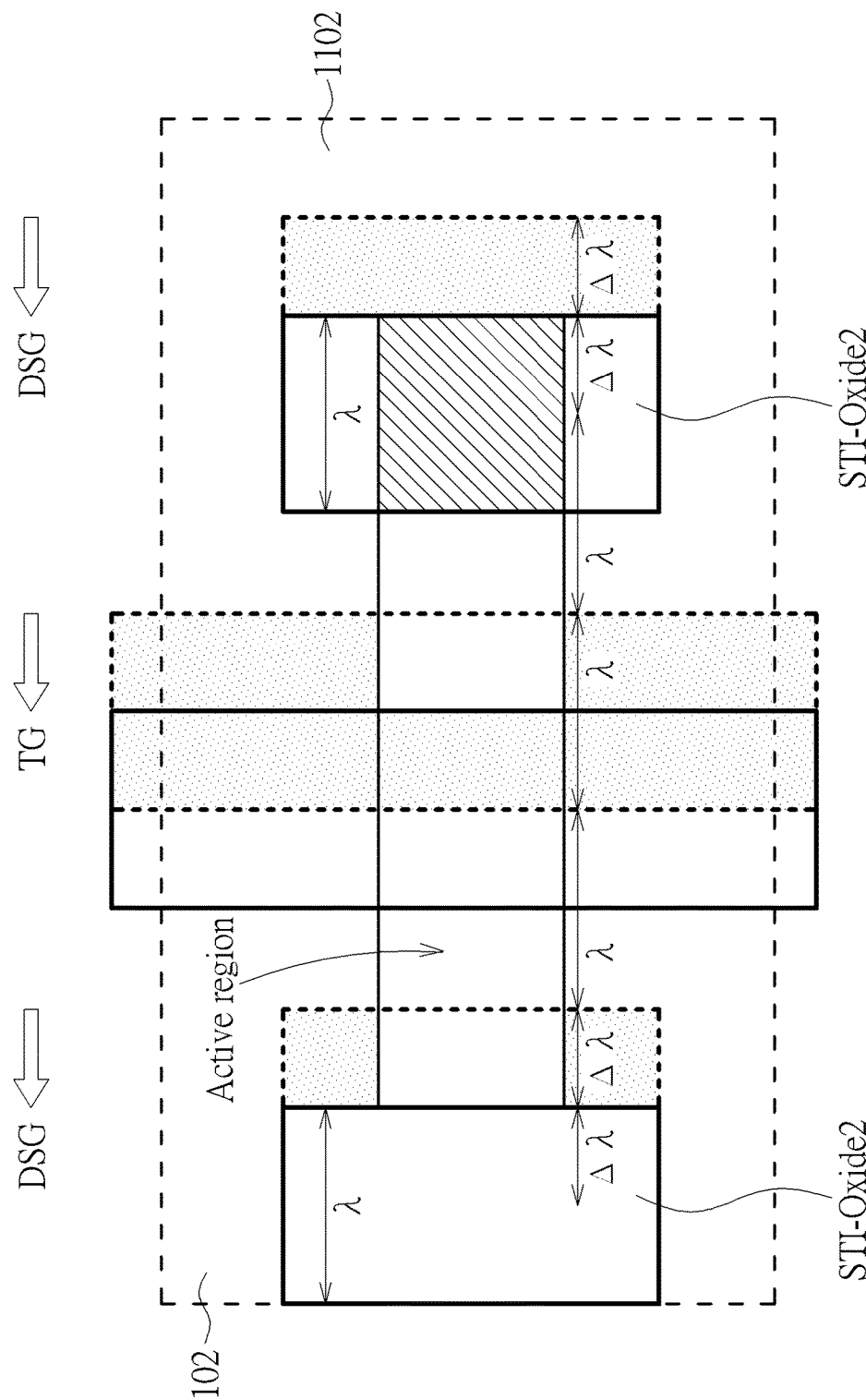

If the PMT causes a shift (e.g. Δλ) of both the TG and the DSG toward the right-hand side of the active region (FIG. 13), the subsequent processing to remove the DSG for achieving isolation region (i.e. STI-oxide-2) exactly at the location of this previously existing the DSG location as described by the aforementioned processing steps should result in the STI-oxide-2 layer with a length λ and the STI-oxide-2 layer turns out a physical geometry of the source region which has its GEBESI length equal to λ (since the distance between the TG and the DSG is designed to be equal to λ). On the other hand, if the PMT causes a shift (e.g. Δλ) of both the TG and the DSG toward the left-hand side of the active region (FIG. 14), the subsequent processing steps of removing the DSG and forming the STI-oxide-2 layer will result in the STI-oxide-2 layer with a length λ and the source region has still its GEBESI length equal to λ.

When the PMT causes undesirable shifts along the width direction (that is, up or down direction) of the active region, the design of such an adaptive dummy shield gate having the width of the sum of the width of the active region and 2Δλ should not affect the geometric dimensions of the active region. The novel design of using the adaptive dummy shield gate can always result in the STI-oxide-2 with the length λ and the length of the GEBESI fit to the designed target (e.g. as narrow as λ). The present invention can surely be applied to all varied shapes of isolation regions, source and drain with their individual targeted lengths, respectively.

After disclosing how both GEBESI and GEBEDI can be optimally designed and fabricated to a precisely controlled small dimension (which can be as small as λ), another new invention is how to create a smaller dimension (called as length C-S(L) and length C-D(L), respectively, as defined in FIG. 1D of the contact-hole openings than the lengths of GEBESI and GEBEDI, respectively. Two designs and the process formations are described in the following.

Figure 15A:
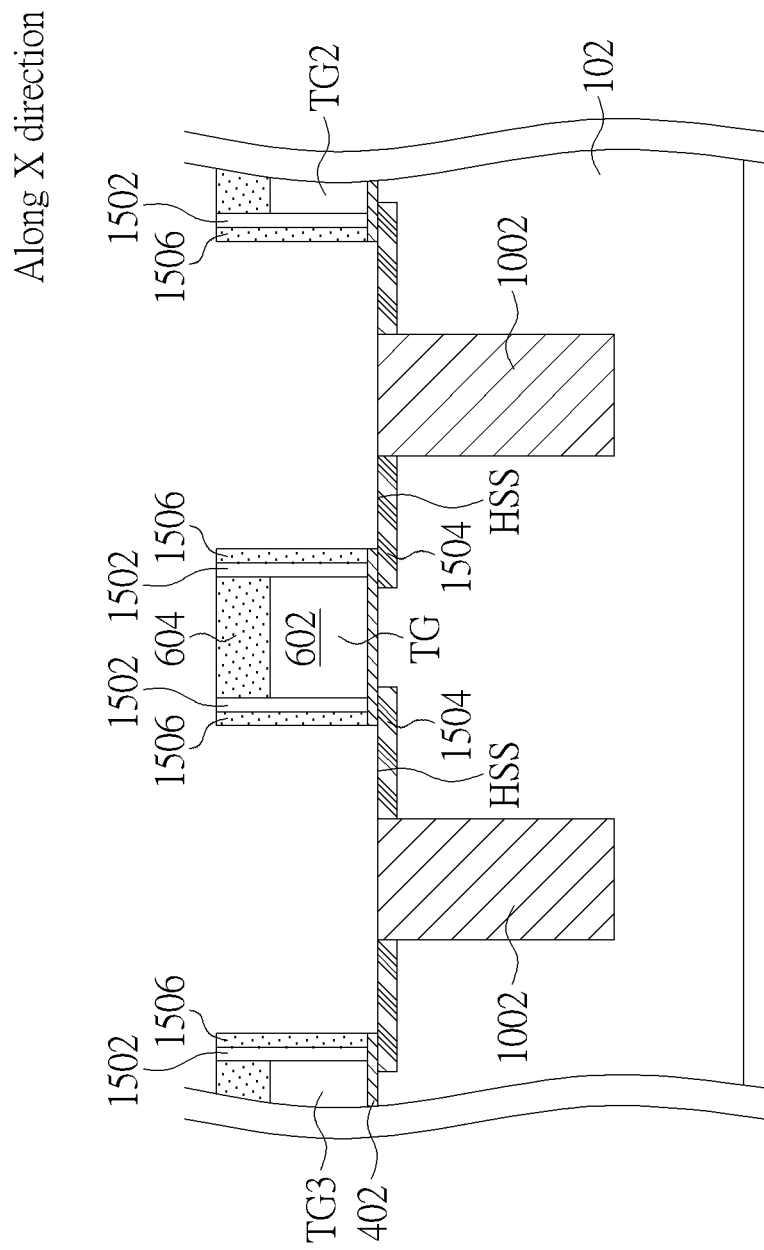
FIG. 15A is a diagram illustrating the oxide-3 layer being deposited and etched to form the oxide-3 spacer, the lightly Doped drains (LDDs) being formed in the p-type substrate, the nitride layer being deposited and etched back to form the nitride spacer, and the dielectric insulator being removed.
Figure 15B:
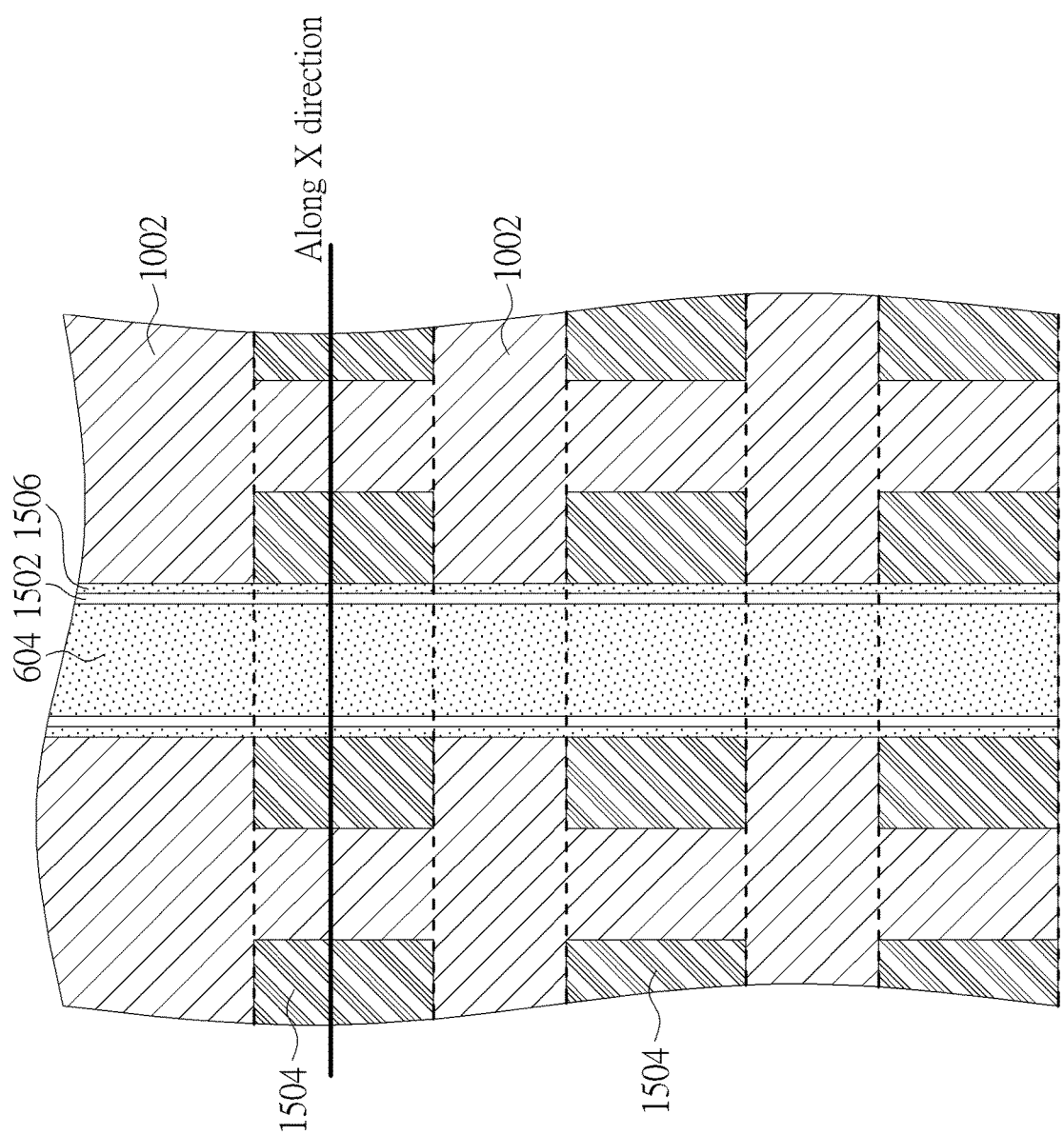
FIG. 15B is a diagram illustrating a top view of FIG. 15A and multiple fingers in horizontal direction.

By continuing the implementation as up to FIG. 10A, and utilizing the TG to explain in the following, in Step 220, as shown in FIG. 15A, the oxide-3 layer is deposited and etched back to form the oxide-3 spacer 1502, wherein the oxide-3 spacer 1502 covers the TG. Then, lighted doped zones are formed in the substrate 102 and rapid thermal annealing (RTA) is performed on the lighted doped zones to form the lightly Doped drains (LDDs) 1504 next to the TG. Then the nitride layer is deposited and etched back to form the nitride spacer 1506, wherein the nitride spacer 1506 covers the oxide-3 spacer 1502. The dielectric insulator 402 not covered by the nitride spacer 1506 and the oxide-3 spacer 1502 is removed. In addition, FIG. 15B is the top view of FIG. 15A and shows multiple fins or fingers in horizontal direction.

Figure 16A:
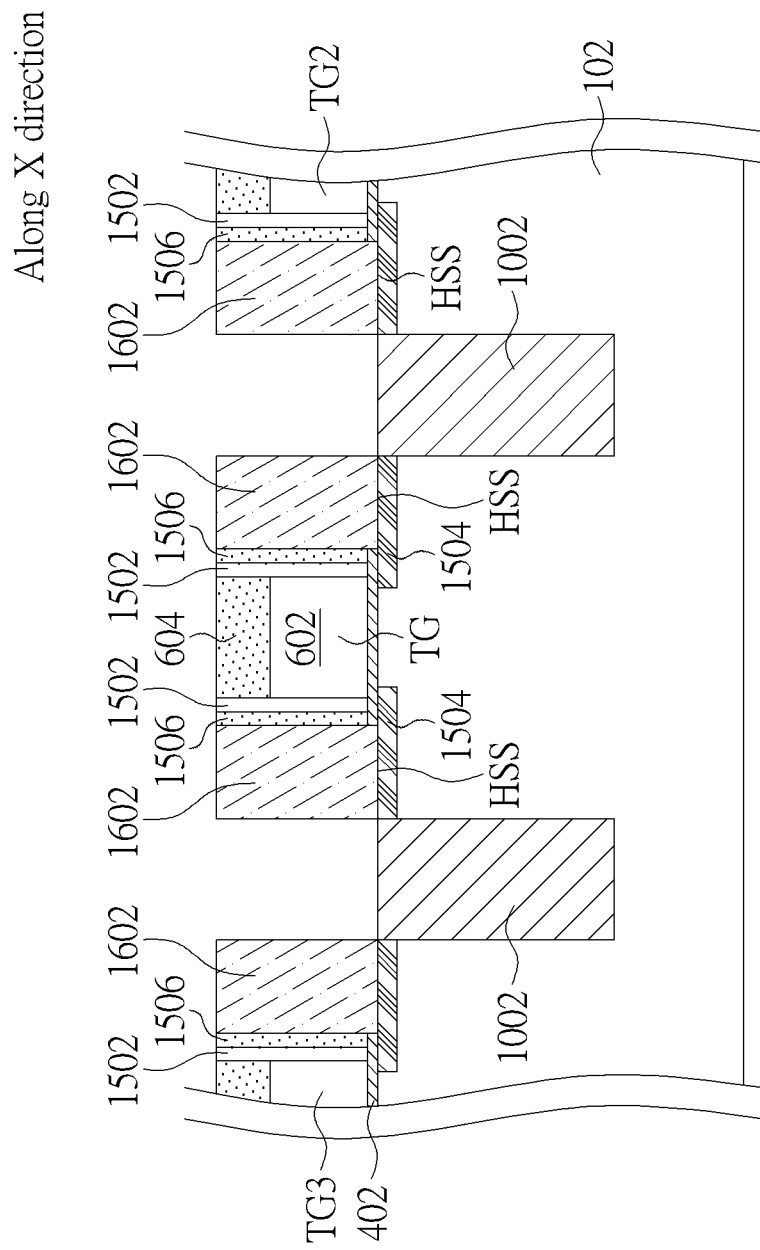
FIG. 16A is a diagram illustrating the intrinsic silicon being grown by the selective epitaxy growth (SEG) technique.
Figure 16B:
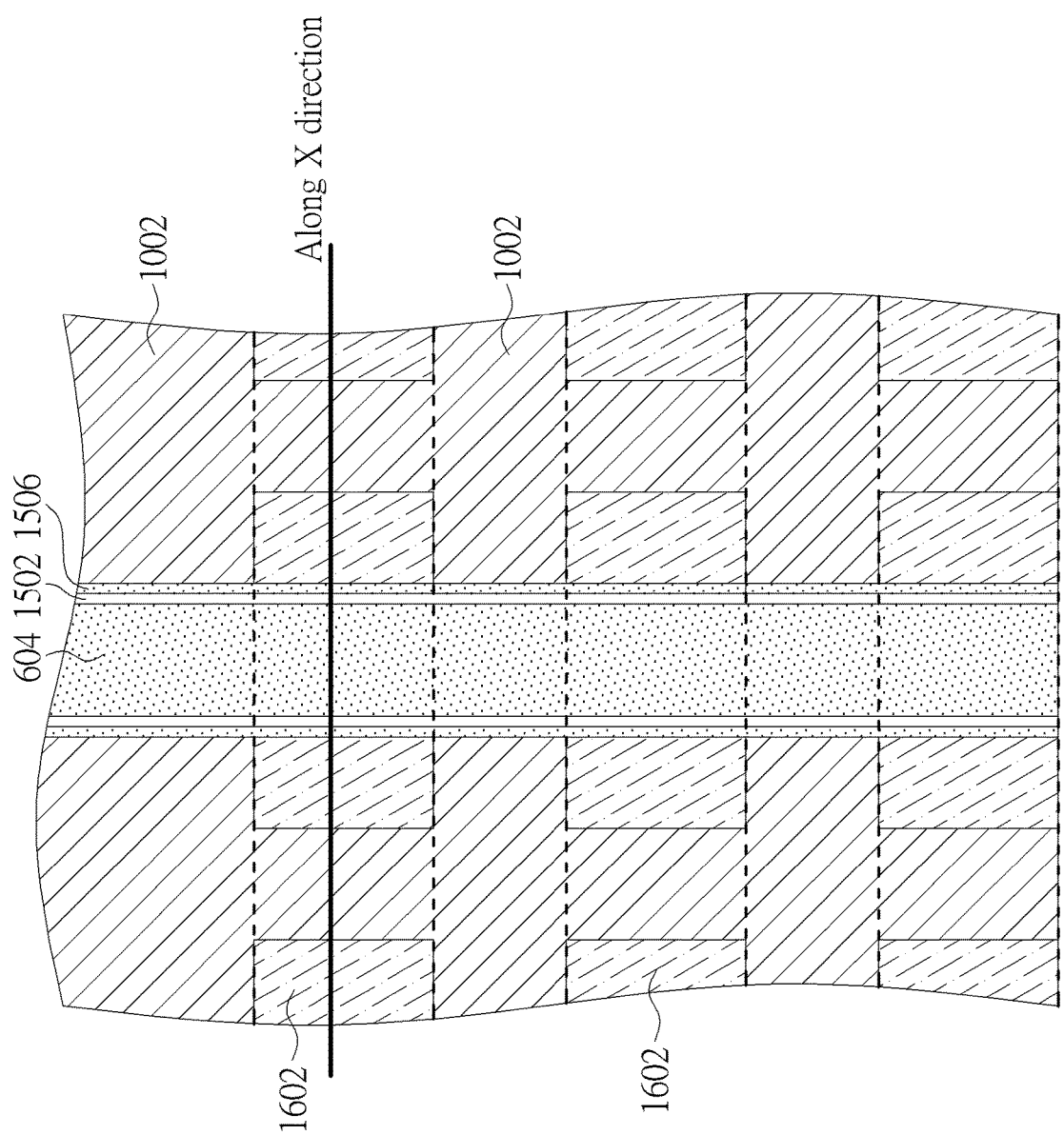
FIG. 16B is a diagram illustrating a top view of FIG. 16A and multiple fingers in horizontal direction.

In Step 222, as shown in FIG. 16A, by utilizing the exposed HSS as silicon growing seeds, the selective epitaxy growth (SEG) technique is utilized to grow the intrinsic silicon 1602 only above the exposed HSS to a height as tall as the top of the nitride layer 604 (over a top of the TG). In addition, FIG. 16B is the top view of FIG. 16A and shows multiple fins or fingers in horizontal direction.

Figure 17A:
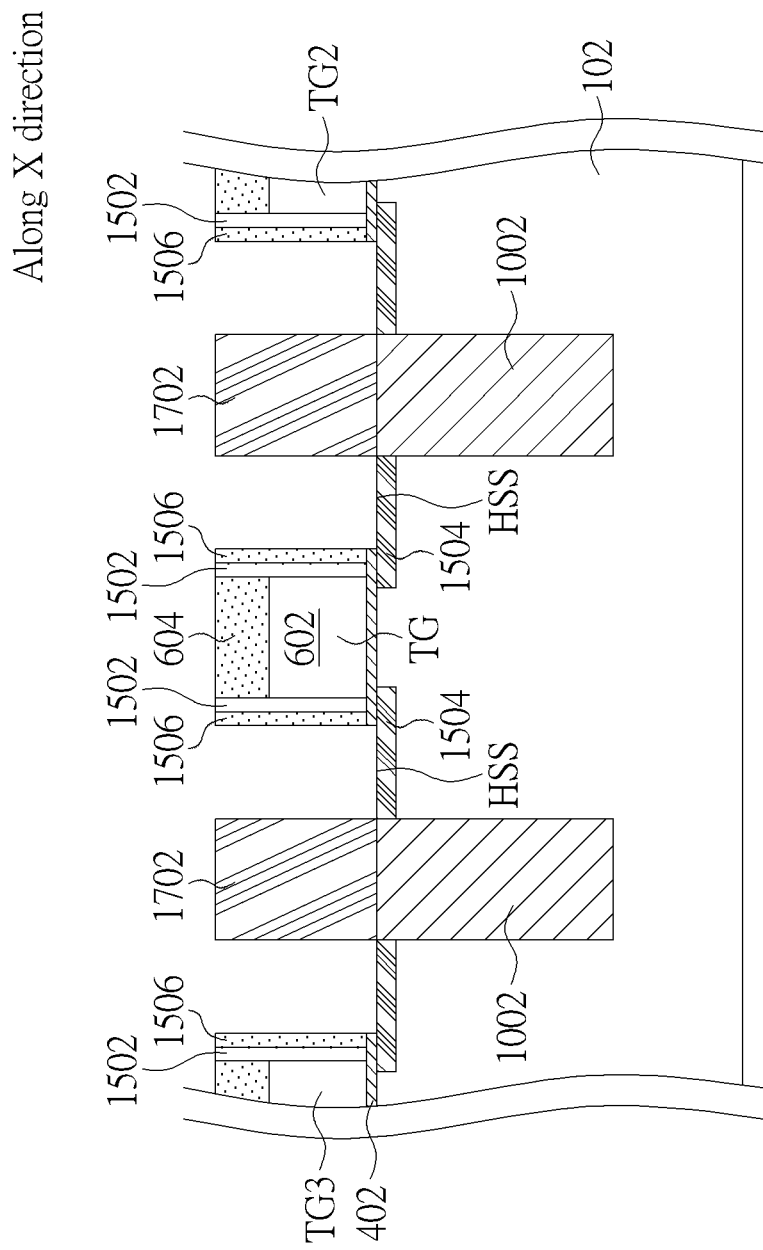
FIG. 17A is a diagram illustrating the CVD-STI-oxide-3 layer being deposited and etched back, and the intrinsic silicon being removed.
Figure 17B:
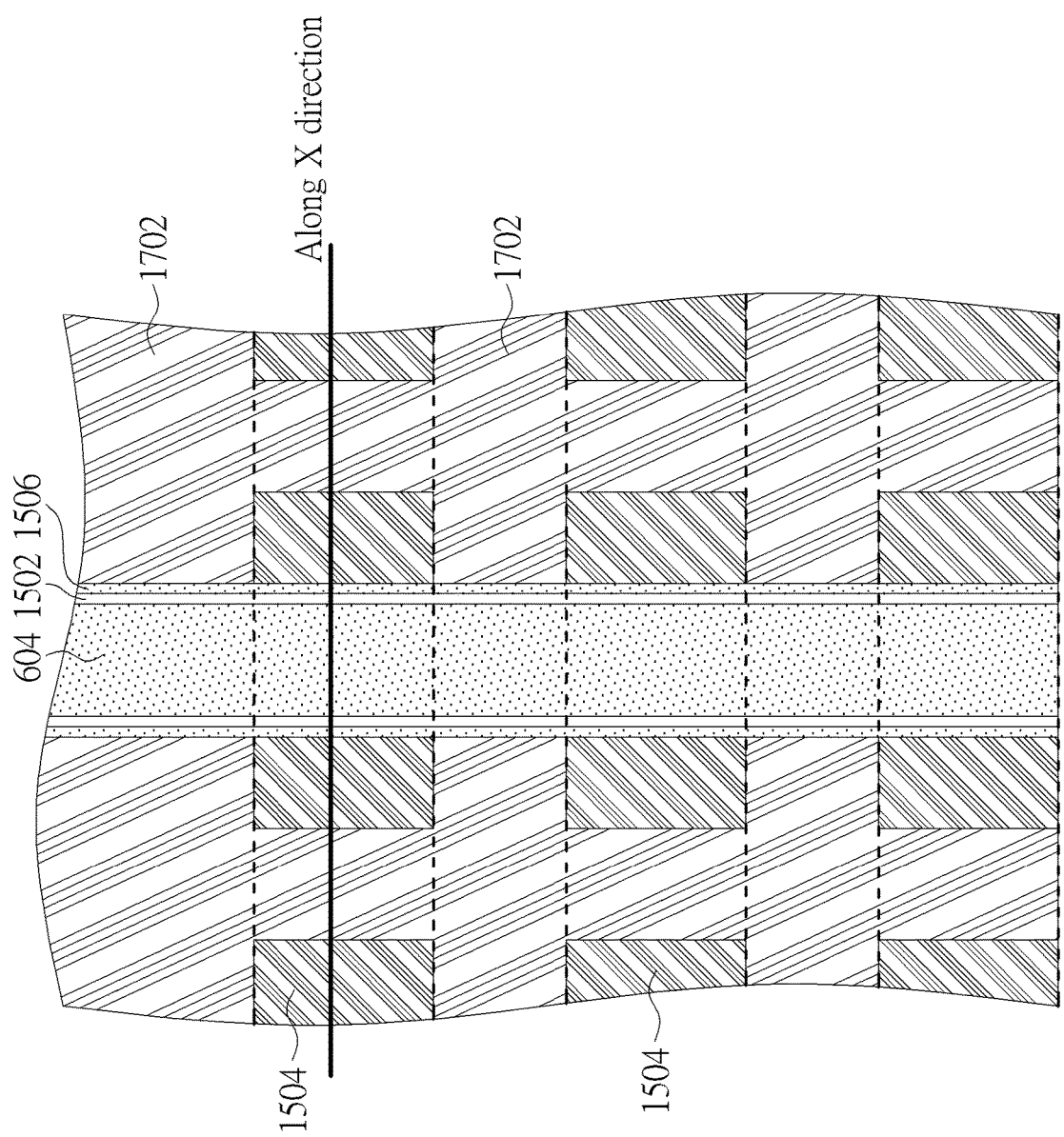
FIG. 17B is a diagram illustrating a top view of FIG. 17A and multiple fingers in horizontal direction.

In Step 224, as shown in FIG. 17A, the CVD-STI-oxide-3 layer 1702 is deposited to fill all vacancies and planarized by the CMP technique to achieve a planar surface leveled up to the top of nitride layer 604 which is over the top of the TG. Then the intrinsic silicon 1602 is removed so as to expose the HSS corresponding to source and drain regions which are surrounded by the CVD-STI-oxide-3 layer 1702 and the nitride spacer 1506. In addition, FIG. 17B is the top view of FIG. 17A and shows multiple fins or fingers in horizontal direction.

Figure 18A:
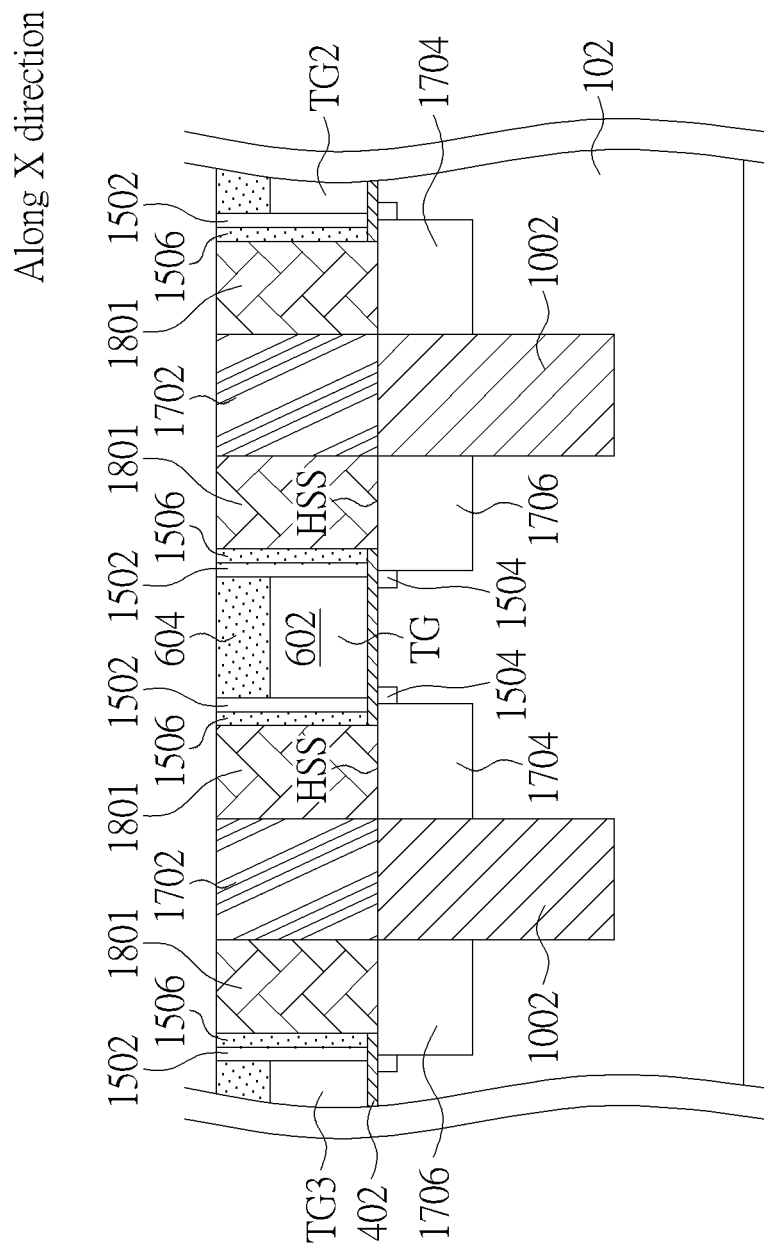
FIG. 18A is a diagram illustrating the SOD being deposited and etched back, and the source (n+ source) and the drain (n+ drain) of the mMOSFET being formed.
Figure 18B:
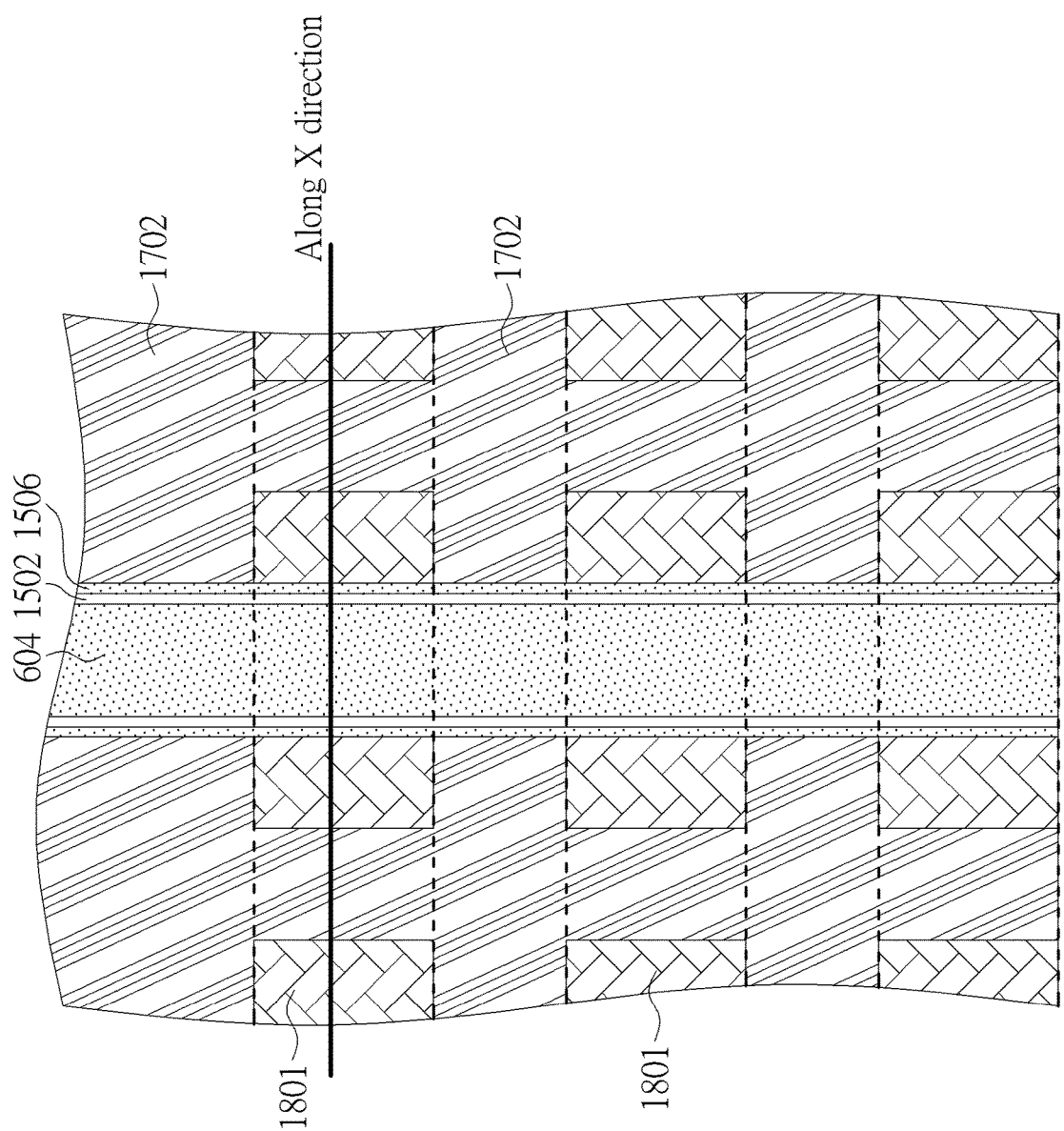
FIG. 18B is a diagram illustrating a top view of FIG. 18A and multiple fingers in horizontal direction.

In Step 226, as shown in FIG. 18A, any ways of forming the source (n+ source) region 1704 and the drain (n+ drain) region 1706 of the mMOSFET within the substrate 102 (or well) can be carried out to achieve flat surfaces of the source region 1704 and the drain region 1706 leveled up to the HSS. Then, the SOD 1801 is deposited to fill the vacancies on the wafer, and then use CMP to make the surface flat including the nitride layer 604 over the gate TG, spacers surrounding the gate TG, and the SOD 1801 above both the source region 1704 and the drain region 1706. In addition, FIG. 18B is the top view of FIG. 18A and shows multiple fins or fingers in horizontal direction.

Figure 19:
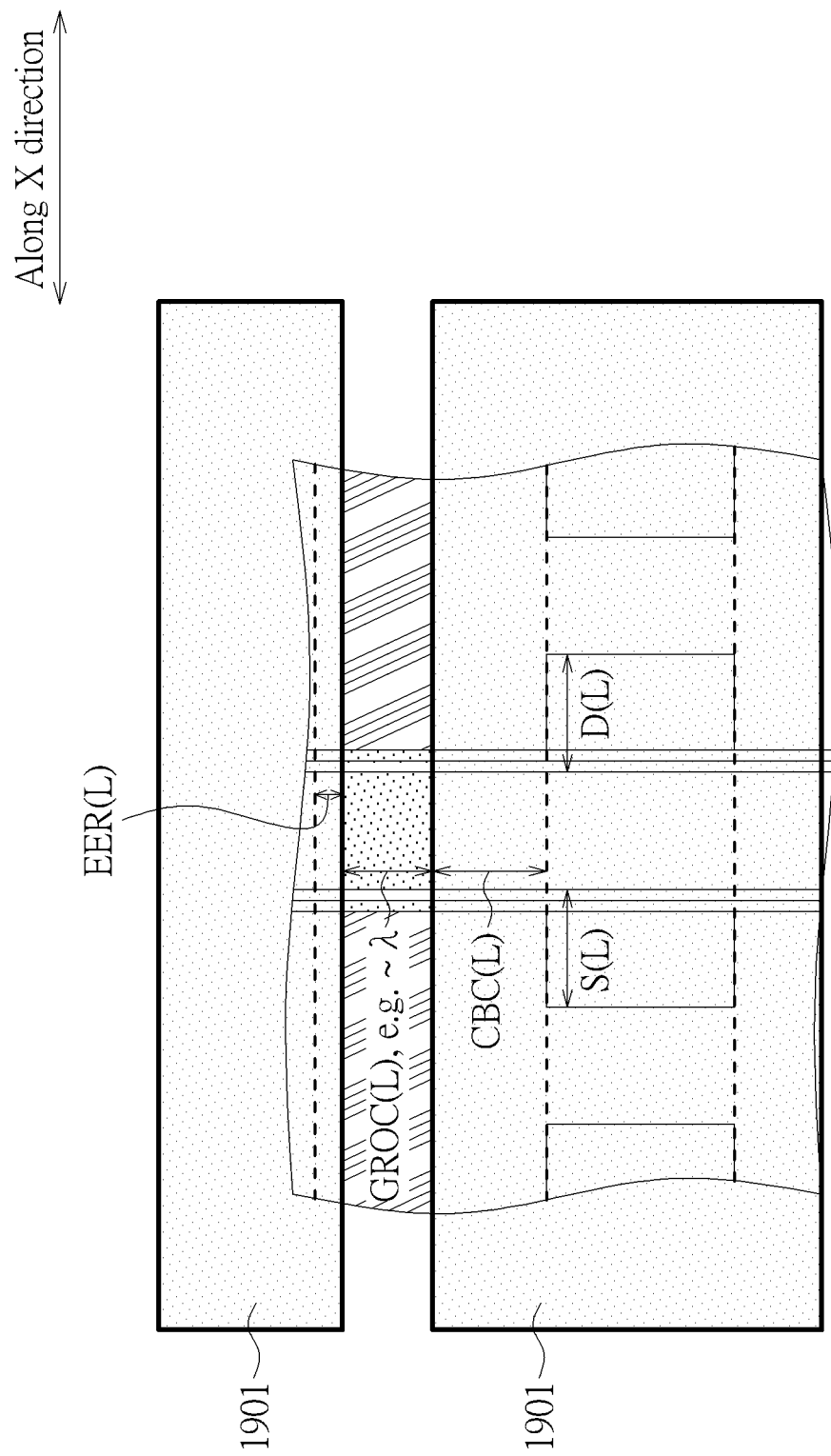
FIG. 19 is a diagram illustrating the photo resistance being deposited.

The following steps are to proceed forming contact-hole openings on the gate structure of the mMOSFET, specifically on an area of CRMGAC (defined in FIG. 1D). In Step 228, as shown in FIG. 19, use a well-designed mask (CG mask, i.e. connection to gate mask) to define the photoresist layer 1901 which results in some stripe patterns (along the X-direction shown in FIG. 19) with a separate space of GROC(L) which cover areas of the CBC(L) and the EER(L), respectively, but expose an area of the GROC with a designed distance CRMG(L). If under a nominal photolithographic processing method without any significant PMT, then the result is shown as a top view in FIG. 19. For example, herewith assumes the most aggressive design rules with the GROC(L)=Lamda ($\lambda$); it is very important to notice that the GROC (L) should be designed to have approximately equal length like the length S(L) of the source region and the length D(L) of the drain region, respectively, so that by the later processing results the lengths of contact-hole openings on the gate structure, the source region, and the drain region can be achieved to have almost the same sizes for the metal-1 layer with a well-designed enough thickness to completely fill into the contact-hole openings.

Figure 20A:
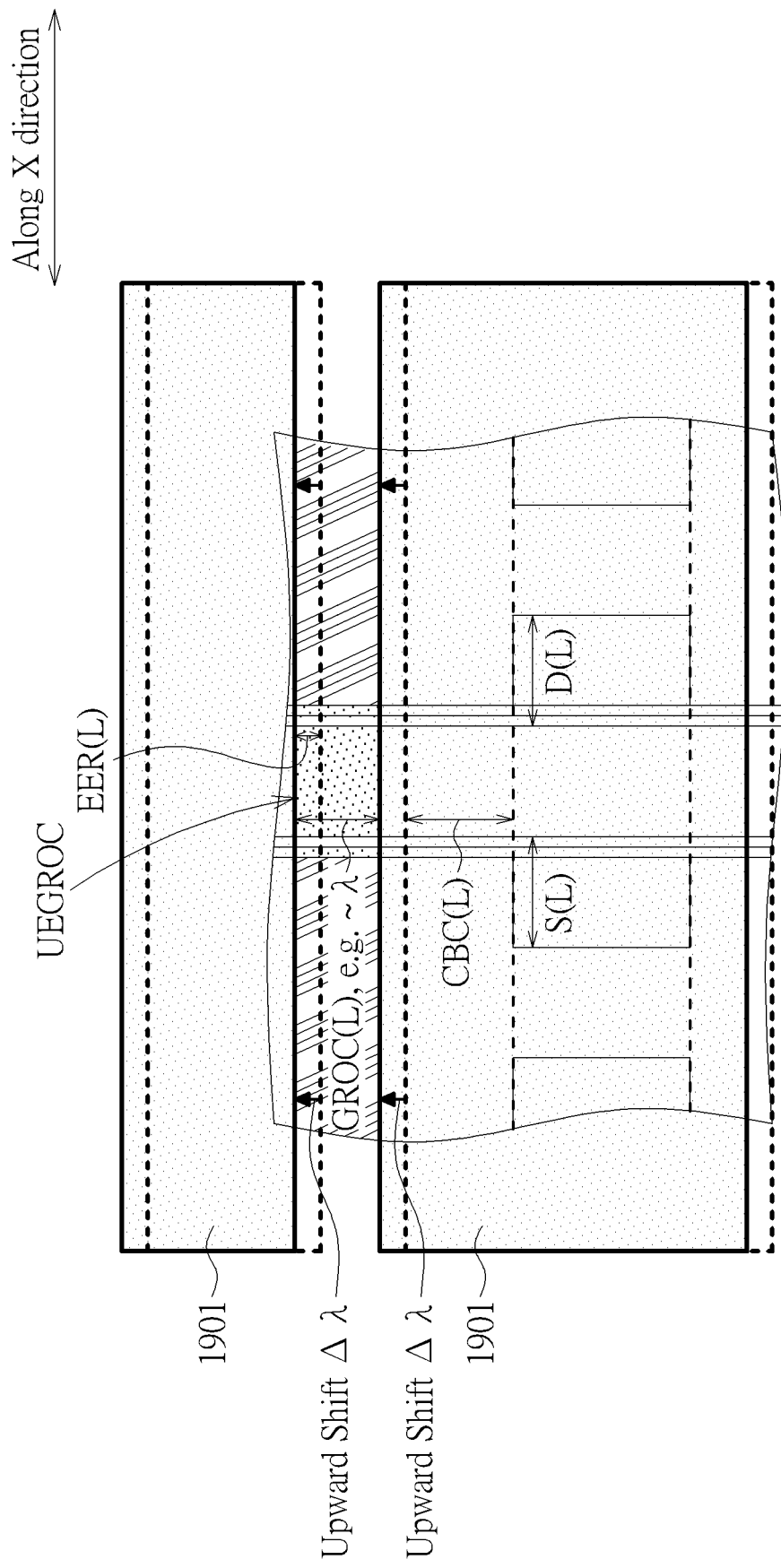
FIGS. 20A, 20B are diagrams illustrating two possible scenarios of FIG. 19.
Figure 20B:
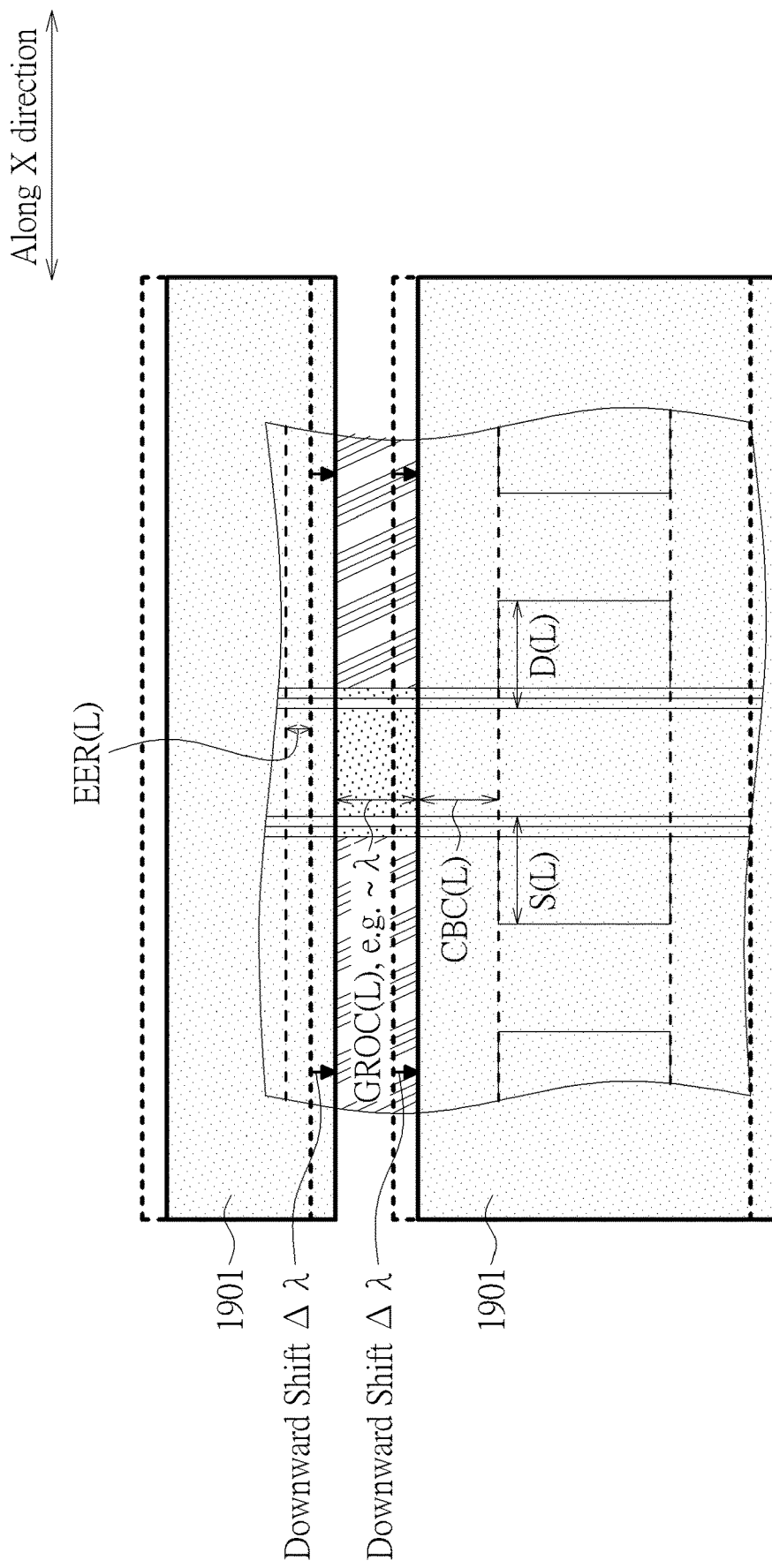

FIGS. 20A, 20B shows two possible scenarios, respectively: (a) if the CG photolithographic masking step results in a shift of the PR mask upward by a Delta-Lamda ($\Delta\lambda$) due to PMT, then an upper edge of GROC (called as UEGROC) could exactly cover up the EER; (b) if the CG masking effect results in a shift of the PR mask downward by a Delta-Lamda ($\Delta\lambda$) due to PMT, then the GROC is closer to the channel region but does not disturb the channel region since there is a reserved distance CBC(L). The important point of the present invention is to keep the GROC (L) just like the designed target without being affected by any PMT and almost equal to the length S(L) of the source region and the length D(L) of the drain region, respectively.

Figure 21:
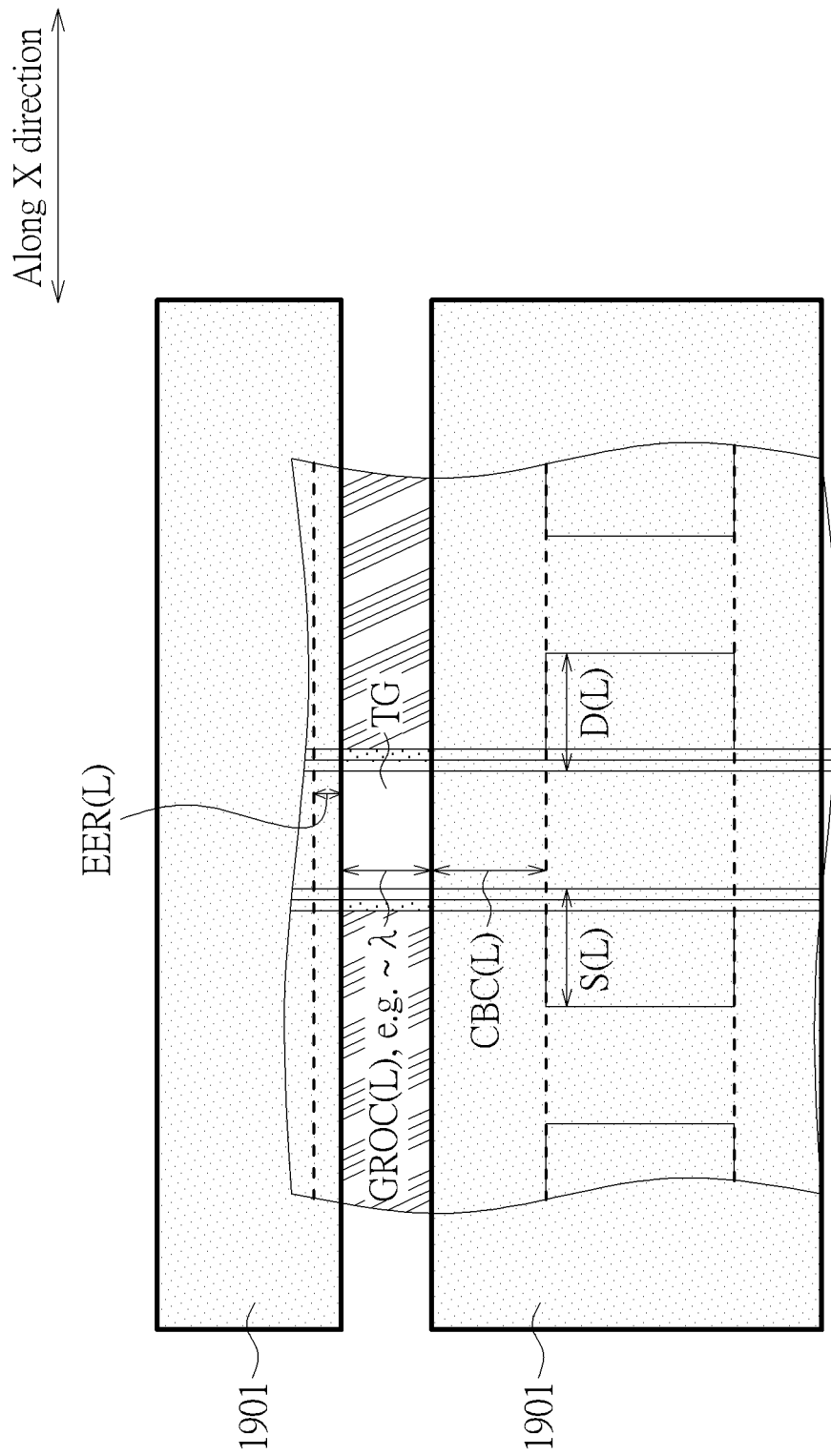
FIG. 21 is a diagram illustrating the nitride layer within the GROC being removed to expose the TG.

In Step 230, as shown in FIG. 21, use the anisotropic etching technique to remove the nitride layer 604 within the GROC to expose the true gate (TG) which shows the conductive metal-gate layer. Thus, it is clear that the photoresist layers 1901 in FIG. 19 forms a mask pattern (like a stripe pattern between two the photoresist layers 1901 in FIG. 19) to define the contact hole opening or the concave to reveal the true gate. However, the mask pattern only defines one dimension length of the contact hole opening (e.g., the vertical length in FIG. 19). The shape of the mask pattern (such as, the stripe pattern) is different from the shape of the first concave (such as, rectangle-like or square-like shape).

In conventional contact-hole mask used in the semiconductor manufacture process, there are lots of contact mask patterns each of which is rectangle-like or square-like shape, and those contact mask patterns will be reproduced based on photolithographic process to define the two dimension lengths of the contact hole openings. As the shrink of the minimum feature size, extreme ultraviolet lithography (EUV), complicated etching technologies, exhausted contact-hole opening and extreme tight design rules are required to avoid the misalignment issues. Nevertheless, in the present invention, the mask pattern only defines one dimension length of the contact hole opening (e.g., the vertical length in FIG. 19), and has nothing to do with another dimension length of the contact hole opening. The another dimension length of the contact hole opening is defined or controlled by the self-alignment processes described previously. Thus, the misalignment issues could be better controlled.

Figure 22A:
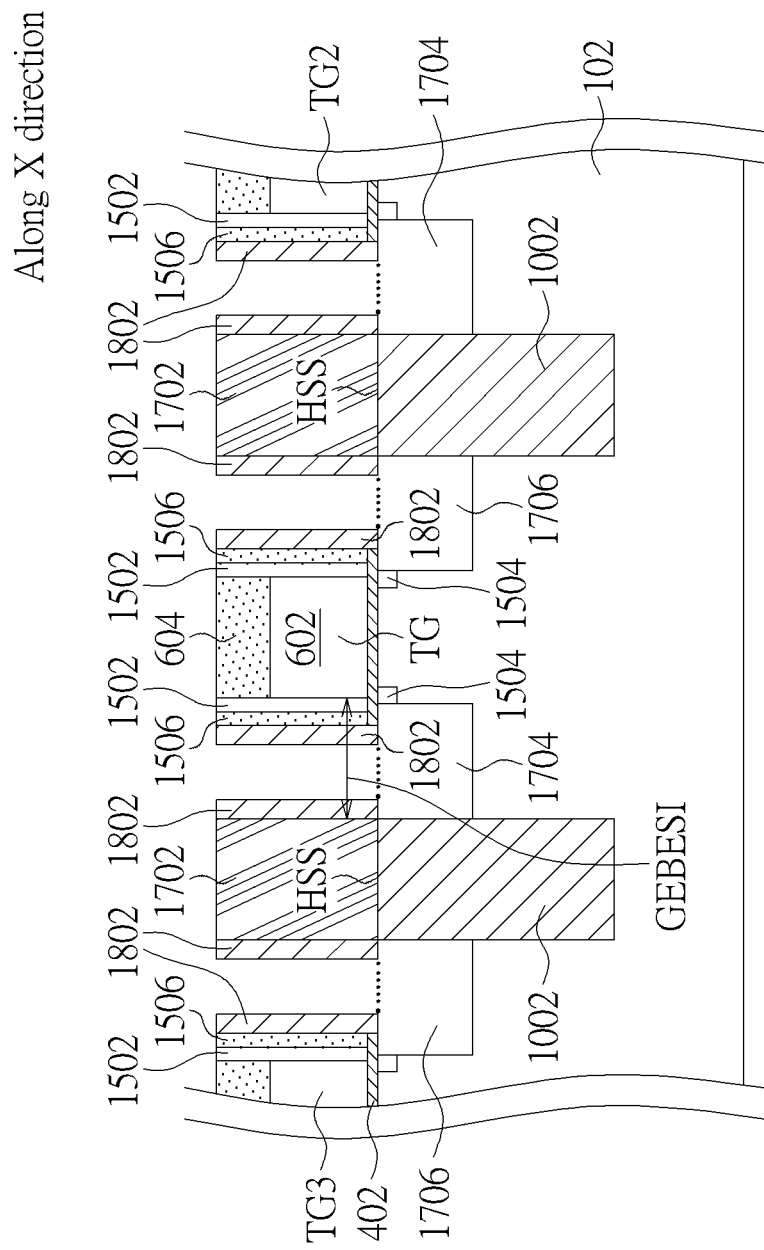
FIG. 22A is a diagram illustrating the photo resistance being removed, the SOD being removed, and the oxide spacer being deposited and etched to form contact-hole openings above the source region and the drain region.
Figure 22B:
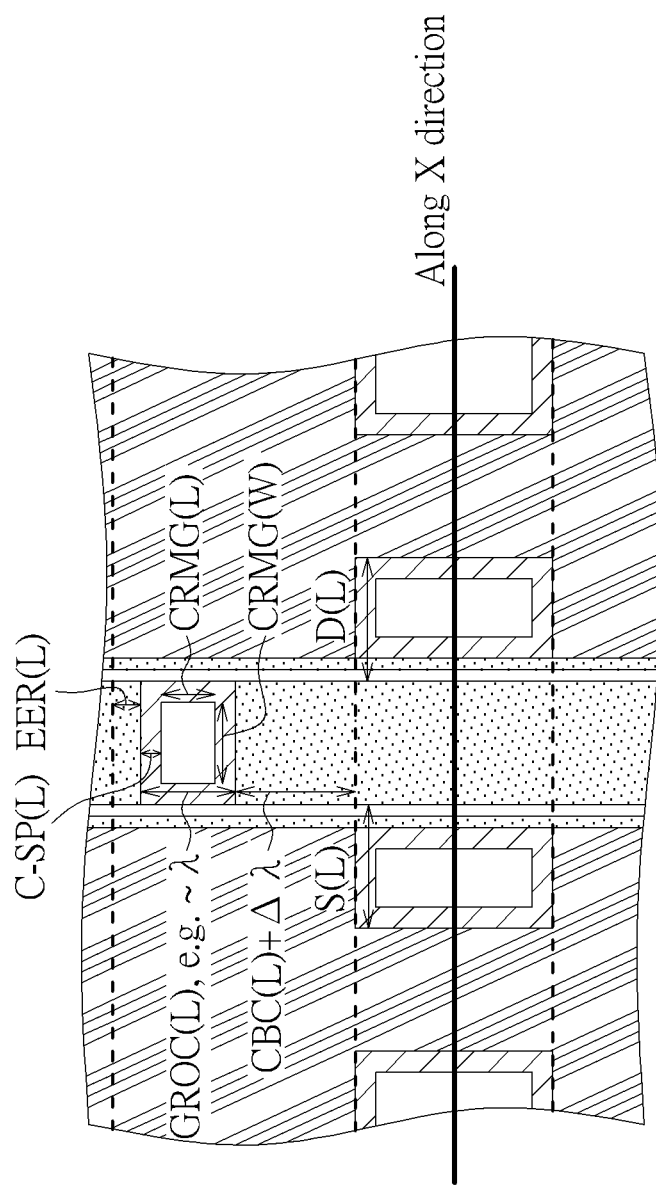
FIG. 22B is a diagram illustrating a top view of the structure of the mMOSFET in FIG. 22A.

In Step 232, as shown in FIG. 22A, remove the photoresist layer 1901, and then remove the SOD 1801 so that the concave regions on top of the source region 1704, the drain region 1706, and the GROC are exposed. Deposit the oxide layer 1802 with well-designed thickness and then use the anisotropic etching technique to form spacers on the four sidewalls in the concave regions on top of the source region 1704, the drain region 1706, and the GROC, wherein a width of each of the spacers is labeled as C-SP(L). Therefore, a natural built-up contact-hole opening is formed on the source region 1704, the drain region 1706, and the GROC, respectively. In addition, FIG. 22A shows a cross section of a structure of the mMOSFET, especially focusing on contact-hole openings on extension area of the gate structure, the source region 1704, and the drain region 1706, respectively. In addition, FIG. 22B shows top view of the structure of the mMOSFET in FIG. 22A.

As shown in FIG. 18A, when the SOD 1801 is removed to form the concave regions and expose both the source region 1704 and the drain region 1706, the concave regions exposing the source region 1704 and the drain region 1706 are surrounded by walls of the CVD-STI-oxide-3 layer 1702 and a Wall of the TG which already includes the oxide-3 spacer 1502 and the nitride spacer 1506. Therefore, in another embodiment of the present invention, the oxide layer 1802 covering four sidewalls of the concave regions in FIG. 22A could be omitted, so is the oxide layer 1802 covering the opening exposing the gate structure in FIG. 22B.

Figure 23A:
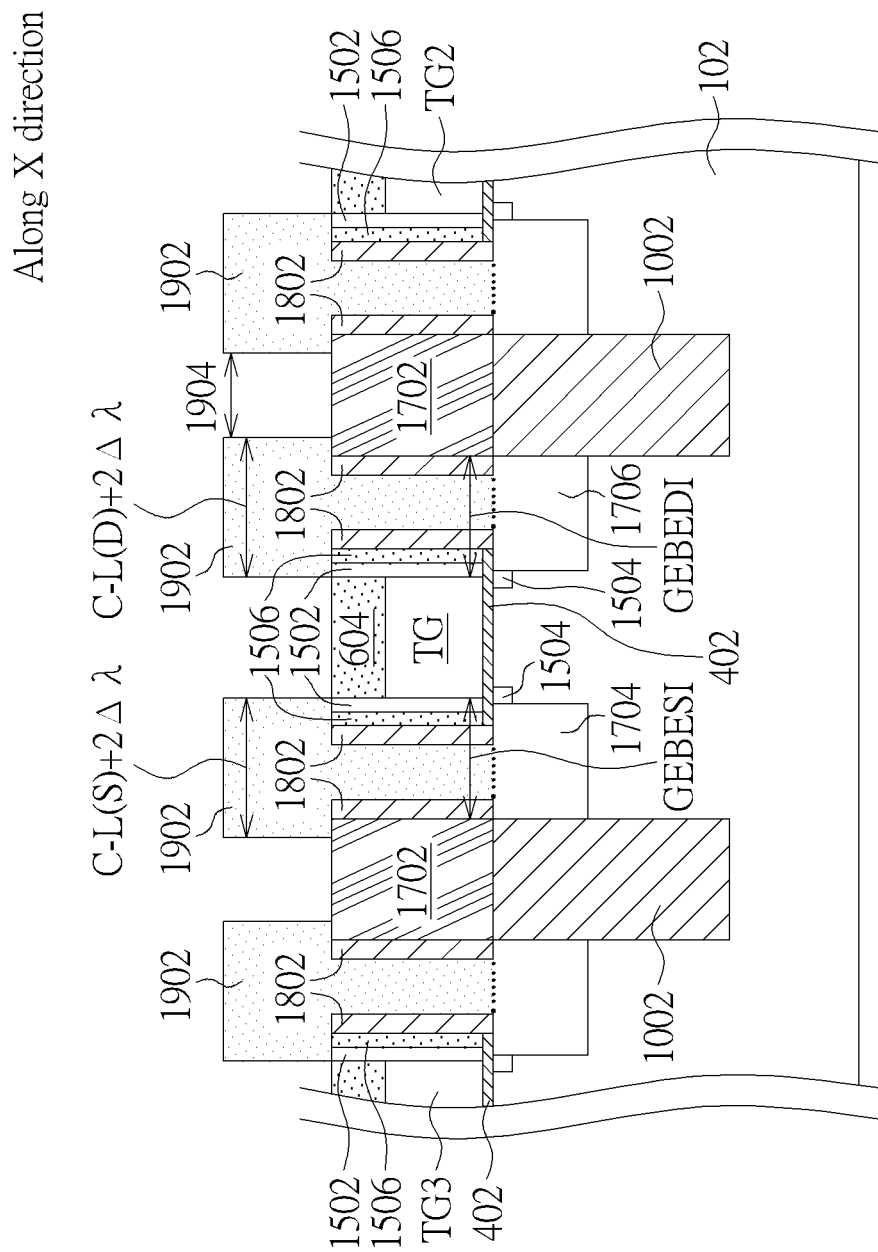
FIG. 23A is a diagram illustrating the metal-1 layer being deposited and etched to form the metal-1 interconnections.

In Step 234, as shown in FIG. 23A, form the metal-1 layer 1902 which has the well-designed thickness to fill in the holes of all the aforementioned contact-hole openings and result in a smooth planar surface following the topography of the wafer surface. Then, use the photolithographic masking technique to create all the connections among those contact-hole openings respectively to achieve the necessary metal-1 interconnection networks (shown in FIG. 23A and FIG. 23B). If the length or width of the contact hole opening is the same or smaller than two times of a thickness of metal connection layer, the contact hole opening or concave will be easily filled with the metal-1 material during the formation of the metal-1 layer. Thus, the traditional plugs in the contact holes and the metal-1 interconnection could be formed simultaneously in the present invention.

Figure 23B:
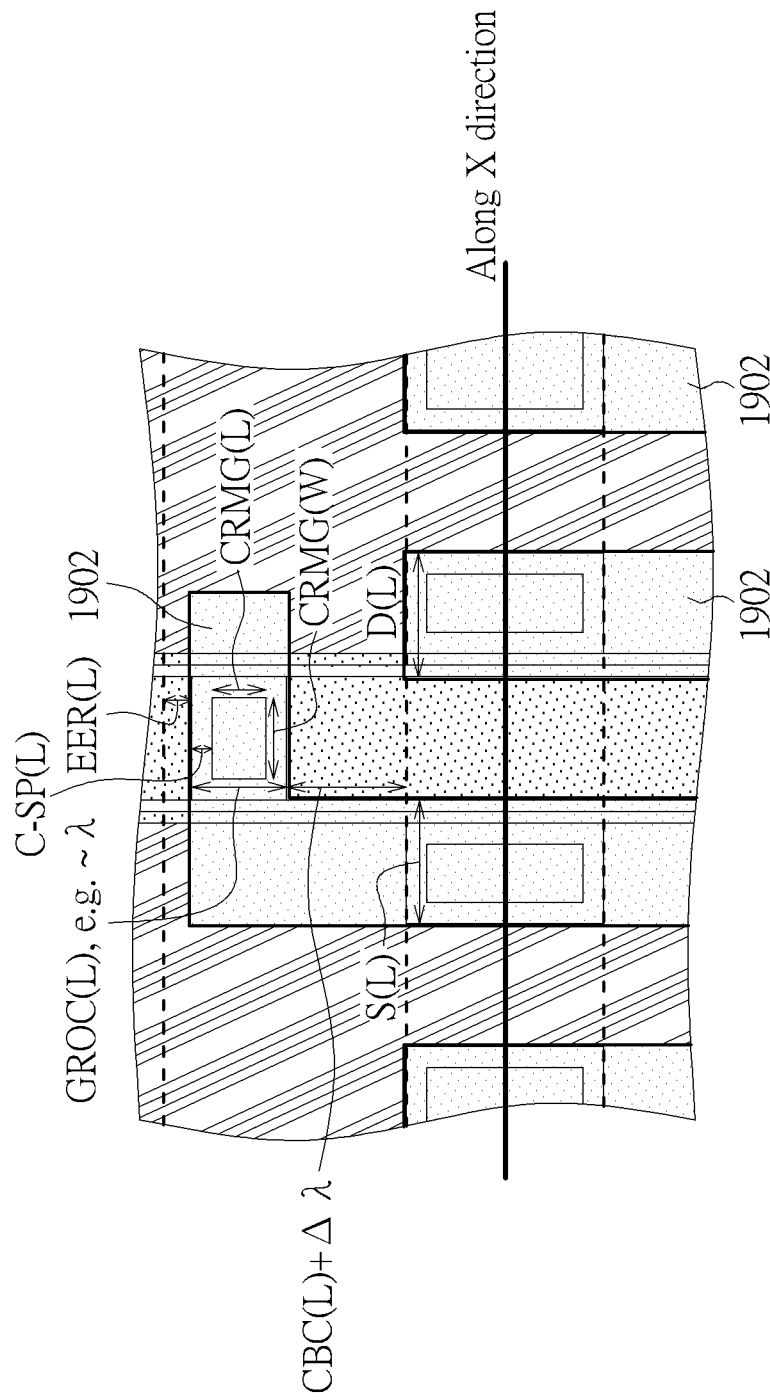
FIG. 23B is a diagram illustrating a top view of the mMOSFET shown in FIG. 23A.

As shown in FIG. 23A, the metal-1 layer 1902 must have a width fully covering the contact-hole opening and reserving any unavoidable PMT in a precisely controlled dimension. That is, the width of the metal-1 layer 1902=the length C–S(L) of the contact-hole opening (above the source region, i.e. the source region 1704) plus $2\Delta\lambda$, and equally on the contact-hole opening above the drain region, the length C–D(L) of the contact-hole opening plus $2\Delta\lambda$, respectively. That is, the width of the metal-1 layer 1902 could be equal to a length of the concave region plus the length of the gate structure in order to fully cover the contact-hole opening under unavoidable PMT). In addition, a minimum space 1904 between two nearest metal-1 interconnections should not be smaller than λ. In addition, as shown in FIG. 23A, the metal-1 layer 1902 fills in the concave region and contacts the source region 1704 (the drain region 1706), wherein the metal-1 layer 1902 extends upward from the source region 1704 (the drain region 1706) to a predetermined position which is higher than the top of the nitride layer 604 (i.e. the nitride-cap layer). Therefore, the metal-1 layer 1902 completes the tasks of achieving both the contact-filling and the plug-connection to both the gate structure and the source/the drain regions as well as a direct interconnection function of connecting all transistors. There is no need to use an expensive and very rigidly controlled conventional contact-hole mask and carrying on the subsequent very difficult process of drilling the contact-hole openings, especially which should be the most difficult challenges in further scaling down the horizontal geometries of billions of transistors. In addition, it eliminates making both a metal plug into the contact-hole openings and the CMP technique to achieve a metal stud with complex integrated processing step (e.g. as definitely required for some leading-edge technology of creating a Metal-Zero structure). Furthermore, in the present invention, all the contact-hole openings on the gate structure and the source/the drain regions are all made within those regions and their structures have smaller geometries without being made on top of the surrounding oxide isolation regions (thus not only achieving narrow contact-hole opening but also allowing the STI regions without be affected by the contact-hole opening especially very narrow separations for STI are required when the technology needs to be further scaled). In addition, FIG. 23B is the top view of the mMOSFET shown in FIG. 23A.

Figure 24:
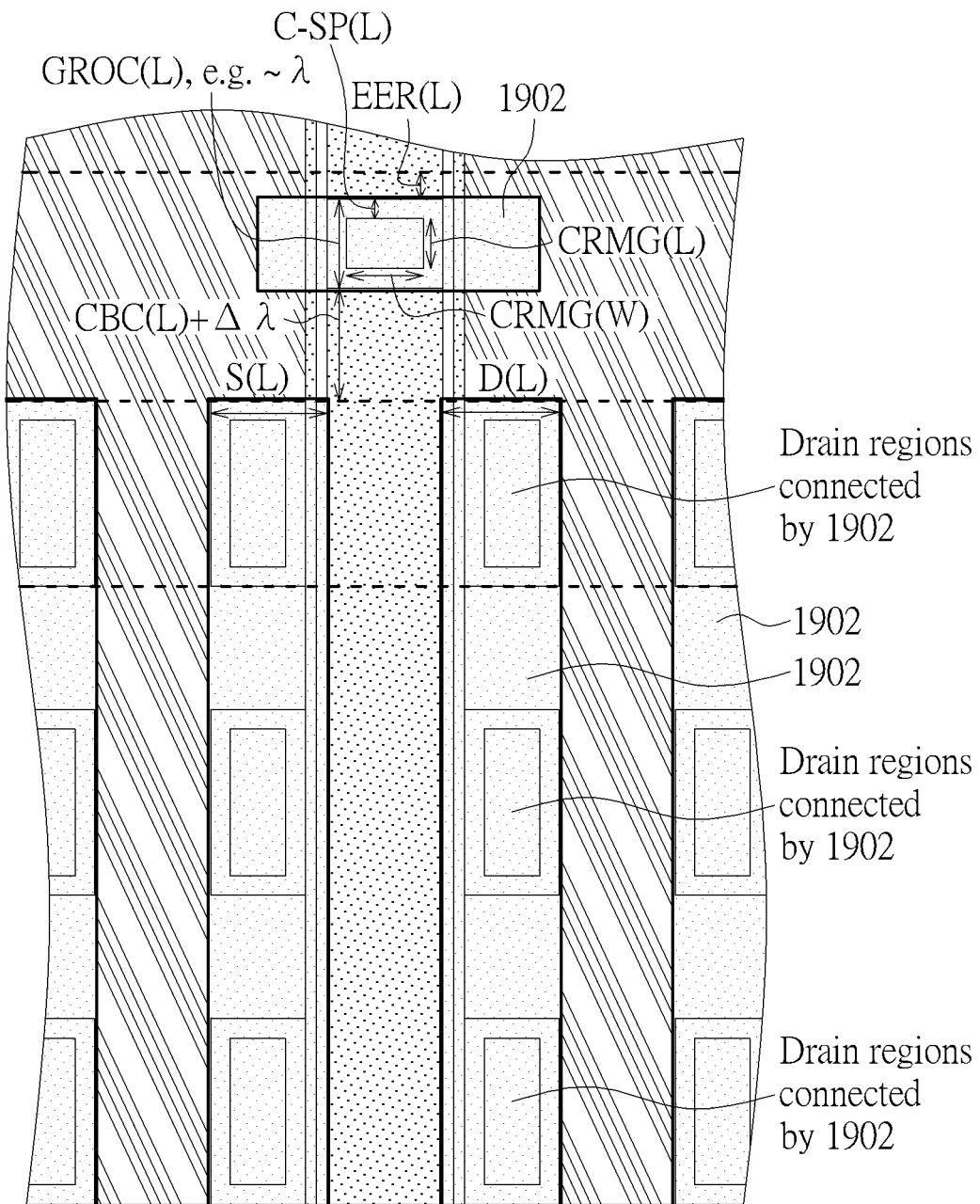
FIG. 24 is a top view of another mMOSFET with separate multiple fingers extending in horizontal direction.

FIG. 24 is a top view of another mMOSFET with separate multiple fins or fingers extending in horizontal direction, in which all drain regions in those fingers are connected together through the metal-1 layer 1902, and all source regions in those fingers are connected together through the metal-1 layer 1902 as well.

In the following several embodiments of completing different mMOFET structures especially on their source/drain structures (after the processing step described in FIG. 18A) will be illustrated to cover more varieties of this mMOSFET.

Figure 25A:
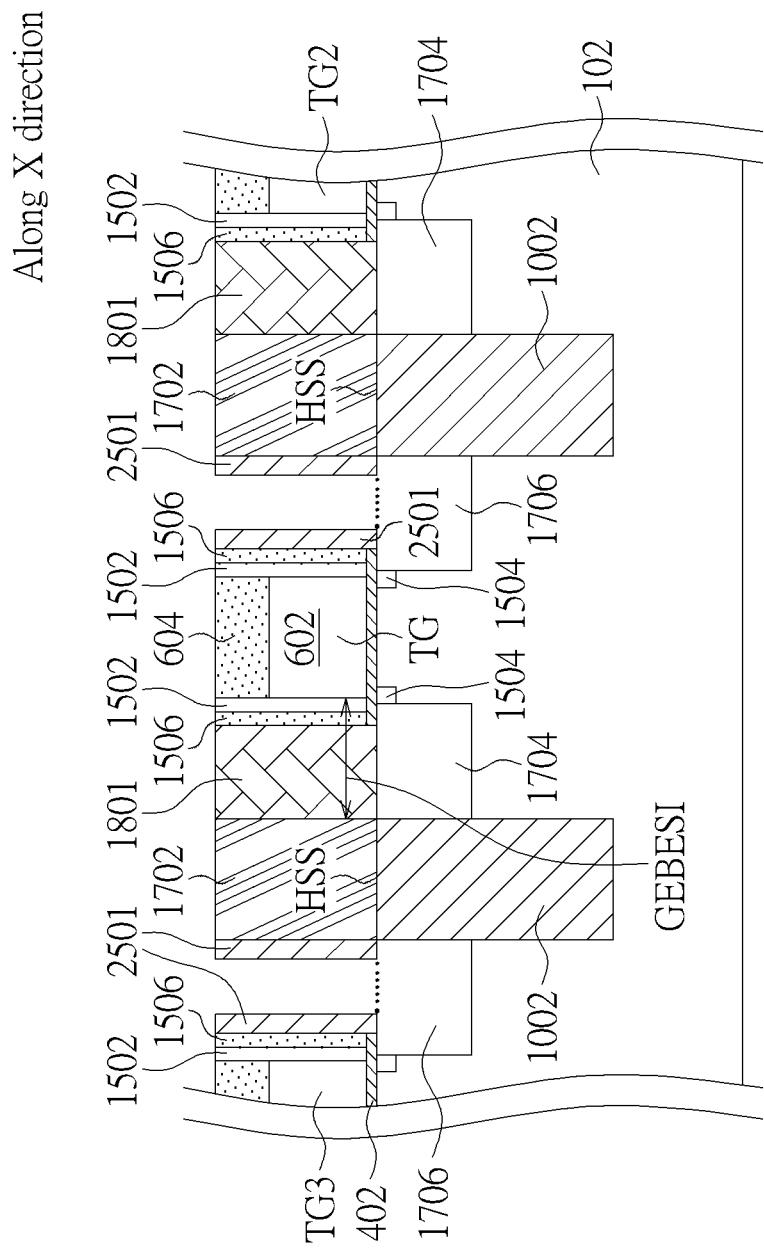
FIGS. 25A, 25B are diagrams illustrating both cross-section and top view of the mMOSFET at the stage of forming contact-hole openings on the source region and the drain region, respectively.
Figure 25B:
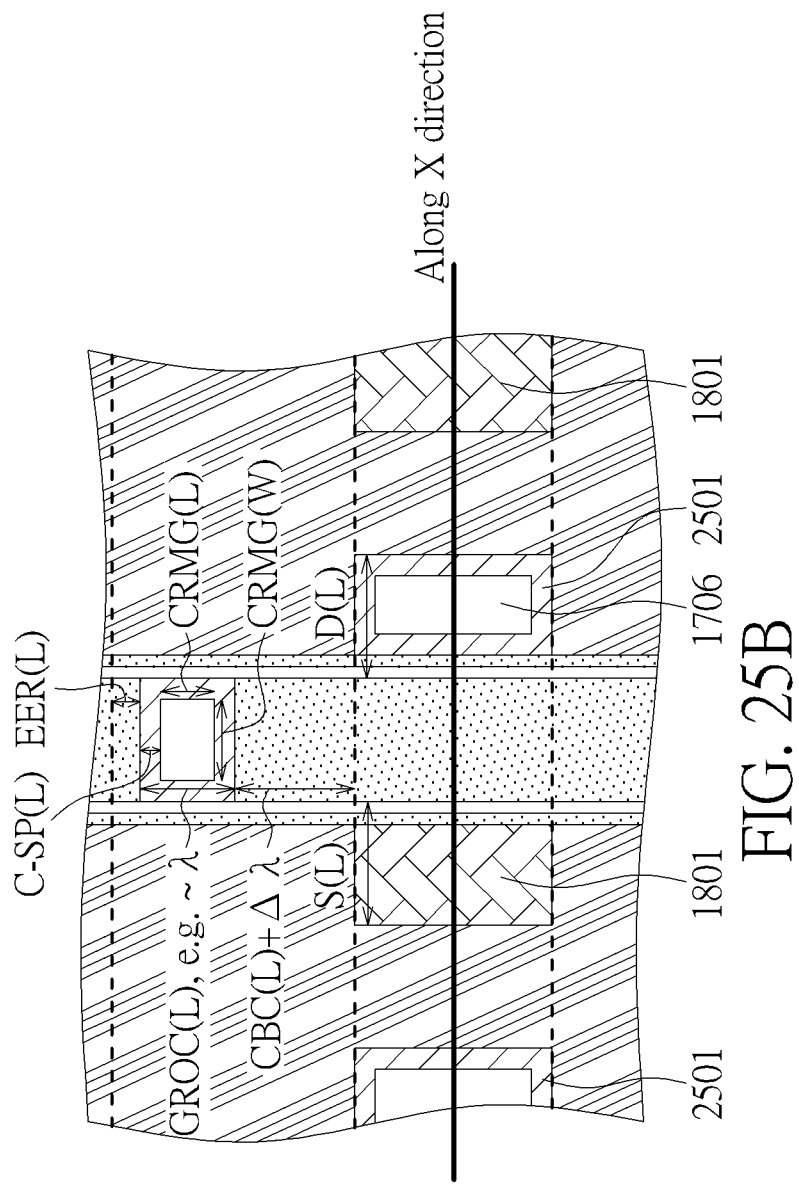

FIGS. 25A, 25B show both cross-section and top view of the mMOSFET at the stage of forming contact-hole openings on the source region 1704 and the drain region 1706, respectively. As shown in FIG. 25A, because in another embodiment of the present invention, the contact-hole openings on the source region 1704 are not needed, only the SOD 1801 above the drain region 1706 is removed, resulting in space on top of the source region 1704 being protected by the SOD 1801. Then, deposit an oxide layer 2501 with well-designed thickness and then use the anisotropic etching technique to form spacers inside walls of those contact-hole openings.

Figure 26A:
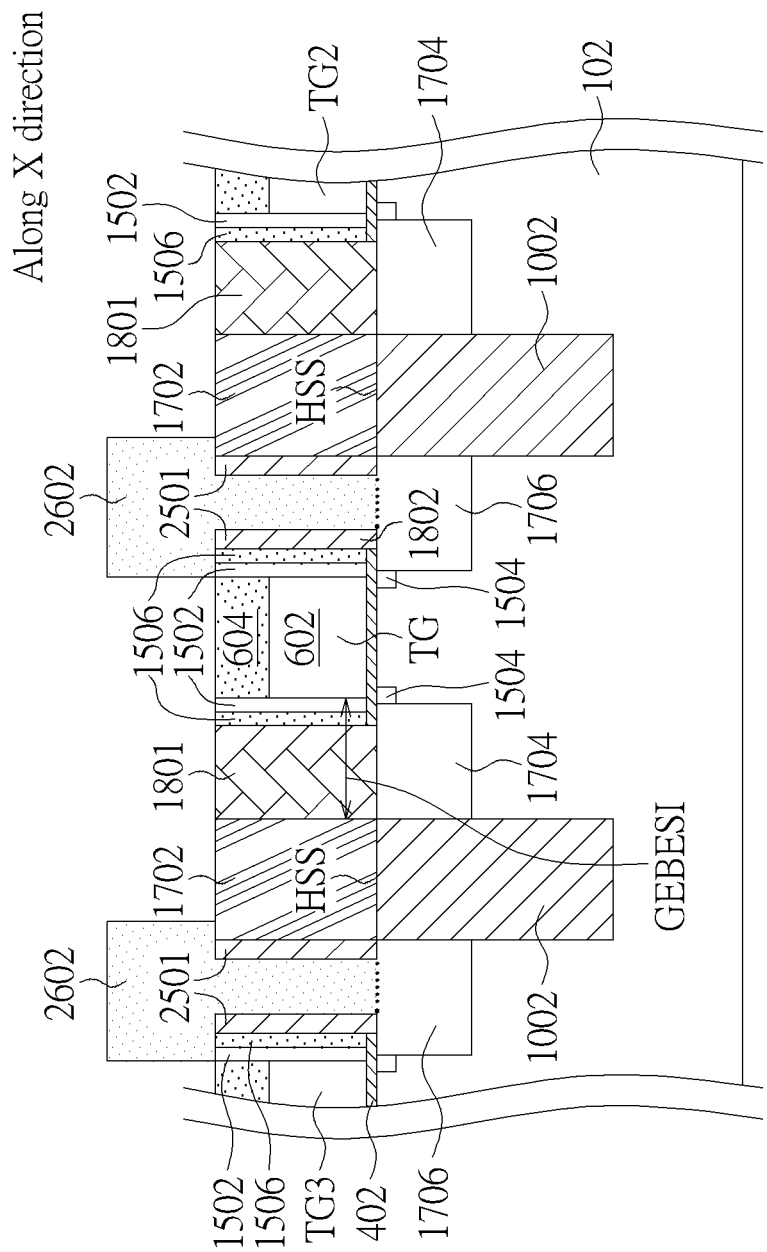
FIG. 26A is a diagram illustrating the metal-1 layer being deposited and etched to form the metal-1 interconnections.
Figure 26B:
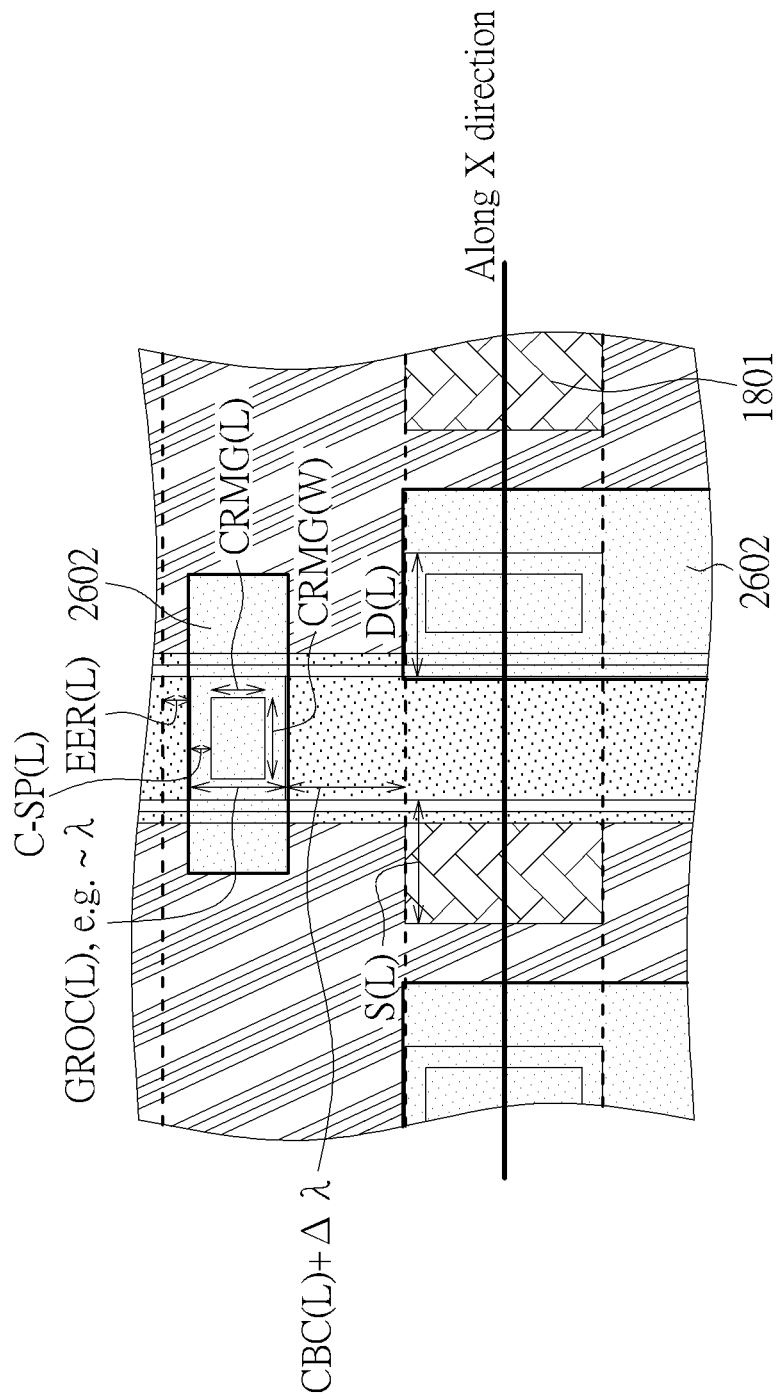
FIG. 26B is a diagram illustrating a top view of the mMOSFET shown in FIG. 26A.

Then, as shown in FIG. 26A (cross-section view of the mMOSFET structure at this stage), deposit a metal-1 layer 2602 to fully fill the contact-hole openings on top of the gate structure and the drain region 1706, respectively. Then, use the photolithographic masking technique to create all the connections among those contact-hole openings respectively to achieve the necessary metal-1 interconnection networks (shown in FIGS. 26A, 26B). In addition, FIG. 26B is the top view of the mMOSFET shown in FIG. 26A.

Figure 27:
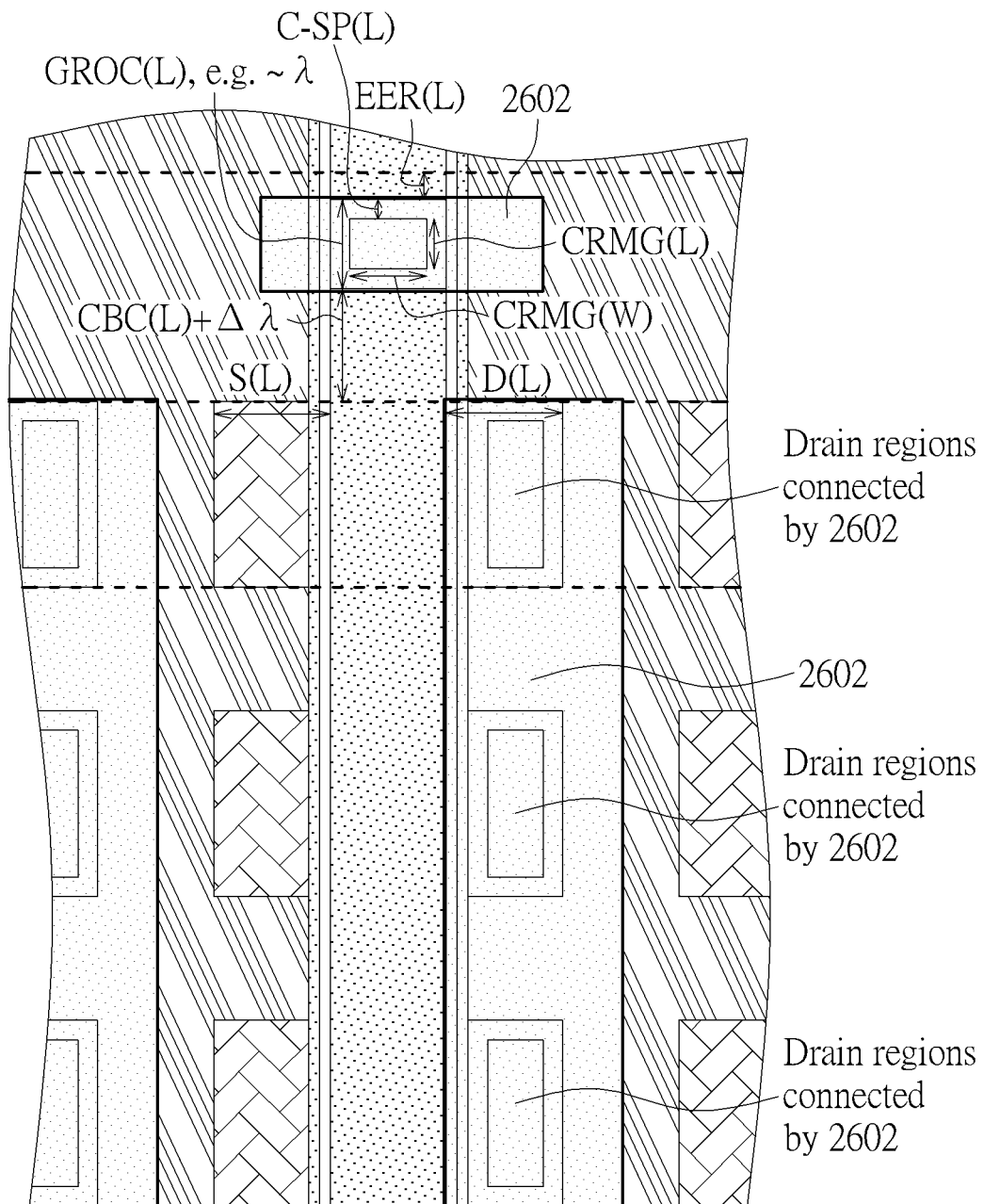
FIG. 27 is a diagram illustrating a top view of another mMOSFET with a layout design using separate multiple fingers for drain regions.

FIG. 27 shows a top view of another mMOSFET with a layout design using separate multiple fins or fingers for drain regions. Since the drain regions can be precisely defined without photolithographic misalignment tolerance (PMT) and the contact-hole openings are well formed separately inside the drain regions by self-alignment with precise geometries, the subsequent metal-1 layer formation in the defined patterns can connect these fingers directly; otherwise in state-of-the art design on multiple fingers there is a need to use an extra drain region to connect these fingers, which is called a Dog-bone drain structure. This Dog-bone drain structure cause extra areas and more parasitic capacitances for the conventional MOSFET and requires an extra rule to limit the distance between the gate structure and an edge of the Dog-bone, thus causing much larger drain area than the new way of connecting multiple fingered drain structures directly by the metal-1 layer 2602. The present invention in achieving the very compact layout design of using the metal-1 layer 2602 to connect the multiple fingered drain regions is believed to be the first time of showing a compact layout and Finger-Type design for the 3D-shaped Tri-gate or FinFET structures and clearly stands out its advantages, which is very important to help scaling the mMOSFET which uses multiple very narrow fingered drain regions especially in Tri-gate or FinFET structures. Furthermore, as shown in FIG. 27, when the mMOSFET includes multiple fins or fingers to form a transistor, the drain region in each fin or finger is physically separated from each other, and then those drain regions in different fins or fingers are electrically connected by the metal-1 layer 2602. Therefore, there is no Dog-bone drain structure in the present invention.

Figure 28A:
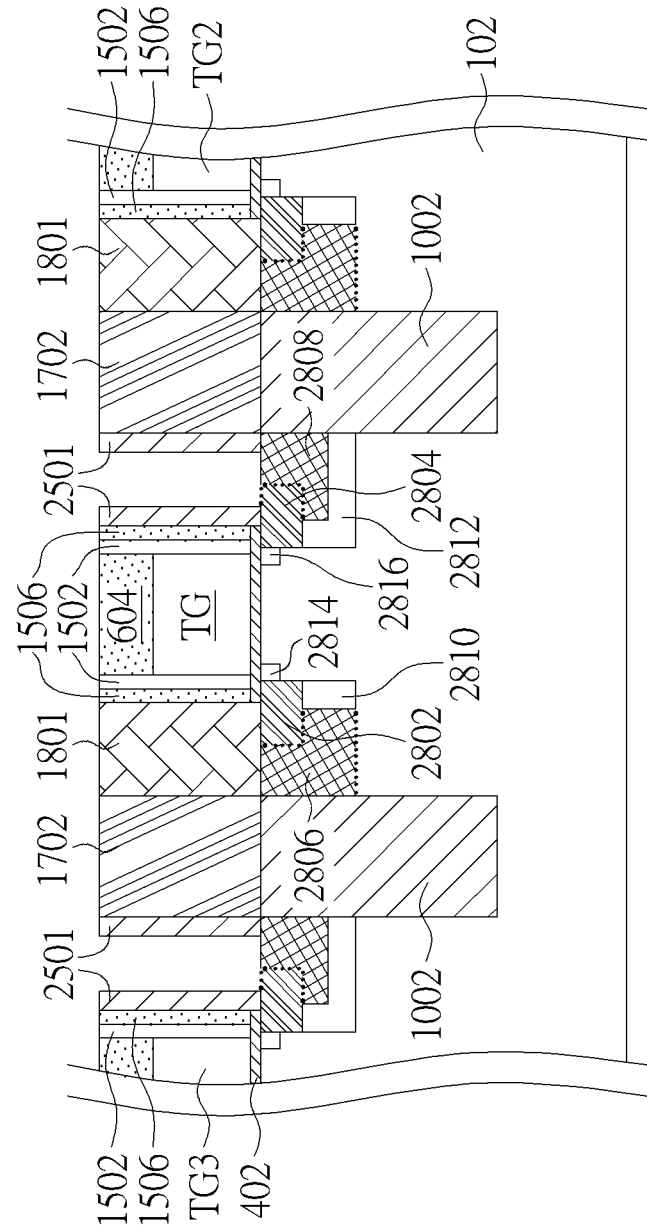
FIG. 28A is a diagram illustrating the source and the drain being formed by using the merged semiconductor junction and metal conductor (MSMC) structure according to another embodiment of the present invention.

Similar to FIGS. 25A, 25B, FIGS. 28A, 28B show both cross-section and top view of the mMOSFET formation at the stage of forming contact-hole openings on the drain and source regions, respectively. However, as shown in FIG. 28A, the drain and source regions in the mMOSFET could be formed by Merged Semiconductor-Junction & Metal-connection (MSMC) structure which includes: (a) an n+ doped silicon source/drain layer (called as SDSL) formed to be abutting to the substrate 102 (i.e. n+ doped silicon source layer 2802 and n+ doped silicon drain layer 2804), and (b) a core metal column (CMC) formed inside the source region (i.e. core metal column 2806) and the drain region (i.e. core metal column 2808), respectively, as a major connection path which has a high-conductance ohmic contact to the n+ silicon.

This CMC (i.e. the core metal column 2806 and the core metal column 2808) has its three sidewalls isolated by deep oxide isolation (DOI, that is, the STI-oxide-2 layer 1002), wherein the deep oxide isolation is commonly used for Tri-gate or FinFET structure and for separating NMOS transistor from neighboring transistors, and its fourth sidewall facing the channel region having a composite interface composed of oxide guard layer (OGL) 2810/2812 and SDSL which is directly in touch with LDD 2814/2816.

Figure 28B:
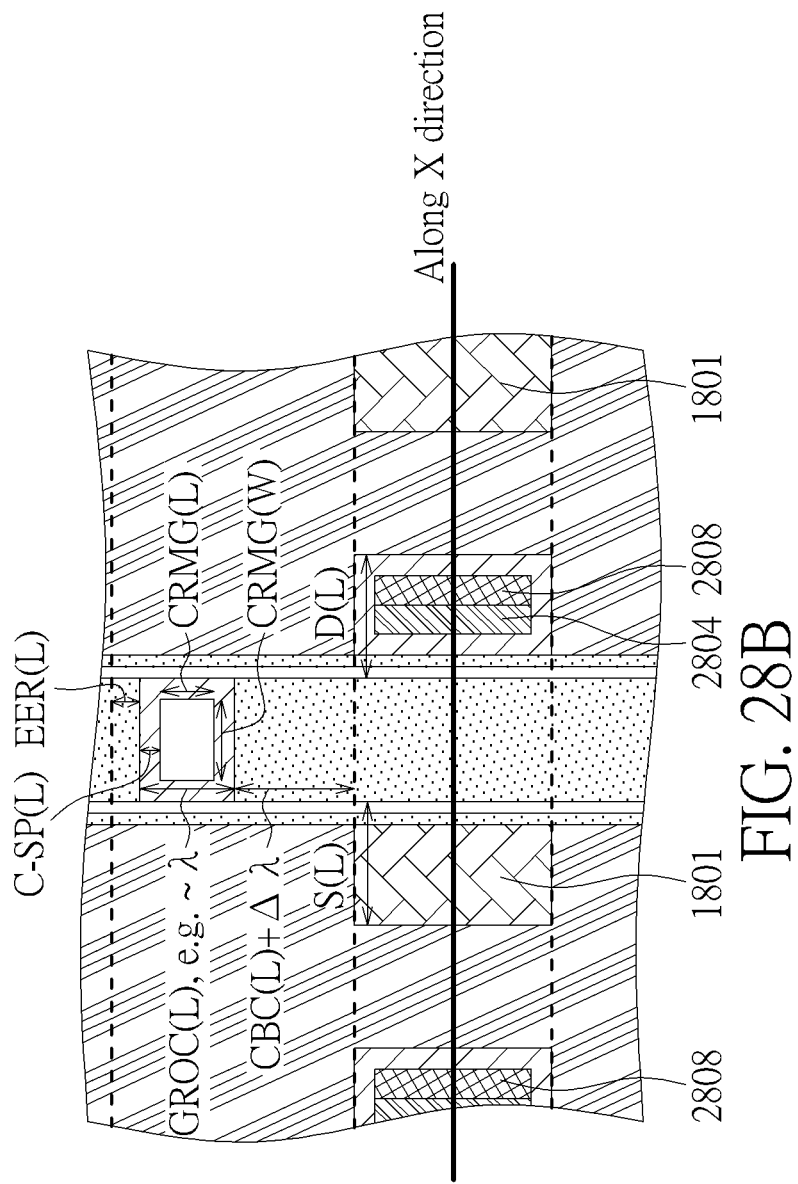
FIG. 28B is a diagram illustrating a top view of the mMOSFET shown in FIG. 28A.

Furthermore, as shown in FIG. 28A, the bottom wall of the core metal column 2808 in the drain region is also guarded by the oxide guard layer 2812, such that the core metal column 2808 in the drain region is electrically isolated from the substrate 102 completely. The top of the core metal column 2808 in the drain region then could be designed for receiving the metal-1 interconnection. On the other hand, the bottom wall of the core metal column 2806 in source region is contacted to the substrate 102 which could be electrically connected to a predetermined voltage level, such as ground level. Thus, the top of the source region is covered by the SOD 1801 to avoid further metal-1 interconnection. In addition, FIG. 28B is the top view of the mMOSFET shown in FIG. 28A.

How to form Merged Semiconductor-Junction & Metal-connection (MSMC) structure in the drain and source regions is already disclosed in U.S. patent application Ser. No. 16/991,044 filed on Aug. 12, 2020 (Title: TRANSISTOR STRUCTURE AND RELATED INVERTER) by the same inventor in the present invention. All contents of the aforesaid US patent application are incorporated by reference herein.

Figure 29A:
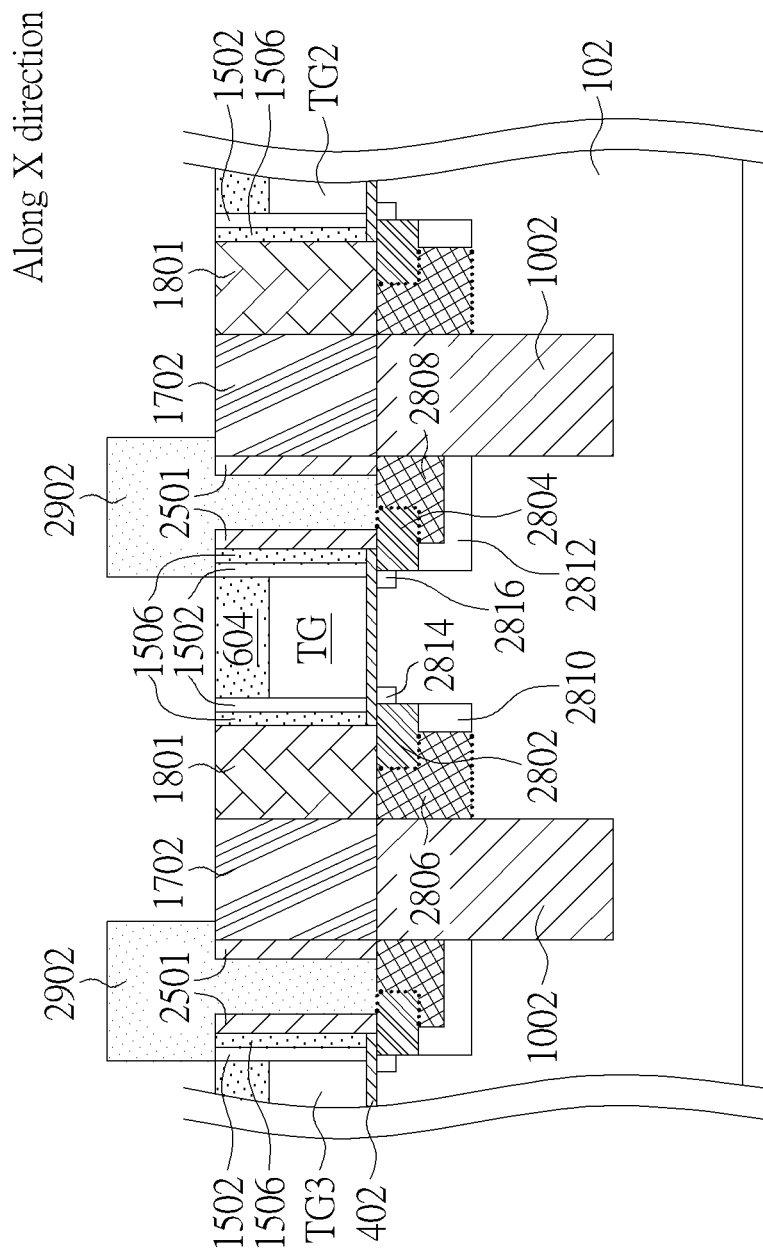
FIG. 29A is a diagram illustrating the metal-1 layer being deposited and etched to form the metal-1 interconnections.
Figure 29B:
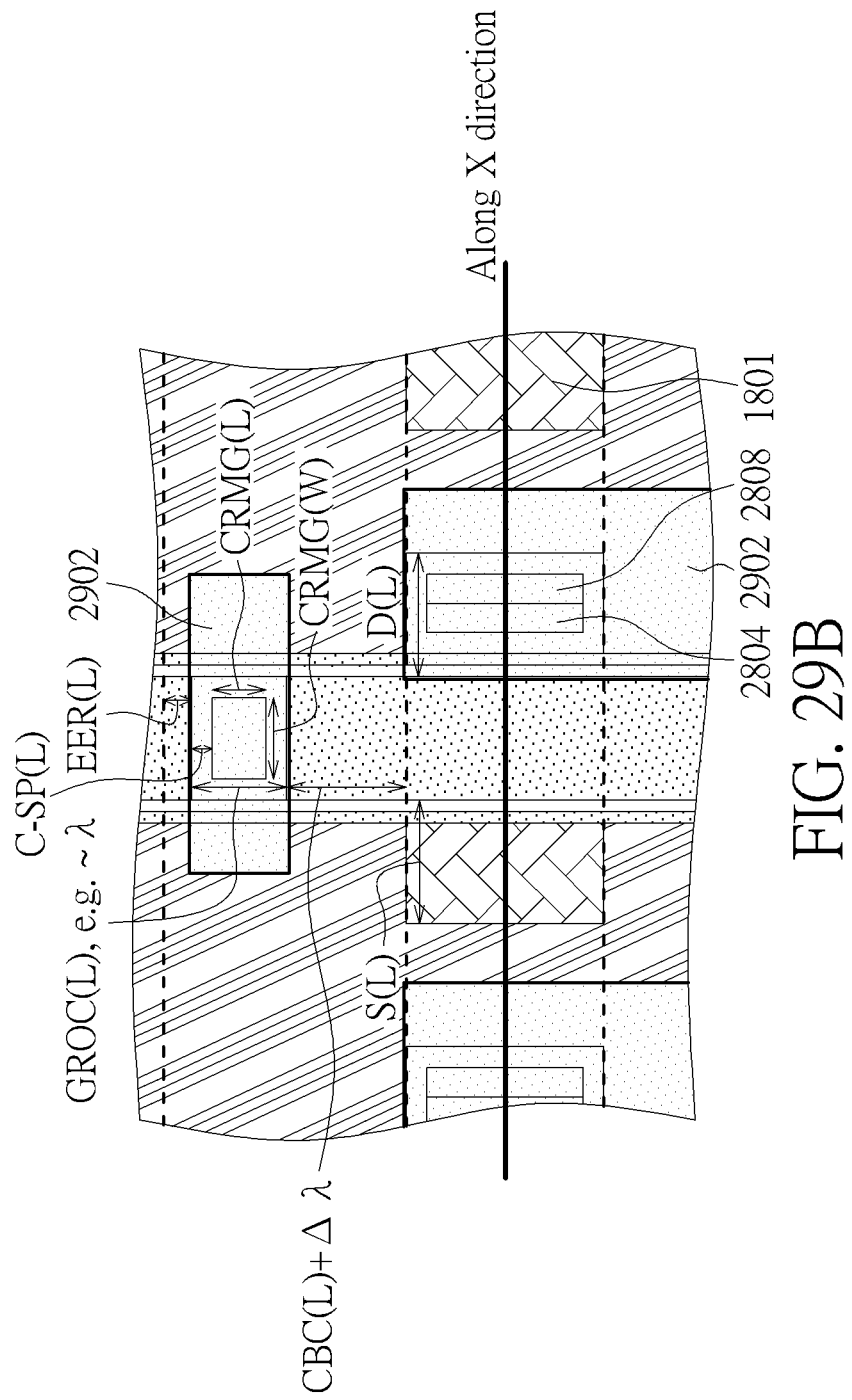
FIG. 29B is a diagram illustrating a top view of the mMOSFET shown in FIG. 29A.
Figure 29C:
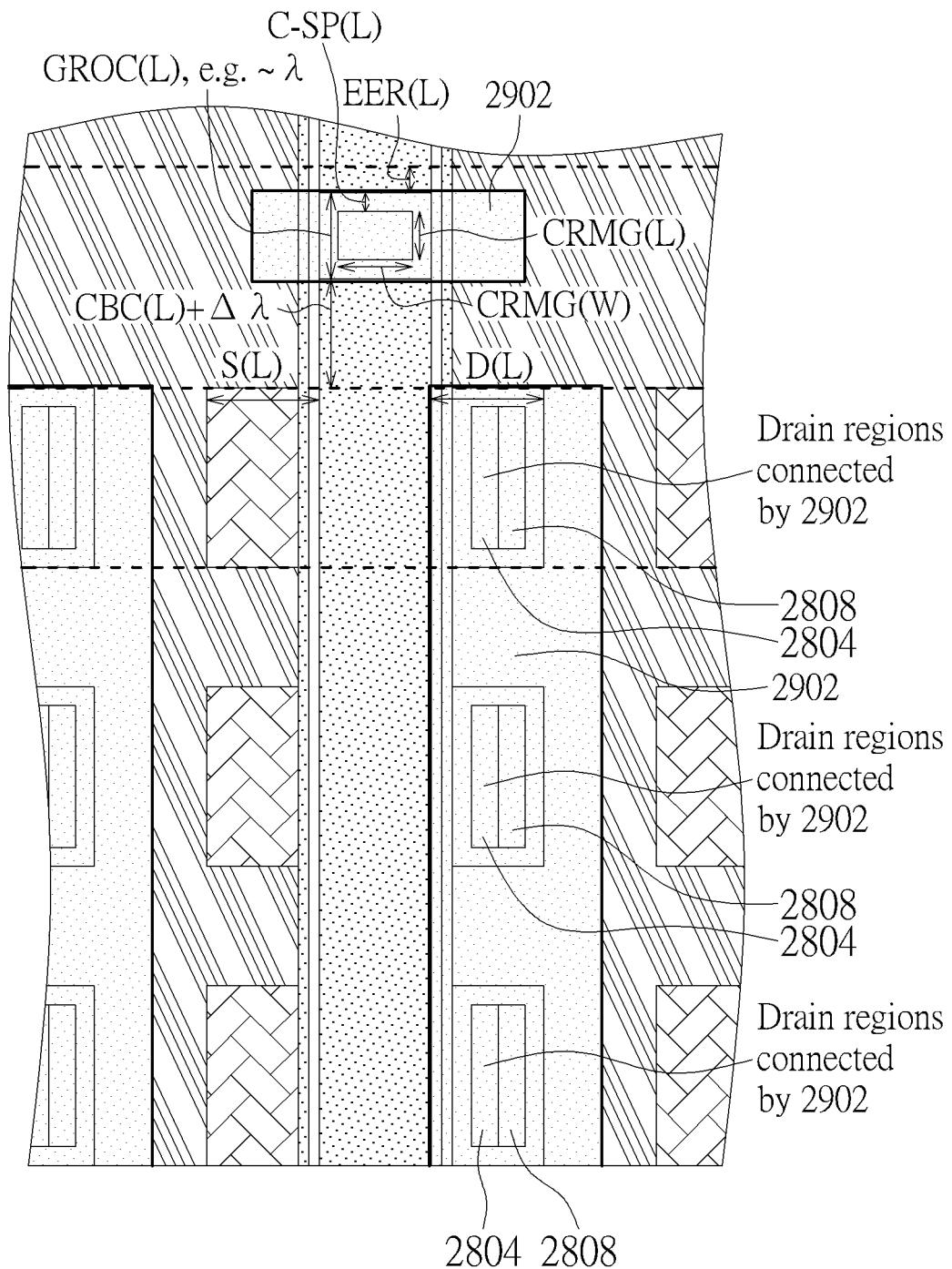
FIG. 29C is a diagram illustrating a top view of another mMOSFET with a layout design using separate multiple fingers for drain regions which are connected by the metal-1 interconnections.

Then, as shown in FIG. 29A (cross-section view of the mMOSFET structure at this stage), deposit a metal-1 layer 2902 to fully fill the contact-hole openings on top of the gate structure, the n+ doped silicon drain layer 2804, and the core metal column 2808, respectively. Then, use the photolithographic masking technique to create all the connections among those contact-hole openings respectively to achieve the necessary metal-1 interconnection networks (shown in FIGS. 29A, 29B). In addition, FIG. 29B is the top view of the mMOSFET shown in FIG. 29A. Furthermore, FIG. 29C shows a top view of another mMOSFET with a layout design using separate multiple fingers for drain regions which are connected by the metal-1 interconnections (i.e. the metal-1 layer 2902).

Figure 30:
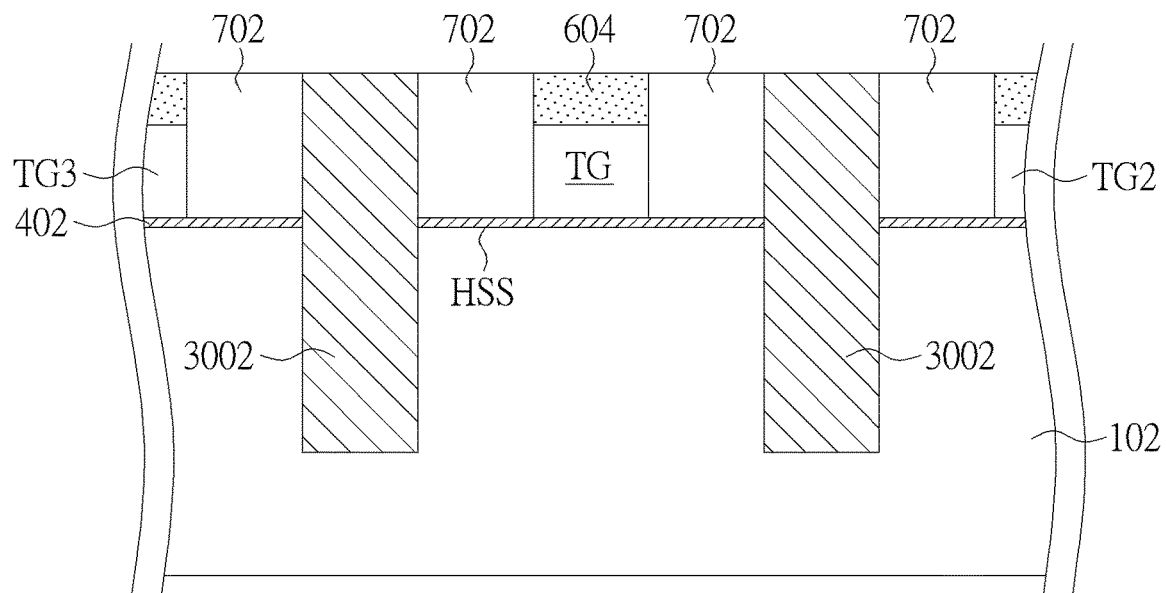
FIG. 30 is a diagram illustrating the gate mask layer being removed, then the oxide-2 layer being deposited to fill the trenches and other vacancies on the HSS to form the STI-oxide-2, and then the STI-oxide-2 being planarized by the chemical mechanical polishing (CMP).
Figure 30:
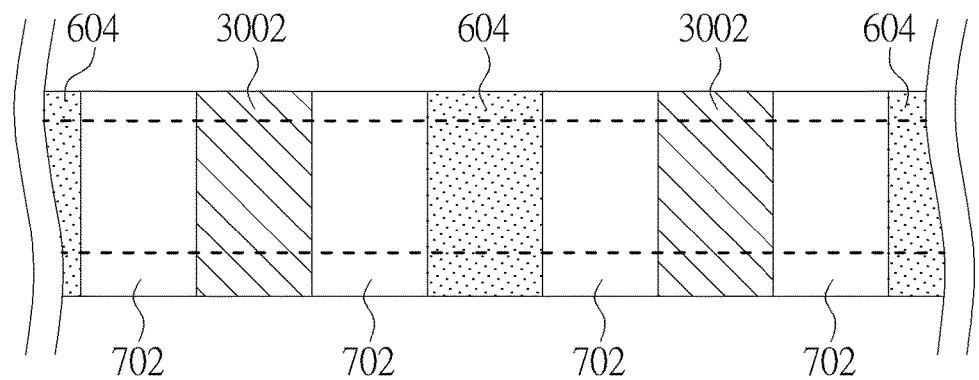

The principle described as above is adopted in the following structure but the only difference is how to form the spacers and contact-hole openings in another alternative way. By continuing the implementation as up to FIG. 9A, as shown in FIG. 30 (*a*), remove the gate mask layer 802, and then deposit a STI-oxide-2 layer 3002 to fill all vacancies on the wafer surface and then use the CMP technique to make a planar surface of the STI-oxide-2 layer 3002 leveled up to the top of the SOD 702 and the top of nitride layer 604 (over the TG). In addition, FIG. 30(*b*) is the top view of the mMOSFET shown in FIG. 30(*a*).

Figure 31:
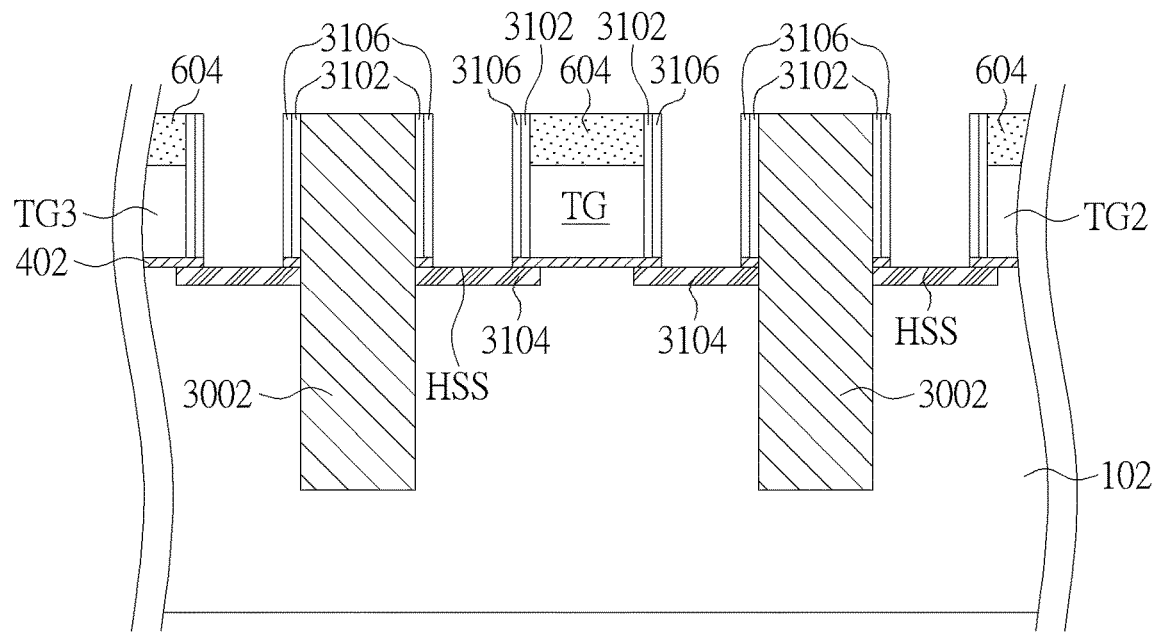
FIG. 31 is a diagram illustrating the oxide-3 layer being deposited and etched to form the oxide-3 spacer, the lightly Doped drains (LDDs) being formed in the p-type substrate, the nitride layer being deposited and etched back to form the nitride spacer, and the dielectric insulator being removed.
Figure 31:
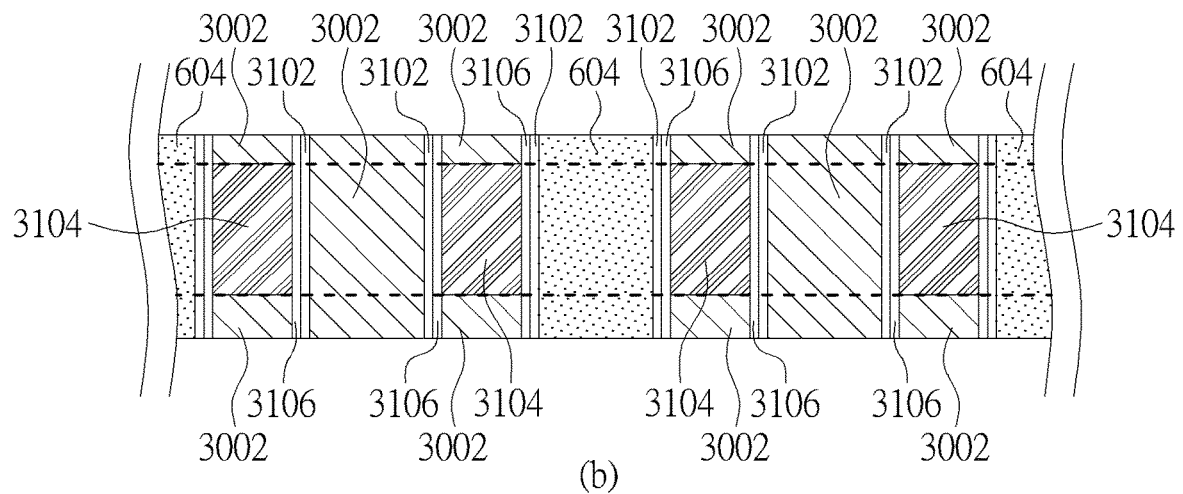

As shown in FIG. 31(*a*), remove the SOD 702. Deposit an oxide-3 layer surrounding the TG and the STI-oxide-2 layer 3002 and utilize the anisotropic etching technique to etch back the oxide-3 layer to form an oxide-3 spacer 3102. Then, form lighted doped zones in the substrate 102 and perform rapid thermal annealing (RTA) on the lighted doped zones to form lightly Doped drains (LDD) 3104 next to the TG. Then, deposit a nitride layer surrounding the TG and the STI-oxide-2 layer 3002 and utilize the anisotropic etching technique to etch back the nitride layer to form a nitride spacer 3106. And then, remove the dielectric insulator 402 underneath the previously existing SOD 702. In addition, FIG. 31(*b*) is the top view of the mMOSFET shown in FIG. 31(*a*).

Figure 32:
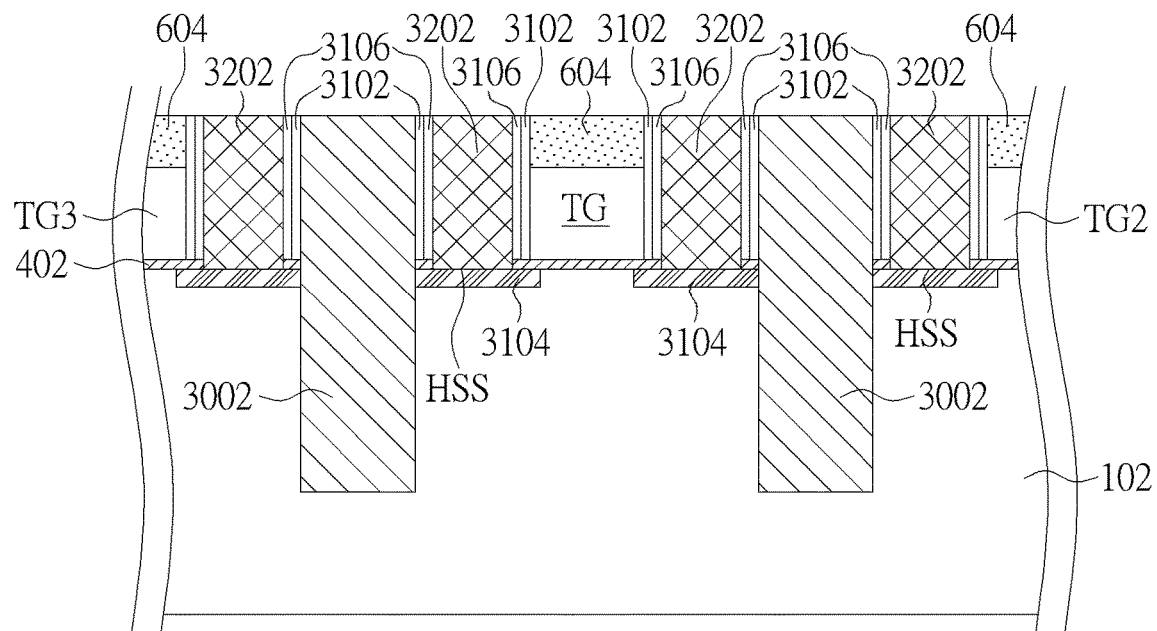
FIG. 32 is a diagram illustrating the intrinsic silicon being grown by the selective epitaxy growth (SEG) technique.
Figure 32:
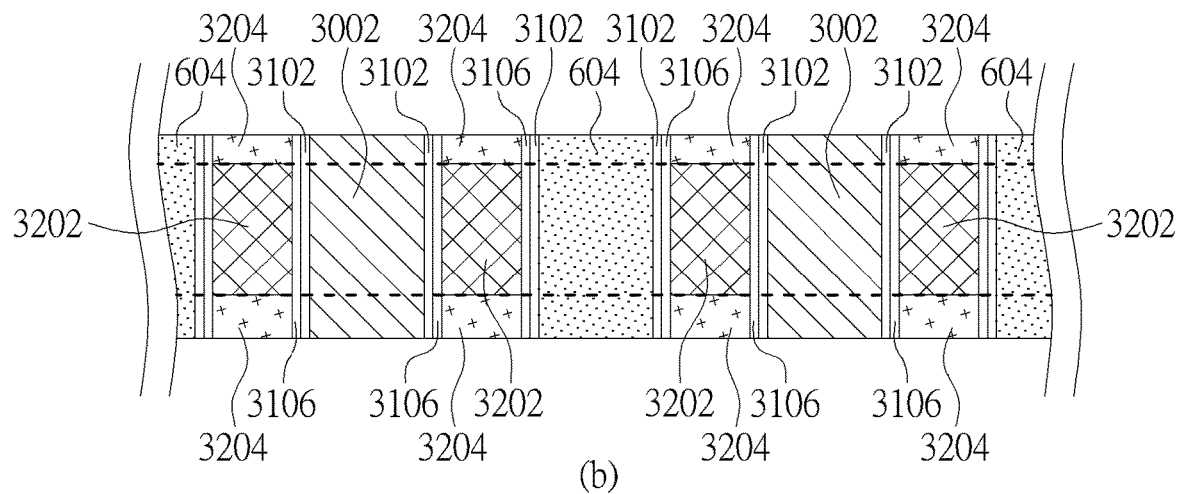

As shown in FIG. 32(*a*), by using the exposed HSS regions as silicon growing seeds, utilize the selective epitaxy growth (SEG) technique to grow an intrinsic silicon 3202 only above the exposed HSS to a height as tall as the top of nitride layer 604 which is over the top of the TG. A difference from the previous ones is that a shape of the SEG intrinsic silicon 3202 could be better controlled since two sides of the SEG intrinsic silicon 3202 are sandwiched between the STI-oxide-2 3002 and the TG, and the other two sides of the SEG intrinsic silicon 3202 are facing air above cliff edges of the active region, wherein the active region is still covered by the dielectric insulator 402 and above adjacent STI-oxide-1. Then, a CVD-STI-oxide-3 layer 3204 (shown in FIG. 32(*b*)) to fill all vacancies and planarized by the CMP technique to achieve a planar surface leveled up to the top of nitride layer 604 (over the top of the TG). In addition, FIG. 32(*b*) is a top view corresponding to FIG. 32(*a*).

Figure 33A:
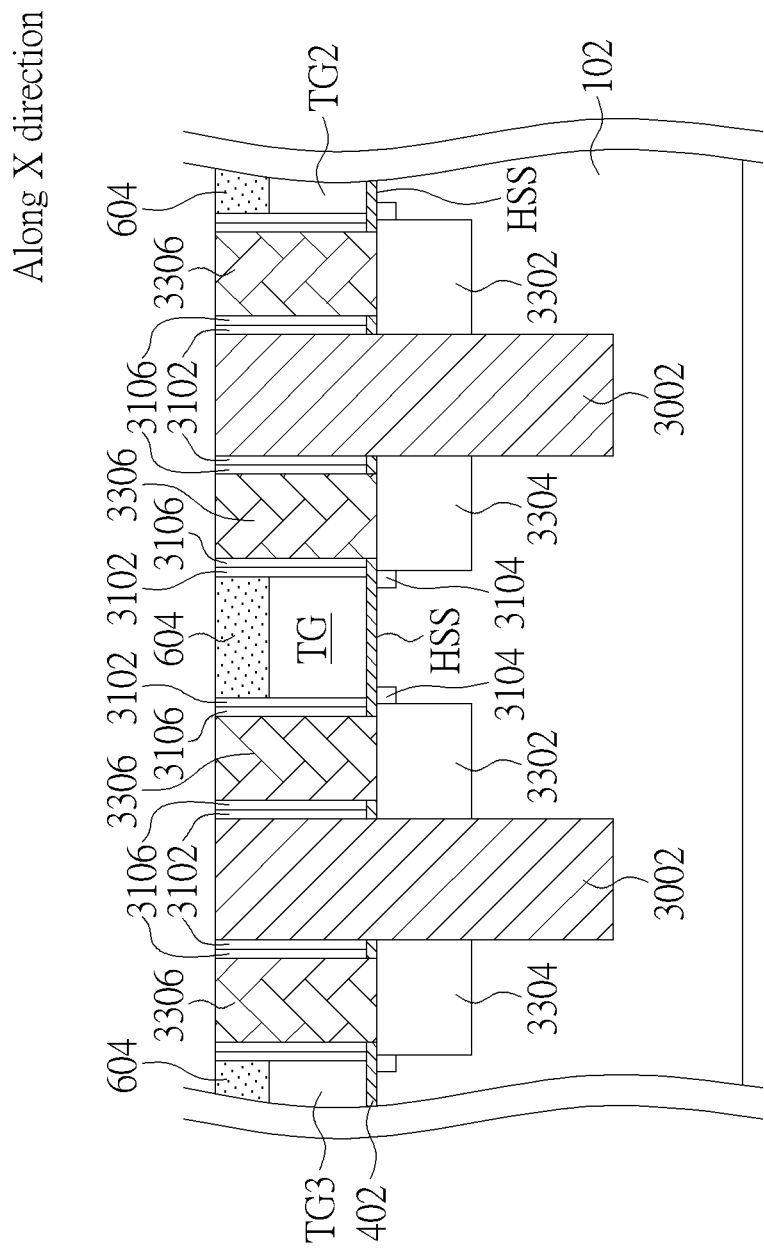
FIG. 33A is a diagram illustrating the intrinsic silicon being removed, the source and the drain being formed, and the SOD being deposited and etched.
Figure 33B:
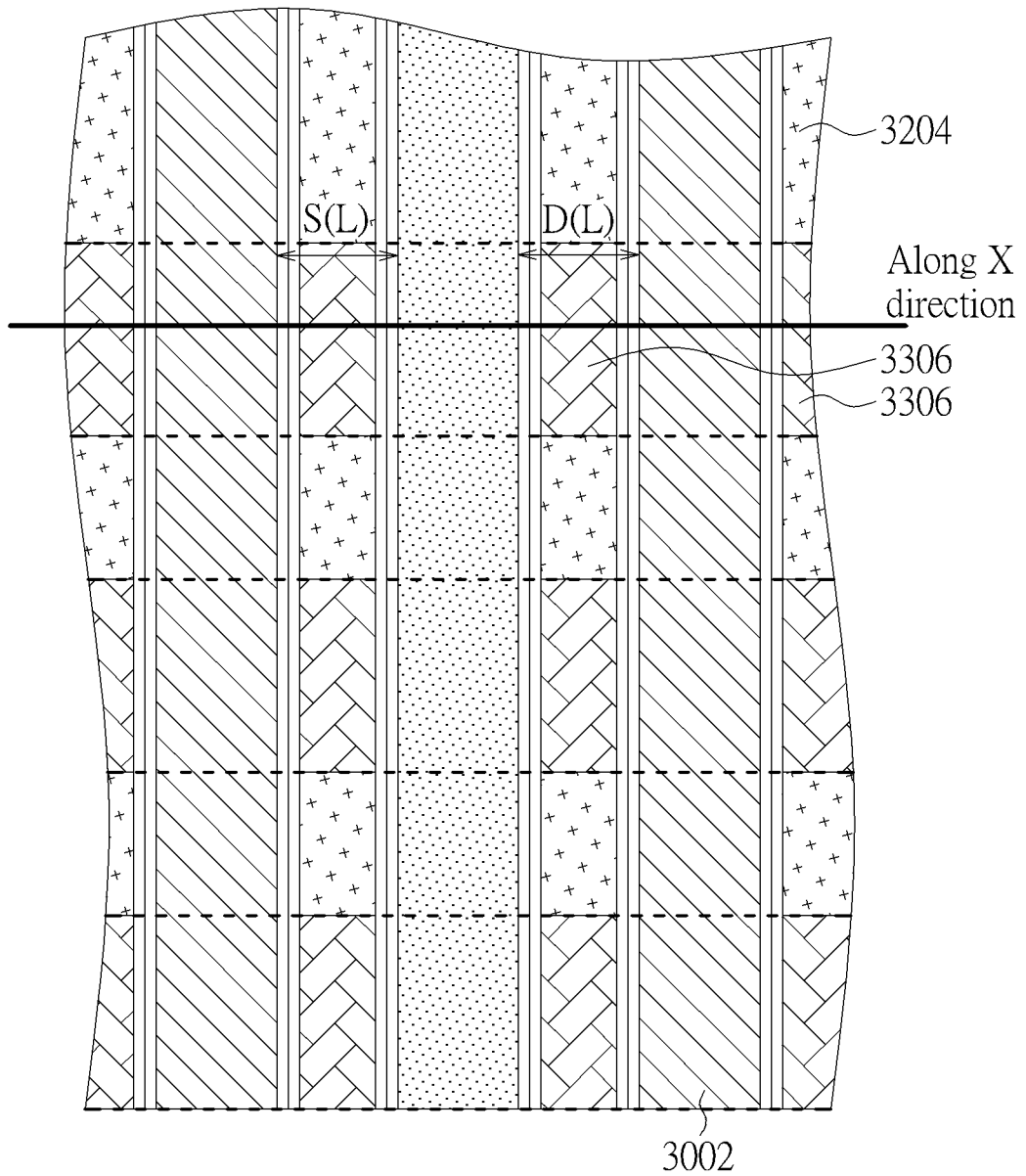
FIG. 33B is a diagram illustrating the top view corresponding to FIG. 33A.

As shown in FIG. 33A, remove the intrinsic silicon 3202 so as to expose the HSS in regions for a source (n+ source) region 3302 and a drain (n+ drain) region 3304 which are surrounded by two walls of the CVD-STI-oxide-3 layer 3204, a wall of the nitride spacer 3106 on the STI-oxide-2 3002, and a wall of the nitride spacer 3106 surrounding the TG. Any existing ways of forming the source region 3302 and the drain region 3304 of the mMOSFET can be carried out to achieve flat surfaces of the source region 3302 and the drain region 3304 with the HSS. Thereafter, deposit a SOD 3306 to fill in cavities above the source region 3302 and the drain region 3304, and then etch back the SOD 3306 to achieve a planar surface leveled up to the top of nitride layer 604. In addition, FIG. 33B is the top view corresponding to FIG. 33A.

Figure 34A:
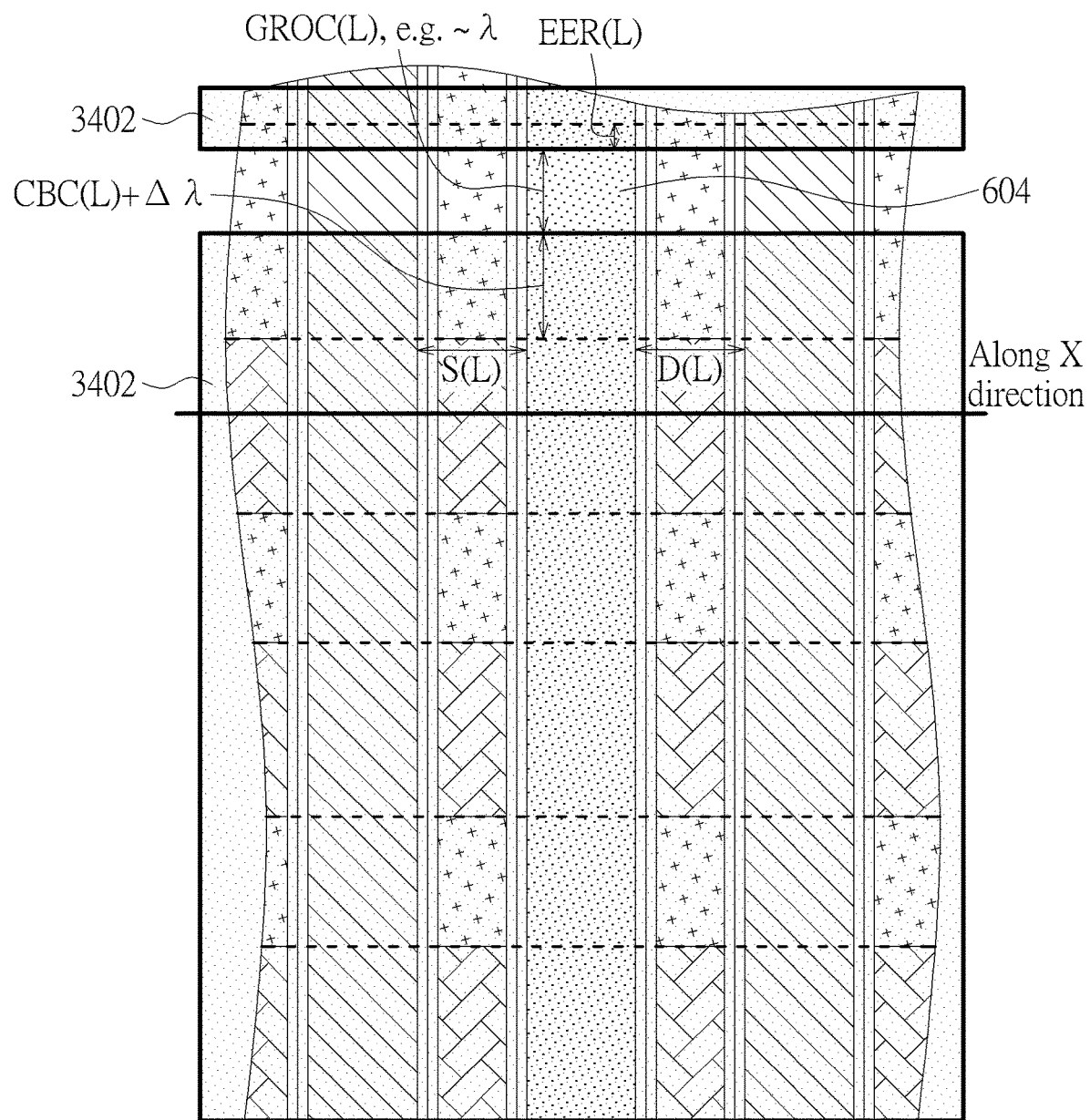
FIG. 34A is a diagram illustrating a photo resistance being deposited.
Figure 34B:
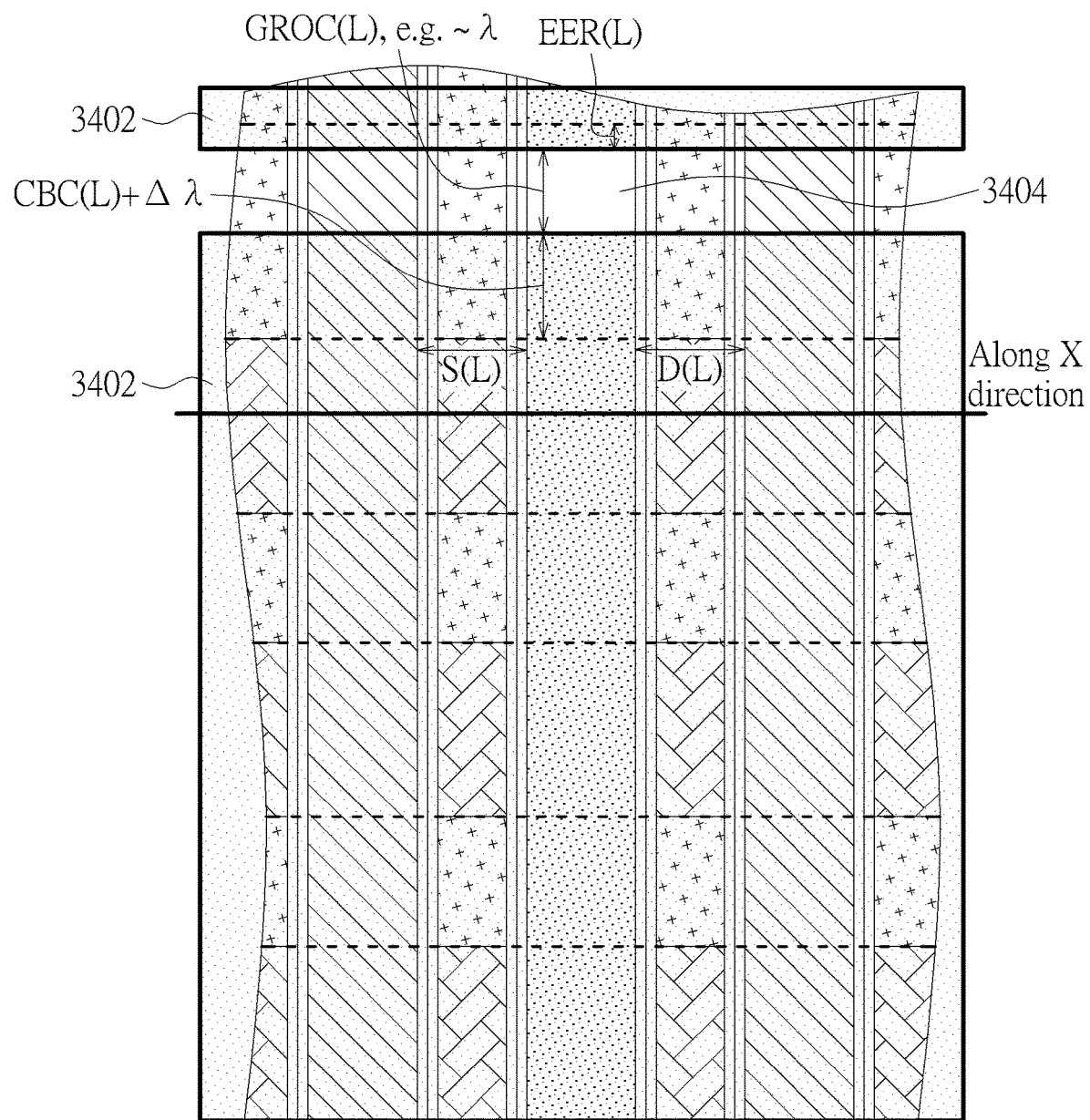
FIG. 34B is a diagram illustrating the anisotropic etching technique being utilized to etch the nitride layer to expose a metal contact underneath the nitride layer.

As shown in FIG. 34A (top view), a CG photolithographic masking step is performed such that a photo resistance 3402 is formed to reveal some area of gate extension portion. Then, as shown in FIG. 34B (top view), utilize the anisotropic etching technique to etch the nitride layer 604 located on the top of the revealed gate extension portion to expose a metal contact 3404 underneath the nitride layer 604. Then, as shown in FIG. 35A, remove the photo resistance 3402, etch the SOD 3306 above the source region 3302 and the drain region 3304 to form contact-hole openings, and then deposit oxide spacer 3502 surrounding the contact-hole openings located above the source region 3302 and the drain region 3304.

Figure 35A:
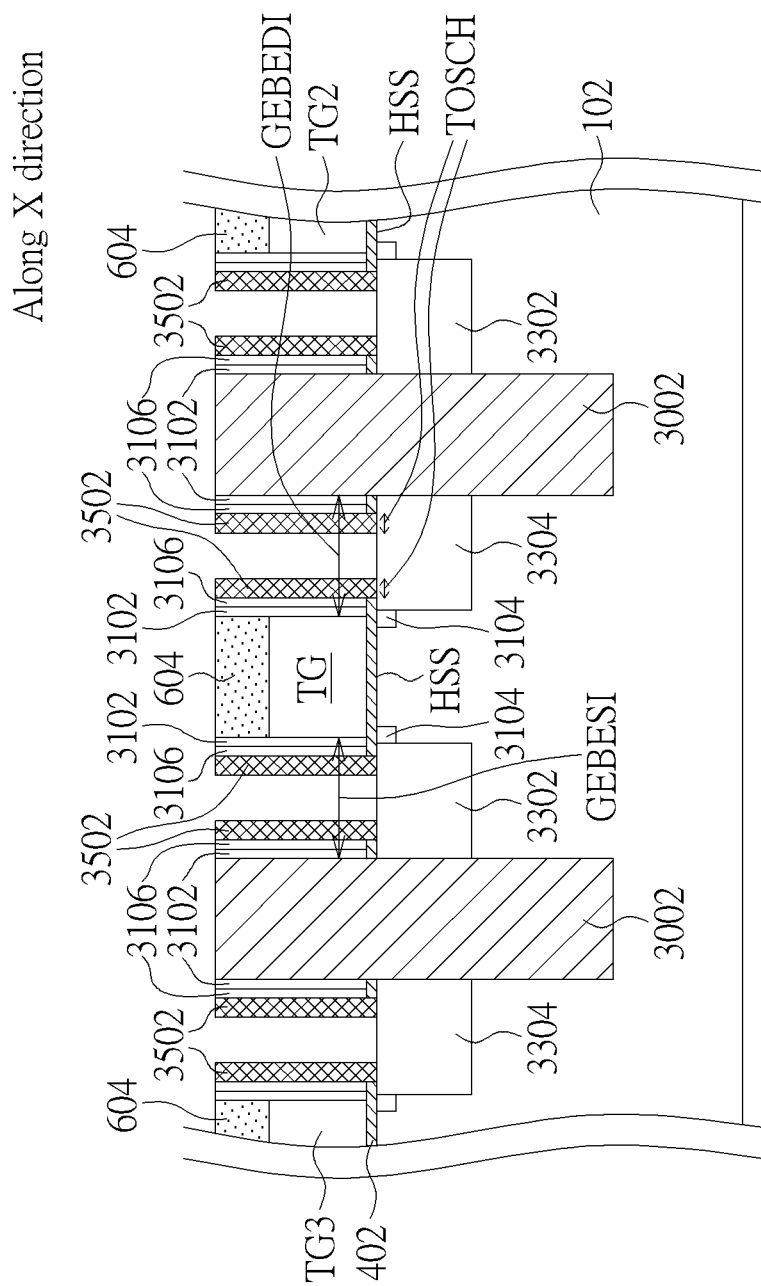
FIG. 35A is a diagram illustrating the photo resistance and the SOD being removed, and the oxide spacer being deposited and etched to form the contact-hole openings.
Figure 35B:
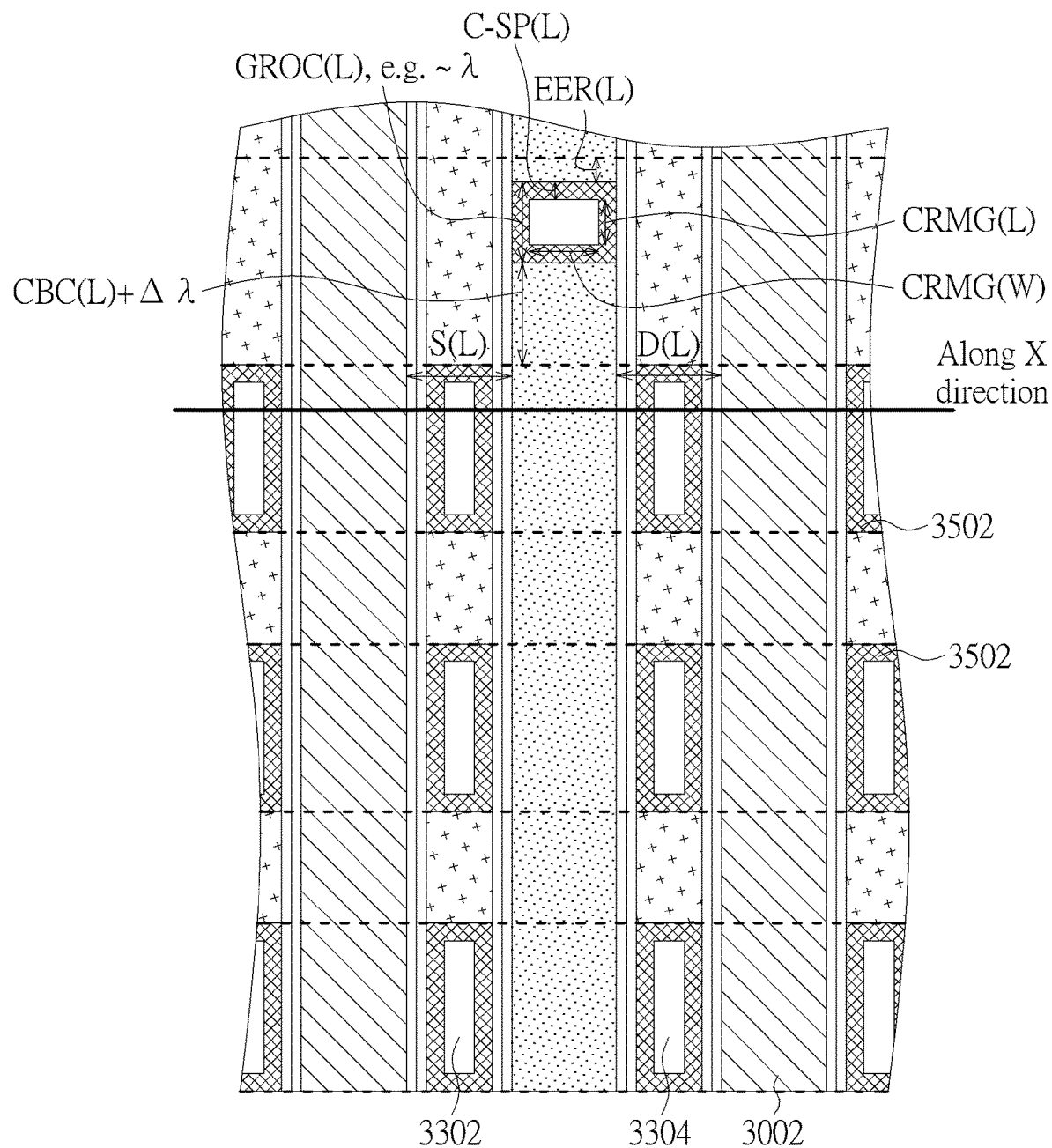
FIG. 35B is a diagram illustrating a top view of the mMOSFET in FIG. 35A and multiple fingers in horizontal direction.

As shown in FIG. 35A, since the two walls of CVD-STI-oxide-3 layer 3204, the nitride spacer 3106 on the STI-oxide-2 3002, and the nitride spacer 3106 surrounding the TG are all taller than the HSS as four sidewalls, another well-designed four oxide spacers 3502 (called as oxide spacer for contact-hole, oxide-SCH) can be newly created to cover the four sidewalls. Therefore, the contact-hole openings are naturally formed in such the self-alignment way without using any etching technique of making the contact-hole openings, and by the suitable design of oxide-SCH with the thickness of tOSCH such a contact-hole opening has a length dimension smaller than the lengths of the GEBESI and the GEBEDI, respectively. What is new here is that the contact-hole opening is located at the center of both the boundary of the source region and the drain region, respectively, and the length of the contact-hole opening could be designed smaller than $\lambda$ (since length of the contact hole≤the length of the GEBESI minus 2 times tOSCH. Therefore, for instance, if tOSCH=$0.2\lambda$ and the GEBESI=$\lambda$, then the length of the contact hole=$0.6\lambda$). According to the present invention, this self-alignment contact hole should present itself as the smallest contact length than contact length of any prior art design and process of creating contact-hole openings by using photolithographic masking process step and further using complex etching process technique in such a smaller dimension than $\lambda$. In addition, the present invention eliminates the most difficult-to-be-controlled and the most expensive mask for defining and making metal-1 contacts and its subsequent tasks of drilling the contact-hole openings. In addition, FIG. 35B is a top view of the mMOSFET in FIG. 35A, but in FIG. 35B, separate multiple fins or fingers in the mMOSFET are shown and extend in horizontal direction, and all drain regions and source regions in those fingers are revealed.

As shown in FIG. 32(*a*), when the intrinsic silicon 3202 are removed to form the contact-hole openings and expose the HSS corresponding to the source and drain regions, the contact-hole openings exposing the source and drain regions are surrounded by the walls of the CVD-STI-oxide-3 layer 3204, the STI-oxide-2 3002, and the TG which already includes the oxide-3 spacer 3102 and the nitride spacer 3106. Therefore, in another embodiment of the present invention, the well-designed four oxide spacers 3502 covering the four sidewalls of the contact-hole openings (called as oxide spacer for contact-hole, oxide-SCH) in FIG. 35A could be omitted, so is the oxide spacer 3502 covering the opening exposing the gate metal in FIG. 35B.

Figure 36A:
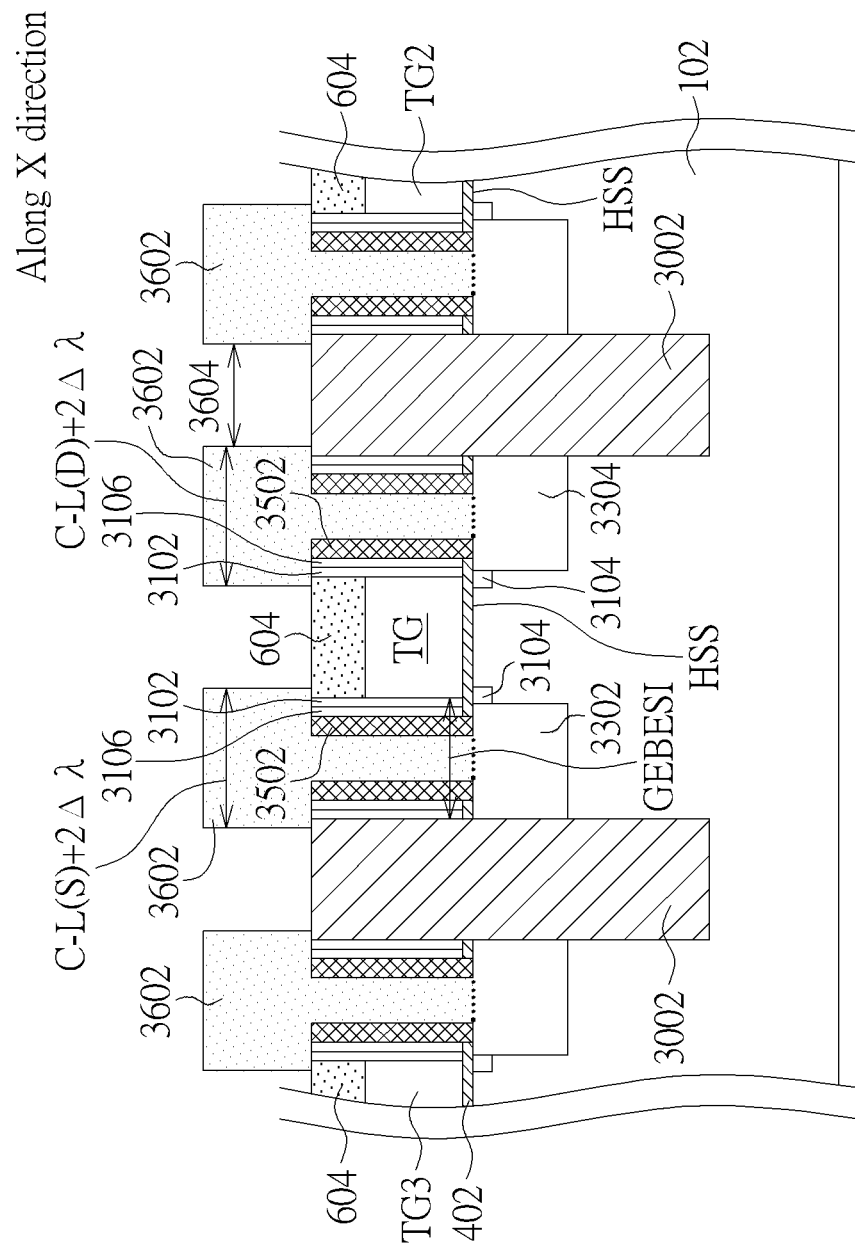
FIG. 36A is a diagram illustrating the metal-1 layer being deposited and etched to form the metal-1 interconnections.
Figure 36B:
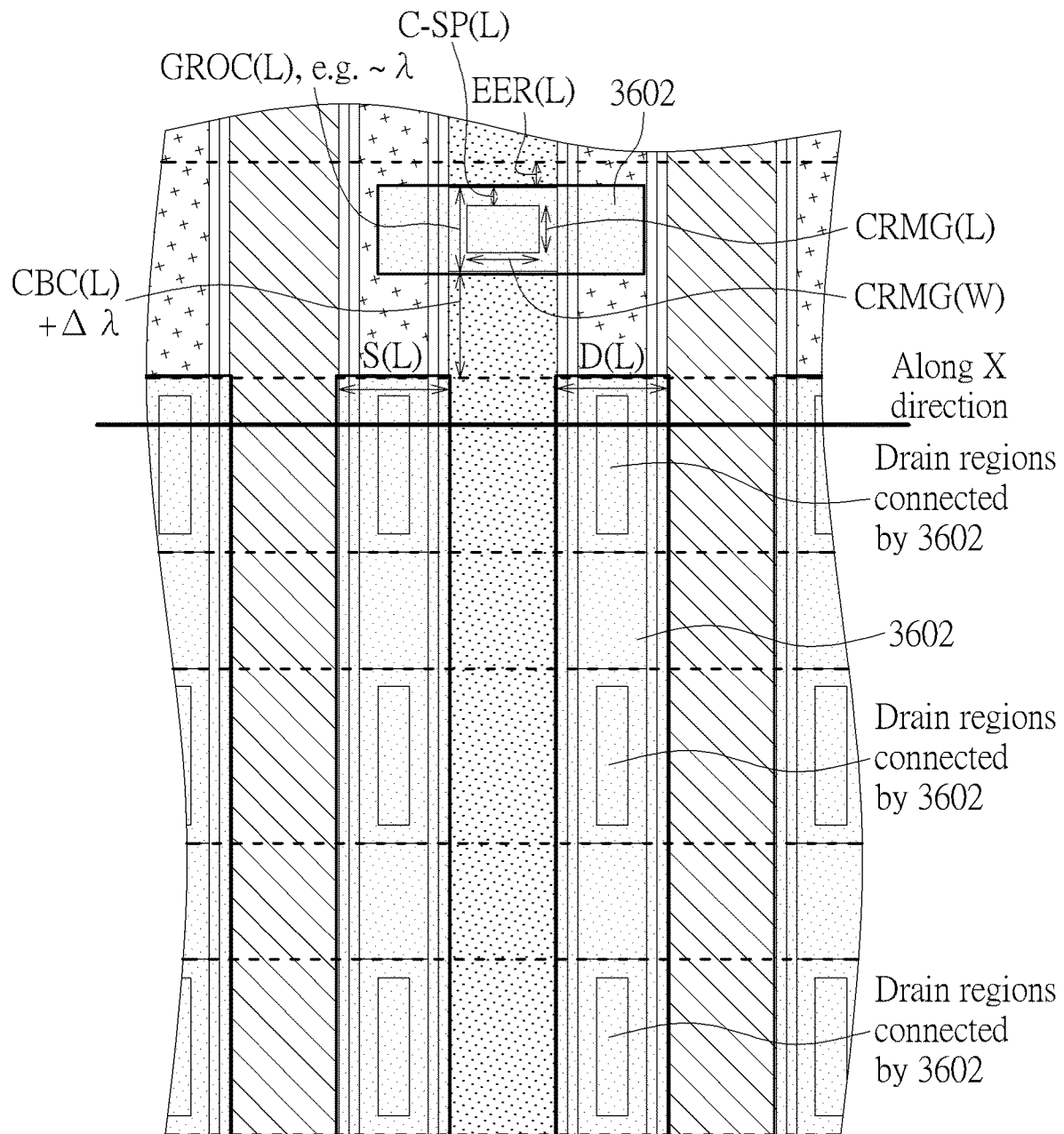
FIG. 36B is a diagram illustrating a top view of the mMOSFET in FIG. 36A and multiple fingers in horizontal direction.

FIG. 36A shows the results after that a metal-1 material (such as silicide covered by metal) 3602 is deposited to fill the contact-hole opening and then a photolithographic masking technique can be used to define the metal-1 layer 3602. As shown in FIG. 36A, the metal-1 layer 3602 must have its width fully covering the contact-hole opening and reserving any unavoidable PMT in a precisely controlled dimension. That is, the width of the metal-1 layer 3602=the length C-S(L) of the contact-hole opening plus 2Δλ, and equally on the drain region, the length C-D(L) of the contact-hole opening plus 2Δλ, respectively. If the contact-hole opening could be controlled to 0.6λ (which should be under control since the dimension of the oxide spacer 3502 inside the contact hole could be well controlled as described above in calculations), then the width of the metal-1 layer 3602 could be as small as a sum of the length of the contact-hole opening and 2Δλ (if Δλ=0.5λ, the length of the contact-hole opening=0.6λ, then the width of the metal-1 layer 3602 could be as narrow as 1.6λ in order to fully cover the contact-hole opening under unavoidable PMT). According to the present invention, the width of the metal-1 layer 3602 as narrow as 1.6λ could be one of the smallest width of the metal-1 interconnection. The minimum space 3604 between two nearest metal-1 interconnections should be not smaller than λ. The important merit of the present invention is that almost every critical dimension such as the lengths of the GEBESI, the GEBEDI, the contact-Hole opening, and the width of the metal-1 interconnection could be precisely controlled without being affected by the uncertainties of PMT, thus assuring their reproducibility, quality and reliability due to the uniformity of these critical dimensions. FIG. 36B is the top view of the mMOSFET in FIG. 36A, but in FIG. 36B, separate multiple fingers in the mMOSFET are shown and extend in horizontal direction. Furthermore, as shown in FIG. 36B, all drain regions in those fingers are connected together through the metal-1 layer 3602, and all source regions in those fingers are connected together through the metal-1 layer 3602 as well.

To sum up, the present invention here discloses a new method to precisely control the dimensions of the source (or drain) region, which can be as small as the minimum feature size, Lamda(A), and have a contact hole on the gate structure, source (or drain) region with its linear dimension which is less than the minimum feature size A. By making the metal-1 interconnection (M1 layer) directly connecting gate, source and drain regions through self-aligned miniaturized contacts without using a conventional contact-hole-opening mask and/or a metal-0 translation layer for the M1 connections. The present invention could also be applied to any semiconductor device (such as transistor, thyristor, etc.) with multiple terminals, in which any portion of the multiple contacts or terminals are then directly connected through self-aligned miniaturized contacts without using a conventional contact-hole-opening mask and/or the metal-0 translation layer for the M1 connections.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A transistor structure comprising:
   a semiconductor substrate;
   a plurality of fin structures formed from the semiconductor substrate, wherein each fin structure comprises a channel region and a first conductive region coupled to the channel region; and
   a gate structure across each fin structure of the plurality of fin structures; wherein a first concave is formed to reveal the gate structure, a plurality of second concaves are formed above and correspond to drain regions of the plurality of fin structures, and the drain regions are electrically connected together through a conductive material formed in and above the plurality of second concaves of the plurality of fin structures; and
   wherein the drain regions of the plurality of fin structures are physically separated from each other.

2. The transistor structure in claim 1, wherein a vertical length of the first concave is substantially the same as a horizontal length of the second concave.

3. The transistor structure in claim 1, further comprising a metal connection layer formed to fill the first concave and to fill in the second concave.

4. The transistor structure in claim 3, wherein a third concave is formed to reveal the drain region of another fin structure, the metal connection layer fills in the third concave and at least extends from the second concave to the third concave.

5. The transistor structure in claim 4, wherein a horizontal length of the drain region is the same or substantially the same as a horizontal length of the metal connection layer.

6. The transistor structure in claim 5, the horizontal length of the drain region is the same or substantially the same as a minimum feature size.

7. A transistor structure comprising:
   a semiconductor substrate with a semiconductor surface;
   a gate structure above the semiconductor surface, and a first concave formed to reveal the gate structure;
   a channel region under the semiconductor surface;
   a first conductive region electrically coupled to the channel region, and a second concave formed to reveal the first conductive region; and
   a metal connection layer formed to fill the first concave and to fill in the second concave;
   wherein a vertical length of the first concave is the same or substantially the same as a horizontal length of the second concave.

8. The transistor structure in claim 7, wherein a horizontal length of the first concave is smaller than two times of a thickness of the metal connection layer.

9. The transistor structure in claim 7, wherein a horizontal length of the first conductive region is the same or substantially the same as a minimum feature size.

10. The transistor structure in claim 7, wherein the metal connection layer extends from the first concave to the second concave.

* * * * *